(12) United States Patent
Nishi et al.

(10) Patent No.: US 6,864,955 B2
(45) Date of Patent: Mar. 8, 2005

(54) STAGE APPARATUS, EXPOSURE APPARATUS AND METHOD FOR EXPOSING SUBSTRATE PLATE

(75) Inventors: Kenji Nishi, Kanagawa-ken (JP); Toru Kiuchi, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/361,495

(22) Filed: Feb. 11, 2003

(65) Prior Publication Data

US 2003/0164934 A1 Sep. 4, 2003

Related U.S. Application Data

(62) Division of application No. 09/047,222, filed on Mar. 25, 1998, now Pat. No. 6,590,633.

(30) Foreign Application Priority Data

Mar. 25, 1997 (JP) .............................................. 9-71466

(51) Int. Cl.[7] ........................ G03B 27/42; G03B 27/60; G03B 27/64
(52) U.S. Cl. .............................. 355/53; 355/73; 355/76
(58) Field of Search ............................ 355/53, 73, 76, 355/91, 94; 261/21; 269/21

(56) References Cited

U.S. PATENT DOCUMENTS

| 4,084,903 A | 4/1978 | Pircher .......................... 355/53 |
| 4,654,571 A | 3/1987 | Hinds |
| 4,737,824 A | 4/1988 | Sakai et al. .................... 355/53 |
| 4,754,309 A | 6/1988 | Lesko ........................... 355/91 |
| 5,073,716 A | 12/1991 | Clemens et al. |
| 5,161,177 A | 11/1992 | Chiba ........................... 378/34 |
| 5,191,218 A | 3/1993 | Mori et al. ............. 250/453.11 |
| 5,203,547 A | 4/1993 | Marumo ....................... 269/21 |
| 5,436,693 A | 7/1995 | Marumo ....................... 355/73 |
| 5,443,346 A | 8/1995 | Murata et al. |
| 5,534,073 A | 7/1996 | Kinoshita et al. ........... 118/728 |
| 5,586,159 A | 12/1996 | Kitaoka et al. .............. 378/34 |
| 5,707,051 A | 1/1998 | Tsuji ........................... 269/21 |
| 5,883,932 A | 3/1999 | Chiba et al. .................. 378/34 |
| 5,969,441 A | 10/1999 | Loopstra et al. |
| 6,024,631 A | 2/2000 | Piper ........................... 451/41 |
| 6,262,796 B1 | 7/2001 | Loopstra et al. |

FOREIGN PATENT DOCUMENTS

JP          8-83832          3/1996

*Primary Examiner*—Alan Mathews
(74) *Attorney, Agent, or Firm*—Westerman, Hattori, Daniels & Adrian, LLP

(57) ABSTRACT

The stage apparatus has a movable stage structure body which holds a substrate plate to be processed and is movable on a base structure body. This stage apparatus comprises a receipt edge orifice disposed at least at a portion of a fluid path which is disposed at said stage structure body; and a feed edge orifice being detachably engageable with said receipt edge orifice at a predetermined position on a base structure body and providing or discharging a predetermined fluid to the receipt edge orifice during said engagement of said feed edge orifice with said receipt edge orifice.

9 Claims, 23 Drawing Sheets

Fig. 17
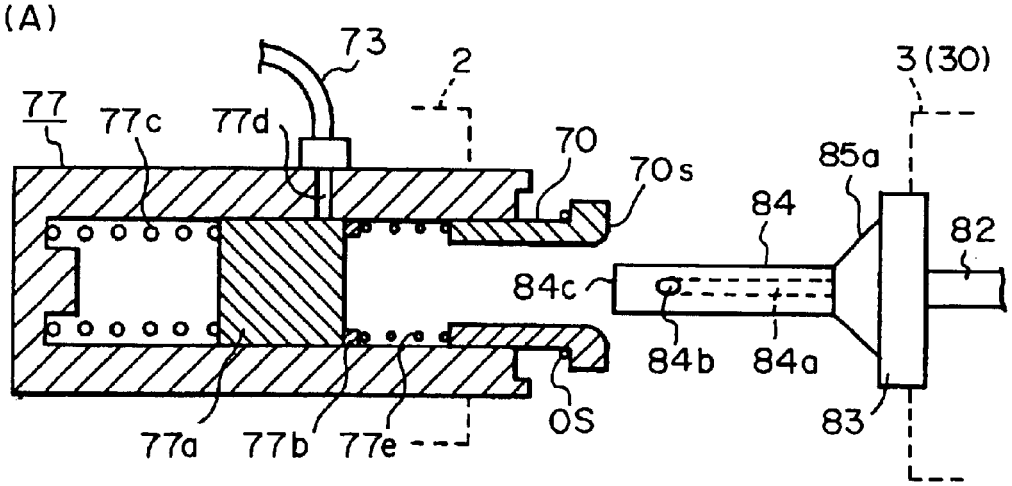
(A)
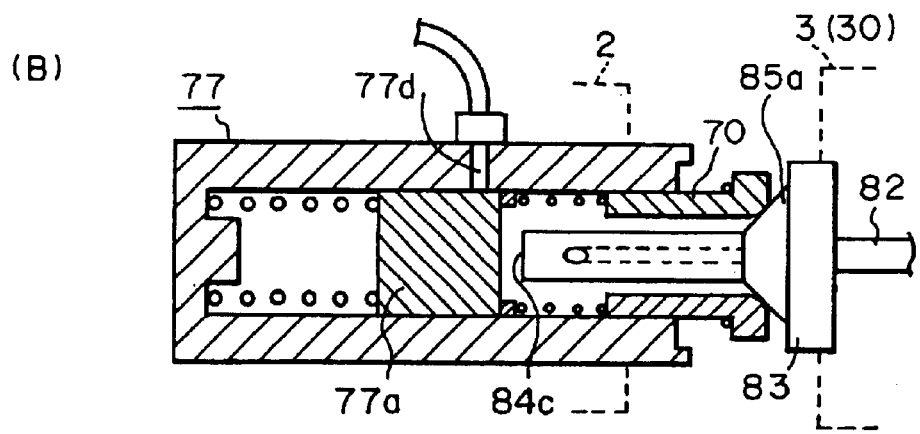
(B)
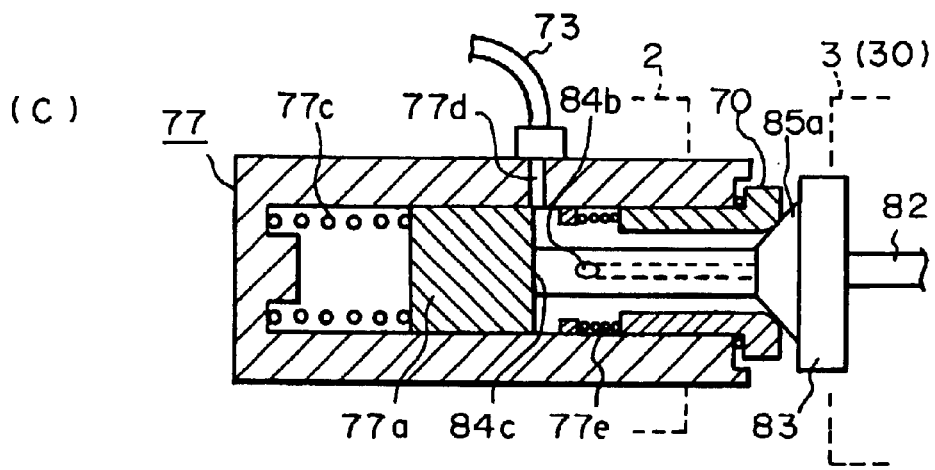
(C)

STAGE APPARATUS, EXPOSURE APPARATUS AND METHOD FOR EXPOSING SUBSTRATE PLATE

This application is a Divisional application of prior application Ser. No. 09/047,222 filed Mar. 25, 1998.

BACKGROUND OF THE INVENTION

The present invention relates to a high-precision transfer stage apparatus for use with lithography apparatuses, instrument apparatuses or other apparatuses and a method for exposing a substrate plate to transcribe circuit patterns and, more particularly, to an exposure apparatus to be used in a lithography process for producing particularly semiconductor devices and liquid crystal display devices and to a stage apparatus for use with such an exposure apparatus, as well as to a method for exposing a photosensitive substrate plate to transcribe device patterns using such an exposure apparatus.

Hitherto, a variety of exposure apparatuses have been employed in situ in a lithography process for producing semiconductor devices. Among such exposure apparatuses which currently have been employed in situ on a large-scale line, a compression projection exposure apparatus (usually called a stepper) of a step-and-repeat system is employed predominantly. In addition, there are known a projection exposure apparatus (a scanning exposure device) in a step-and-scan system so arranged as to scan a mask with a circuit pattern drawn as an original picture thereon and a photosensitive substrate plate (a semiconductor wafer) for producing devices relative to an optical projection system, a X-rays stepper so arranged as to set a mask and a photosensitive substrate plate at a given gap interval and to expose the mask and the photosensitive substrate plate to X-rays such as SOR rays in a step-and-repeat system, a electron beams exposure apparatus for drawing a circuit pattern with charged particle beams or transcribing a mask by radiation of electron beams, etc.

Many of such exposure apparatuses are provided each with a transfer stage apparatus which is so arranged as to hold a photosensitive or sensitive substrate plate (e.g., a semiconductor wafer with a photoresist layer coated thereon) and to move in a two-dimensional direction with respect to a pattern projection system (e.g., a projection system of a pattern image or the mask itself, etc.). There are known transfer stage apparatuses of various types, too. Among them, there is known a stage apparatus of a type in which a movable main stage member is held on a guide plane of a base table with a needle bearing or an air bearing and it is transferred by a drive source of a contact type using a feed screw and a nut, etc., or of a non-contact type using a combination of plural linear motors, etc.

In either case, the such stage apparatuses are connected each to plural flexible tubes for supplying vacuum, pressure or pressure-applying fluid to a holder of a vacuum adsorption system for holding and adsorbing a substrate plate or an aerodynamic operation source (e.g., piston, vacuum pad part, etc.). Therefore, the movable main stage member is transferred while dragging those flexible tubes from the base table. Likewise, the movable main stage member is provided with various electrical drive sources (e.g., rotary motor, voice coil motor, piezo element, electromagnet, etc.). To those electrical drive sources are connected plural electrical wiring for supplying electrical energy from the base table side or an apparatus column side. Thus, the movable main stage member is transferred while dragging such wiring.

Further, in conventional stage apparatuses as mentioned above, those plural flexible tubes and plural electrical wiring were impossible to be separated from the movable main stage member but were always connected thereto. Therefore, even when a substrate plate already processed is exchanged for another substrate plate, those tubes and electrical wiring could not be easily separated from the movable main stage on the base table. Of course, although those tubes and electrical wiring could be separated from it during the maintenance or the like, the movable stage body cannot maintain the function of vacuum-absorbing a substrate plate or the like during the maintenance. In addition, it was troublesome to connect again those tubes and electrical wiring to the movable stage body.

SUMMARY OF THE INVENTION

The object of the present invention is that various kinds of electrical wiring and tubes which are connected to a movable stage structure body are able to be attached or detached to the movable stage structure body on a base structure body.

The present invention is adapted to a stage apparatus having a base structure body (e. g. a base table), and a movable stage structure body which holds a substrate plate (e.g. a wafer, etc.) to be processed and is movable on the base structure body.

The stage apparatus of the present invention comprises a receipt edge orifice disposed at least at a portion of a fluid path which is disposed at said movable stage structure body; and a feed edge orifice being detachably engageable with said receipt edge orifice and providing or discharging a predetermined fluid to the receipt edge orifice during said engagement of said feed edge orifice with said receipt edge orifice.

Further, according to the present invention, a predetermined position where said feed edge orifice is detachably engageable with said receipt edge orifice may be a position where an exchange of the substrate plate (e.g. a wafer, etc.) already processed for another substrate to be processed is conducted.

Further, according to the present invention, the movable stage structure body may include a volume expansion chamber communicating with said fluid path and having a predetermined volume therein in a sealed manner.

Further, the movable stage structure body may include a valve mechanism for blocking communication between said fluid path and atmosphere during non-engagement of said receipt edge orifice with said feed edge orifice.

Further, a stage apparatus of the invention may further comprise a control unit for controlling said valve mechanism; and wherein said valve mechanism comprises an electromagnetic valve which is switched between an open and a close state based on a command from said control unit.

In addition, an exposure apparatus of the present invention comprises a stage apparatus, and this stage apparatus has a movable stage structure body movably supported on a base structure body (a base table) and holding a photosensitive substrate plate (e.g. a wafer, etc.) onto which patterns formed on a mask are transcribed. This stage apparatus includes a receipt edge orifice disposed at least at a portion of a fluid path which is provided in said movable stage structure body; and a feed edge orifice detachably engageable with said receipt edge orifice at a predetermined position on the base structure body at each time of exposing the photosensitive substrate plate and providing or discharging a predetermined fluid to the receipt edge orifice during said engagement of said feed edge orifice with said receipt edge orifice.

This exposure apparatus may be a scanning type exposure apparatus for exposing the photosensitive substrate plate in a scanning manner to transcribe patterns (e. g. circuit patterns) onto the photosensitive substrate plate while the mask and the photosensitive substrate plate move relative to each other.

In addition, a method for exposing a substrate plate according to the present invention is adapted to a method for exposing a substrate plate to transcribe patterns formed on a mask onto the substrate plate by using an exposure light passing through said mask, and the method comprises a step of detachably engaging a receipt edge orifice with a feed edge orifice prior to an exposure operation on a base structure body (e. g. a base table), said receipt edge orifice being disposed at least at a portion of a fluid path which is provided in a movable stage structure body which is movable on said base structure body, and feed edge orifice being engageable with said receipt edge orifice so as to provide or discharge a predetermined fluid to the receipt edge orifice.

Further, the method for exposing a substrate plate further comprises a step of causing a valve mechanism into a blocking manner, said valve mechanism blocking communication between said fluid path disposed at said movable stage structure body and atmosphere during non-engagement of said receipt edge orifice with said feed edge orifice.

BRIEF DESCRIPTION OF THE DRAWINGS

The above and other objects, features and advantages of the present invention will be apparent from the following detailed description of the preferred embodiments thereof, reference being made to the accompanying drawings, in which:

FIG. 17 is a sectional view showing the structure of each of a receipt edge orifice and a feed edge orifice by a valve mechanism in accordance with a sixth embodiment of the present invention;

DESCRIPTION OF THE PREFERRED EMBODIMENTS

The present invention will be described in more detail by way of specific examples with reference to the accompanying drawings.

Figure 1:
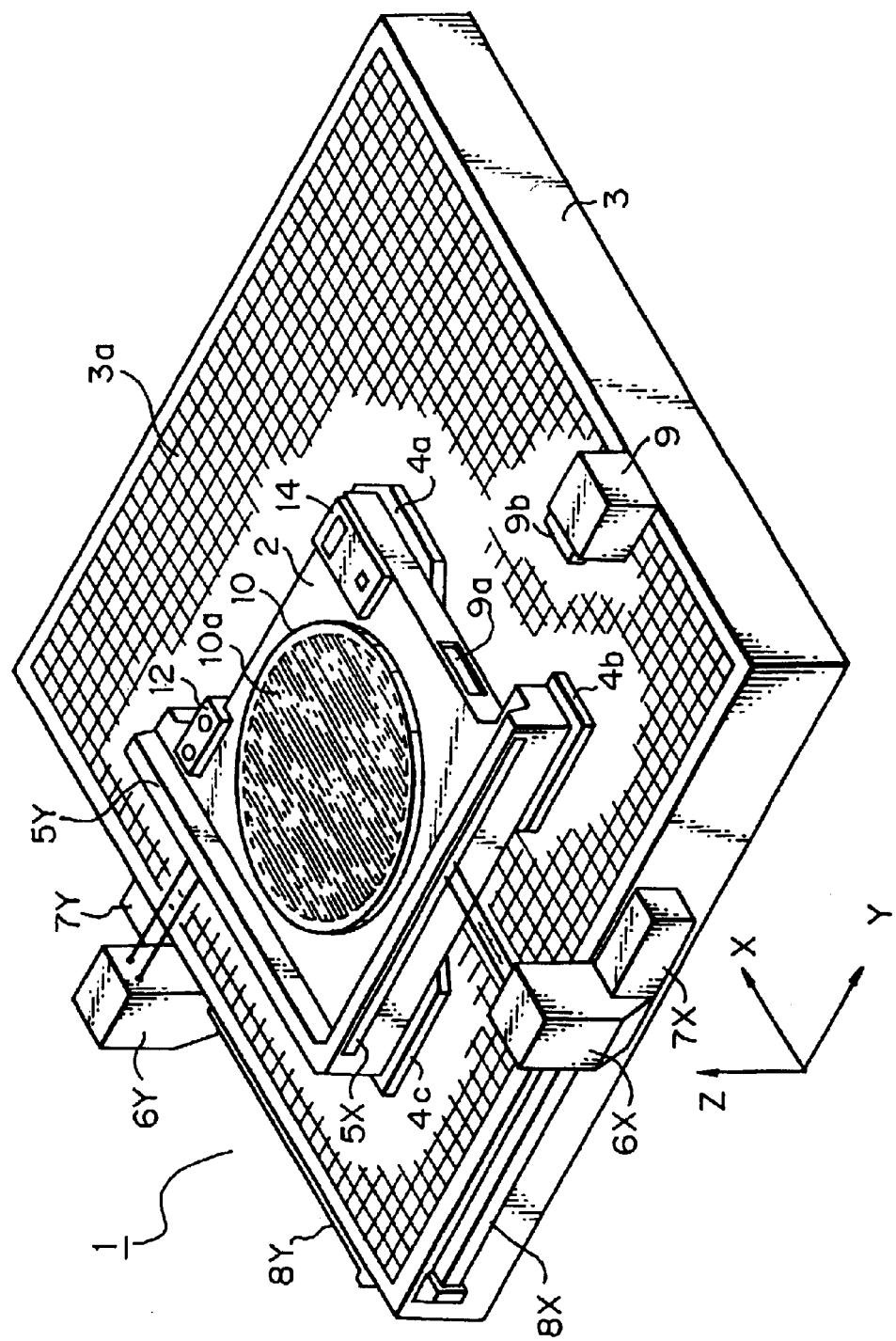
FIG. 1 is a perspective view showing an overall structure of a movable stage apparatus in accordance with a first embodiment of the present invention.

FIG. 1 is a perspective view showing an overall structure of a stage apparatus 1 in accordance with a first embodiment of the present invention, in which a holder 10 with a semiconductor wafer as a processing substrate plate loaded thereon is provided at its loading surface with an electrode 10a for electrostatic adsorption of the semiconductor wafer thereon. The holder 10 is supported by a Z-directional minute motion mechanism and a leveling mechanism (both being referred to herein collectively as a Z/L fine motion mechanism), although not shown in the drawing. A movable main stage member 2 is supported so as to be movable two-dimensionally in the Y- and Y-directions along a defined flat plane 3a formed on a base table 3.

As specifically shown in FIG. 1, the stage apparatus 1 is of a guideless type having a full flat surface 3a supporting the own weight of the main stage member 2 as a Z-directional guide plane yet having no guide plane for movement in X- and Y-directions. At this end, the main stage member 2 is provided on its bottom portion with a plurality of electromagnet units (not shown) for generating the magnetic floating force with respect to the flat surface 3a of the base table 3 as well as a plurality of electromagnetic drive units 4a, 4b, 4c and 4d (4d being not shown in this drawing for brevity of illustration), consisting of a plurality of coils, for generating the drive force for transferring the main stage member 2 in directions X, Y and θ are disposed on the bottom side of the main stage member 2.

The electromagnetic drive units 4a, 4b, 4c and 4d are comprised as a flat motor of a two-dimensional movement type so as to generate the drive force in each direction in association with a number of permanent magnets arranged in a matrix form over substantially the entire surface of the flat surface 3a of the base table 3. A stage apparatus having a structure similar to that of the stage apparatus according to the present invention is disclosed, for example, in U.S. Pat. No. 4,654,571. The prior art stage apparatus may be applied, as needed, to the stage apparatus of FIG. 1 according to a one embodiment of the present invention as it is or with some modifications. The stage apparatus disclosed in U.S. Pat. No. 4,654,571 is so arranged as to cause the movable main stage member to float against the base table in an air bearing system. The stage apparatus 1 of FIG. 1 according to the one embodiment of the present invention may also be arranged so as to float the movable main stage member 2 in an air bearing system in a like manner as the prior art stage apparatus by mounting an air pad part on the bottom surface of the movable main stage member 2.

The main stage member 2 and the holder 10 may be made each of ceramics materials (non-magnetic material having a high insulation) and particularly the inside of the main stage member 2 may be made of a honeycomb structure or a rim structure in order to make the weight of the main stage member 2 lightweight. A side edge portion of the main stage member 2 extending in the X-direction is formed integrally with a movable mirror 5Y and a side edge portion thereof extending in the Y-direction is formed integrally with a movable mirror 5X. Further, each of the movable mirrors 5X and 5Y has its surface deposited with a reflecting plane extending in the directions X and Y, respectively. To the movable mirror 5Y is projected measuring beams for length measurement along the Y-direction from a laser interferometer 6Y fixed to the base table 3 and an interference beams representative of a variation in the positions of the coordinates relating to the Y-direction of the reflecting plane of the movable mirror 5Y are photoelectrically detected by a receiver 7Y.

Likewise, measuring beams for length measurement from a laser interferometer 6X are projected to the movable mirror 5X along the X-direction and interference beams from the reflecting plane of the movable mirror 5X are photoelectrically detected by a receiver 7X. At the side edge portion of the base table 3 are provided beam paths 8X and 8Y for supplying laser beams for sending light to the laser interferometers 5X and 5Y, respectively.

The laser interferometers 6X and 6Y are so configured as to measure the positions of X-directional and Y-directional movements of the main stage member 2 as well as to measure the amount of rotation (yawing in the direction θ) around the Z-axis of the main stage member 2. The drive force of each of the electromagnetic drive units 4a–4d is subjected to servo control on the basis of the measured values in the directions X, Y and θ measured by the laser interferometers 6X and 6Y, respectively.

A portion of the side edge portion of the main stage member 2 is provided with a power receipt terminal part 9a for charging a built-in battery and a power feed terminal part 9b for charging a battery is mounted at the position corresponding to the height of the base table 3 through a base seat 9. In the base seat 9 is mounted an electric power circuit for rapidly charging. On each of the power receipt terminal parts 9a and the power feed terminal part 9b is mounted an optical coupler or an electrical coupler for implementing various information communications between a microcomputer built in the main stage member 2 and an outside computer for implementing an apparatus-managing control.

When the stage apparatus of FIG. 1 is applied to a projection exposure apparatus of a step-and-repeat system or a step-and-scan system, a reference mark plate 14 with a variety of reference marks formed thereon is fixed in the vicinity of an upper surface portion of the main stage member 2 because it is necessary to correct the relationship of the X- and Y-directional positions of the main stage member 2 relative to the position of a pattern projection system, such as an optical projection system for ultraviolet rays (e.g. bright line of a mercury lamp or excimer laser beams) or an electron lens projection system for use in exposure to charged particle rays, etc.

Further, an optical coupler part 12 including a sending light part and a receiving light part on an apparatus column side disposed outside the pattern projection system and a small lens body for implementing optical communications is disposed at another peripheral portion of the main stage member 2. A specific structure of the optical coupler 12 and a manner of use thereof are described in detail in Japanese Patent Application No. 8-229,839 filed by the identical applicant (U.S. patent application Ser. No. 807159 filed on Feb. 27, 1997) so that a duplicate description will be omitted for brevity of explanation.

Figure 2:
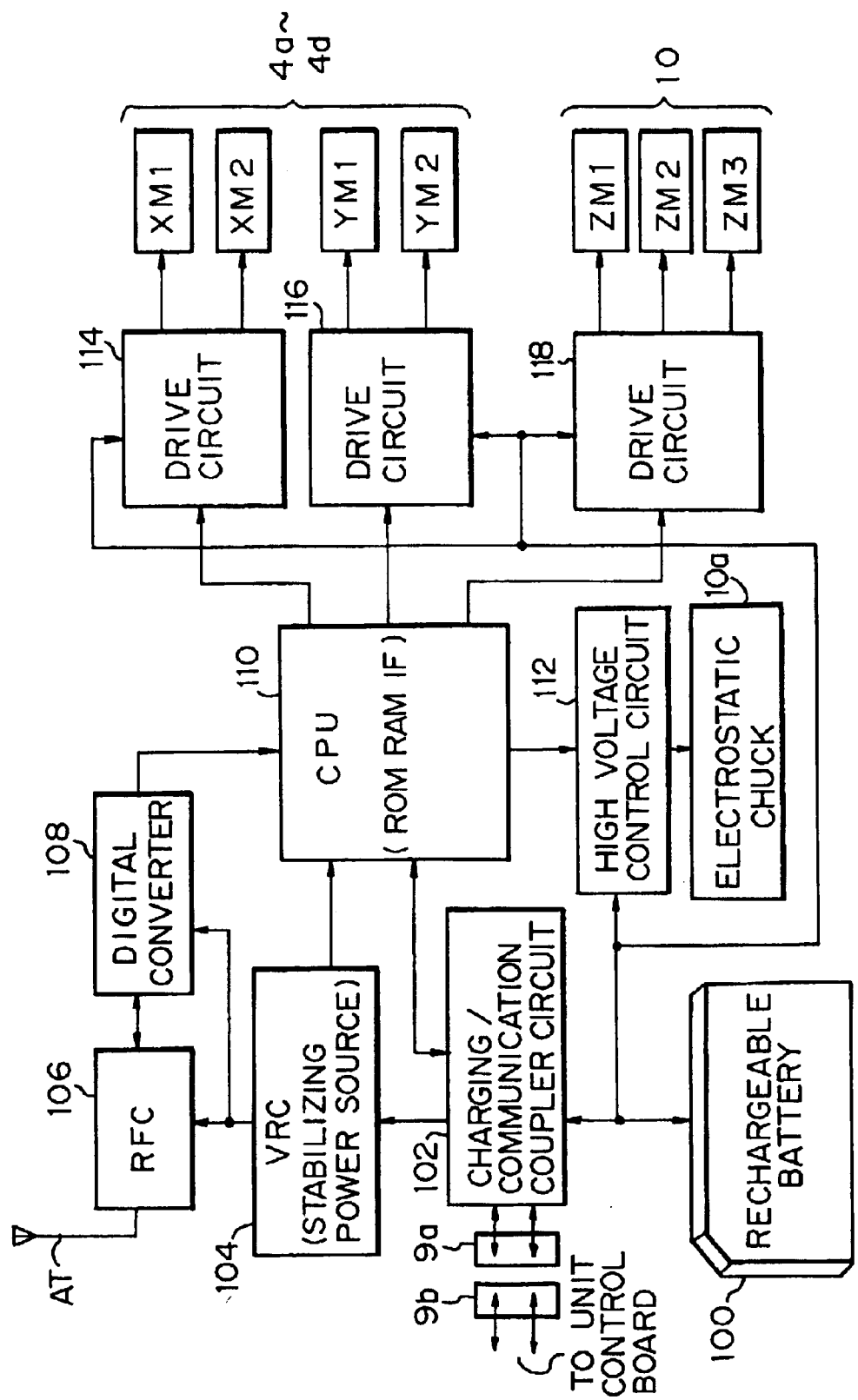
FIG. 2 is a circuit block diagram showing the structure of an electrical system loaded on a main stage member of the movable stage apparatus of FIG. 1.

Moreover, an entire structure of an electrical circuit system built in the movable main stage member 2 of the stage apparatus as shown in FIG. 1 will be described with reference to FIG. 2. As shown in FIG. 2, a rechargeable battery 100 as an energy accumulation member has a plurality of nickel-type batteries with e.g. 7.5 V and 3,600 mAh arranged in an in-line or parallel manner, thereby securing the necessary power capacity. A power line from the battery 100 is connected to a charging/communication coupler circuit 102 to be connected to a power receipt terminal part 9a, a high voltage control circuit 112 to be connected to an electrode 10a for electrostatic absorption of the holder 10, drive circuits 114 and 116 to supply driving electric current to a plurality of electromagnetic coil group XM1, XM2, YM1 and YM2 mounted on the electromagnetic drive units 4a–4d, respectively, and a drive circuit 118 to supply driving signals to each of three motors ZM1, ZM2 and ZM3 by a voice coil type built in the Z/L minute motion mechanism of the holder 10 or by an electromagnetic actuator of an E core type or piezo expansion elements, etc.

It is to be noted herein that, although electromagnet units for magnetically float the movable main stage member 2 with relative to the base table 3 and a feed circuit to those units are omitted from FIG. 2, as a matter of course, the electromagnet units for magnetic floating are driven in response to the electrical energy of the battery 100 as needed. In this case, as the stage apparatus 1 of FIG. 2 is provided with the Z/L minute motion mechanisms (ZM1–ZM3), an accuracy in magnetically floating the movable main stage member 2 may not be required to be very high. In other words, the electromagnet units for magnetic floating can achieve its sufficient performance by an open loop control for supplying a constant electric current from the battery 100 through a simple constant current drive circuit. Further, the electromagnet units for magnetic floating are not required at all if the main stage member 2 is floated through a static pressure air bearing.

Moreover, as shown in FIG. 2, a stabilizing power circuit (VRC) 104 is so disposed as to convert a battery voltage from the charging/communication coupler circuit 102 into stabilized power voltage (5V, ±15 V, etc.) in a DC/DC converter system or the like and supply it to a circuits group having a relatively small consumption of electric power. The stabilized power voltage is sent to an RF circuit 106 for receiving or sending electrical wave via an antenna AT in a wireless system, a converter circuit 108 for converting various information to be received or sent via wireless wave between analog signals and digital signals, and a microcomputer (CPU) 110 for controlling an entire electrical circuit system installed in the main stage member 2. It is to be noted herein that the antenna AT and the RF circuit (or including the converter circuit 108) constitute a transmitter in a wireless system.

The CPU 110 is connected to a control logic part or a communications interface part in the charging/communication coupler circuit 102 to implement the management and control of the charging state and the management and control of communication ports. The interface part installed in the charging/communication coupler circuit 102 may be comprised of an optical communication circuit (e.g. LED, photodiode, modulation-demodulation circuit, etc.), as needed. In this case, however, the power feed terminal part 9b on the stage apparatus 1 side of is also provided with a light emitting element or a light receiving element for the optical communication interface.

The CPU 110 also sends or receives a variety of digital information (e.g. commands, parameters, data, etc.) for communicating with an external host computer in a wireless system to or from the converter circuit 108. Moreover, the CPU 110 can send to the high voltage control circuit 112 information for controlling the adsorption or release of the adsorption of a wafer in response to the commands or parameters sent from the external computer to thereby output the controlling information to each of the drive circuits 114, 116 and 118 at a real time.

As shown in FIG. 2, when the electromagnetic drive units 4a–4d for controlling the movement of the main stage member 2 in the directions X, Y and θ and the motors ZM1 to ZM3 of the Z/L minute motion mechanism are driven by the power of the built-in battery 100, a cycle time of output of instruction values to the drive circuits 114, 116 and 118 require a high speed of the order of mS or higher so that the CPU 110 has preferably a clock frequency of several tens MHz or higher in a microprocessor type.

Also, when the electromagnetic drive units 4a–4d (or electromagnet units for magnetic floating) are connected to the main stage member 2 and the base table 3 via electrical wires in a conventional manner, the electromagnetic coil groups XM1, XM2, YM1 and YM2 as well as the drive circuits 114 and 116 as shown in FIG. 2 are not required. Therefore, the real time control by the CPU 110 is carried out exclusively by the drive circuit 118 of the Z/L minute motion mechanism, thereby reducing the processing load of the processor consisting of the CPU 110. Moreover, in this case, as the drive circuits 114 and 116 having the greatest consumption of the power in FIG. 2 are not required, this structure can offer the advantage that a charging cycle of the battery 100 can be extended.

Moreover, when power is fed to the electromagnetic drive units 4a–4d (or electromagnet units for magnetic floating) and the motors ZM1–ZM3 for the Z/M minute motion mechanism in a wired system, the high voltage control circuit 112 for the adsorption of a wafer to the holder 10 or for another electrostatic adsorption pad disposed in the main stage member 2 and other small electrical power circuits systems alone are operated by the built-in battery 100. Therefore, the consumption of electrical power by the battery 100 can further be reduced, thereby making the battery more compact in size and lightweight and as a consequence enabling a reduction in the total weight of the main stage member 2.

In this case, moreover, as a variety of electrodes (10a, etc.) for electrostatic adsorption little consumes electric current in a general case, the consumption of electrical power by the high voltage control circuit 112 can be reduced to a considerable extent. Further, in this case, sources (4a–4d and ZM1–ZM3) for electrical operation requiring an accurate drive control are unnecessary so that it may be possible to omit the disposition of the CPU 110, the digital converter 108 and the like.

And, in some instances, it is possible to mount only the charging/communication coupler circuit 102 and the high voltage control circuit 112, as shown in FIG. 2, on the main stage member 2, together with the battery 100 having a small electric capacity. In this case, an instruction for the adsorption or the release of the adsorption of a wafer to or from the holder 10 can be given from the power receipt terminal part 9a and the power feed terminal part 9b through a communication interface part of the charging/communication coupler circuit 102.

Generally, the adsorption and the release of the adsorption of the wafer are implemented when the main stage member 2 stops in the loading position and the unloading position, respectively, upon exchanging for wafers. Further, the electrostatic adsorption pad disposed in the main stage member 2 is adsorbed or released generally upon exchanging for wafers. Thus, it is generally acceptable that the power receipt terminal part 9a and the power feed terminal part 9b are connected to each other in the respective positions.

Then, a description will be made of an example of an exposure apparatus with the stage apparatus of FIGS. 1 and 2 mounted thereto with reference to FIG. 3. In this example, there is illustrated a projection exposure apparatus of a step-and-scan system to be used in connection with the process for the manufacture of semiconductor memory devices (D-RAM) of 64 Mbit classes or greater, which may be affected by dragging of tubes or wires or for other reasons.

Figure 3:
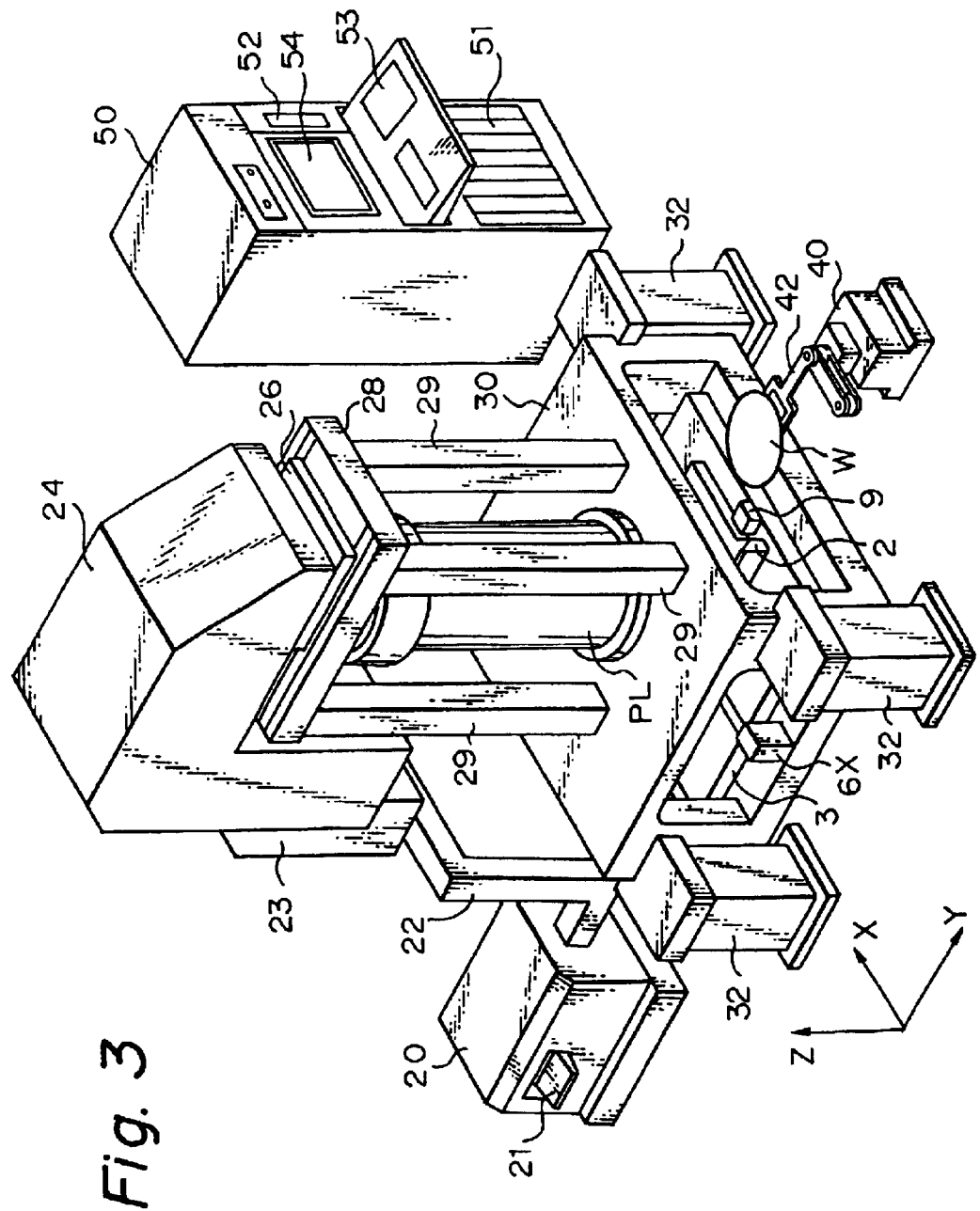
FIG. 3 is a perspective view showing an overall structure of a projection exposure apparatus with the movable stage apparatus of FIG. 1 loaded thereon.

As shown in FIG. 3, the exposure apparatus utilizes pulse laser beams from an excimer laser light source 20 as a light for illumination. The excimer laser light source 20 may be of a type emitting KrF excimer laser beams having a wavelength of 248 nm, ArF excimer laser beams having a wavelength of 193 nm and $F_2$ laser beams having a wavelength of 157 nm as a pulse light, and its wavelength width is narrow-banded so as to allow a color aberration resulting from the material of a variety of optical elements constituting an optical projection system PL of the exposure apparatus to come within a clearance range. The absolute value of the central wavelength to be narrow-banded and the value of a narrow-banding width (between 1 pm and 300 pm) are displayed on an operation panel 21 and they can be adjusted as needed from the operation panel 21. Further, the operation panel 21 is so disposed as to set a mode for generating a pulse light (represented by three modes of self-oscillation, external trigger oscillation and oscillation for maintenance).

The excimer laser light from the excimer laser light source 20 is led to a beams light receiving system 23 of the exposure apparatus through a light-blocking tube 22. In the beams light receiving system 23, a plurality of movable reflecting mirrors are so arranged as to adjust the incidence position or the incidence angle of the excimer laser light to an optical illumination system 24 to the optimized position or angle so that the excimer laser light is always incident to the optical axis of the optical illumination system 24 of the exposure apparatus in a predetermined position relationship.

Some examples of the exposure apparatuses using excimer laser light as a light source in the manner as described hereinabove are disclosed, for example, in Japanese Patent Unexamined Publication Nos. 57-198,631 (U.S. Pat. No. 4,458,994), 1-235,289 (U.S. Pat. No. 5,307,207), 2-135,723 (U.S. Pat. No. 5,191,374), and 2-294013 (U.S. Pat. No. 5,383,217). Some examples of the exposure apparatuses utilizing the excimer laser light for step-and-scan exposure are disclosed in Japanese Patent Unexamined Publication Nos. 2-229,423 (U.S. Pat. No. 4,924,257), 6-132,195 (U.S. Pat. No. 5,477,304) and 7-142,354 (U.S. Pat. No. 5,534,970). Thus, the prior art technology as disclosed in each of the above-mentioned Japanese patent publications may be applied to the exposure apparatus as shown in FIG. 3 of the present application as it is or with partial modifications.

In the optical illumination system 24, there are disposed, for example, a flyeye lens system for converting excimer laser light into an illumination light having a uniform distribution of intensity, a reticle blind (field diaphragm) for restricting reticle illumination light to a rectangular-shaped slit form upon scan exposure and an image-formation system (including a condenser lens) for allowing an opening of such a rectangular-shaped slit form of the reticle blind to form an image in a circuit pattern area on the reticle. The illumination light of the rectangular-shaped slit form to be radiated upon the reticle is so arranged as to extend in a longitudinally elongated form in the X-direction (a non-scanning direction) at the center of a circular projection field of the optical projection system PL in FIG. 3, while the Y-directional (scanning directional) width of the illumination light is set so as to be nearly constant.

In order to narrow the width of a light blocking band in the vicinity of the circuit pattern area on the reticle or to make a scanning-transferring stroke of the reticle extremely short, it is desired to provide a mechanism for varying the width of the scanning direction of the reticle blind upon scan exposure, as disclosed for example in Japanese Patent Unexamined Publication No. 4-196,513 (U.S. Pat. No. 5,473,710).

The reticle is adsorbed and held on a reticle stage member 26 as shown in FIG. 3 and the reticle stage member 26 is so disposed as to linearly move on a reticle base table 28 with a great stroke in the Y-direction by a linear motor or other means for scan exposure, while to enable a minute movement in the directions X and θ by a voice coil motor (VCM), piezo element or the like. The reticle base table 28 is fixed to four columns 29 disposed upright from a main body column table 30 for fixing a flange of the optical projection system PL.

In the embodiment of the present invention, the main body column table 30 is formed in a box shape with its inside hollow and the base table 3 of the stage apparatus as shown in FIG. 1 is fixed within the hollow inside thereof. Out of the structuring elements as shown in FIG. 1, only the movable main stage member 2, the X-directional interferometer 6X and a seat 9 of the power feed terminal part 9b are schematically illustrated in FIG. 3. As shown in FIG. 3, the movable main stage member 2 is stayed unmoving in the loading position (a standby position) in which to receive a wafer W supported at a tip end of an arm 42 of a wafer carrier robot 40 or in the unloading position (a standby position) in which to deliver the wafer held on a holder of the movable main stage member 2 to the arm 42. Therefore, the power receipt terminal part 9a and the power feed terminal part 9b are engaged with each other in the state as shown in FIG. 3.

At each of four corners of the main body column table 30, there is disposed a mount base 32 having a vibration-preventive function for supporting the entire apparatus from the floor. The mount bases 32 are supporting the entire weight of the apparatus via air cylinders and are provided each with an actuator for actively correcting the inclination of the apparatus as a whole and the Z-directional displacement thereof as well as the X- and Y-directional displacement of the apparatus as a whole.

The overall action of the main body of the exposure apparatus as shown in FIG. 3 is managed by a plurality of unit control boards, as referred to collectively as 51, for individually controlling each of the structuring parts in the main body of the apparatus, e.g. the excimer laser light source 20, the optical illumination system 24, the reticle stage member 26, the movable main stage member 2 for a wafer, the carrier robot 40, etc., a minicomputer 52 for controlling each of the control boards 51 comprehensively, and a control rack 50 including the operation panel 53, a display 54, etc. In each of the control boards 51 is disposed a computer on the unit side, such as a microprocessor. The computers on the unit side executes a series of exposure processes for a plurality of wafers in association with the minicomputer 52.

An entire sequence of the such series of the exposure processes is managed by a process program stored in advance in the minicomputer 52. The process program is to store information relating to wafers to be exposed (such as the number of sheets to be processed, shot size, shot sequence data, alignment mark location data, alignment conditions, etc.), information relating to reticles to be used (such as kind data of patterns, mark location data of each mark, a size of a circuit pattern area, etc.), and information relating to exposure conditions (such as an amount of exposure, a focus offset amount, an offset amount of a scanning speed, an offset amount of projection magnification, a distortion correction amount, the setting of a value σ of the illumination system, the setting of a value NA of a projection lens system, etc.) as a package of parameter groups.

The minicomputer 52 decodes the process programs instructed to be executed and gives the computer on the corresponding unit side an instruction about the action of each of the structuring elements necessary for the exposure processes of the wafers one after another as a command. At this time, whenever the computer on each of the unit sides finishes one command in a normal manner, the status to that effect is sent to the minicomputer 52 and the minicomputer 52 sends a next command to the computer on the unit side in response to the status sent thereto.

Among the series of the such actions, when a command for exchanges for wafers is sent to the minicomputer 52, the movable main stage member 2 and the carrier arm 42 (the wafer W) are set in the position relationship (standby position) as shown in FIG. 3 in association of the control unit of the movable main stage member 2 with the control unit of the wafer carrier robot 40. At this time, the program is started in response to a command or a parameter for controlling the charging of a battery or for making communications stored in advance in a microcomputer or the minicomputer 52 in the control unit of the movable main stage member 2.

Figure 4:
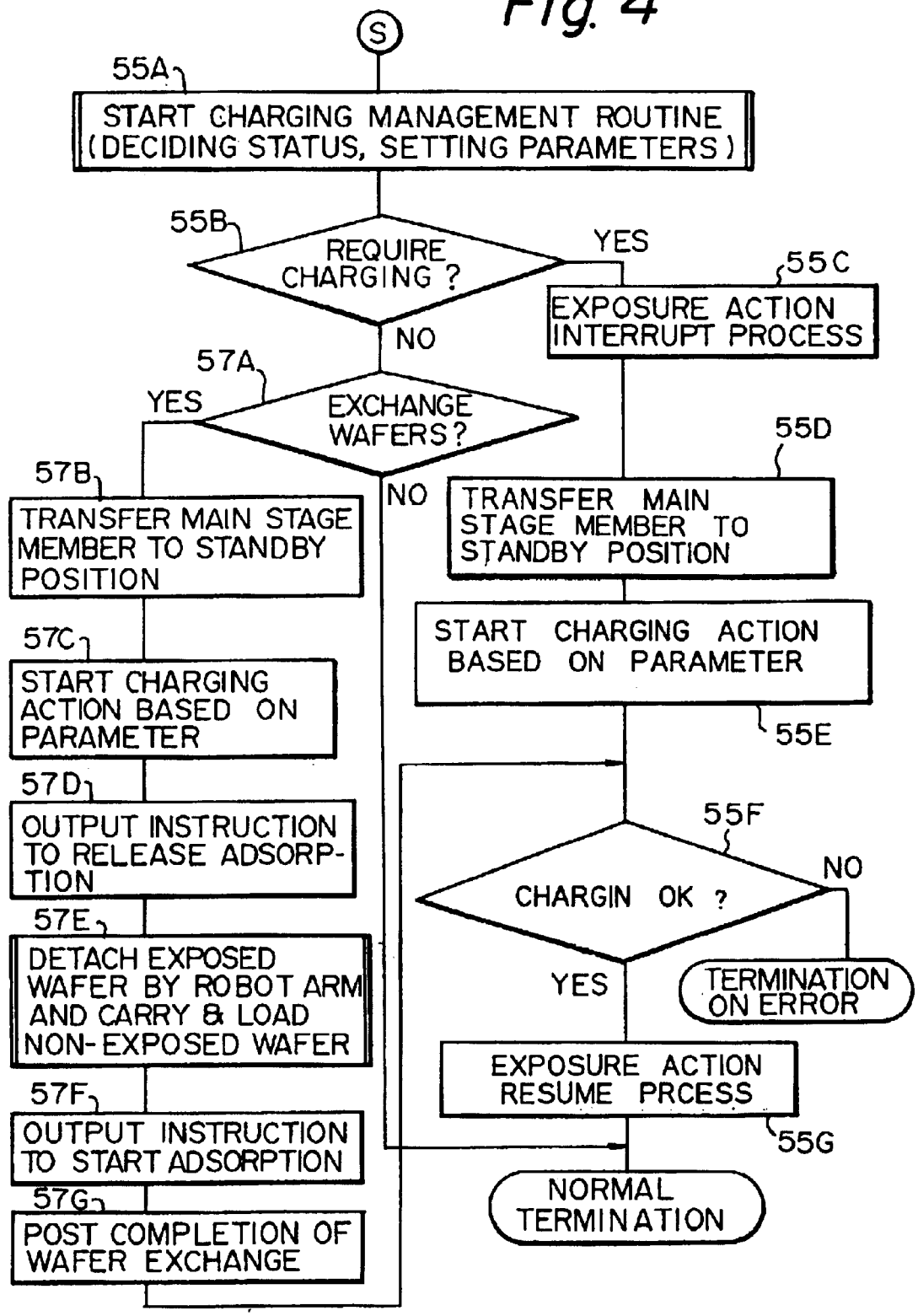
FIG. 4 is a flowchart for describing actions for exchanging wafers and for charging a battery by the apparatus as shown in FIGS. 1 to 3.

FIG. 4 shows an example of a flowchart of the program. In this embodiment, the CPU 110 as shown in FIG. 2 is so disposed as to manage the charging status (data, such as discharging current or discharging time from the full charge time, etc.) of the battery 100 in association with the charging/communication coupler circuit 102. As the movable main stage member 2 stops in the standby position (in the position for exchanging wafers) and the power receipt terminal part 9a is connected to the power feed terminal part 9b, a data coupler part in each of the power receipt terminal part 9a and the power feed terminal part 9b is connected to each other so that the unit computer or the minicomputer 52 for executing the program of FIG. 4 can be made communicatable on software with the CPU 110 on the movable main stage member 2 side.

As a matter of course, the program of FIG. 4 is executable on software in association of the unit computer or the minicomputer 52 with the CPU 110 on the movable main stage member 2 side via transmitter (RFC 106, digital converter 108) in a wireless system as shown in FIG. 2. Which communications system is selected, wireless or wire, may be set optionally in accordance with the structure of the exposure apparatus.

For the purposes of explanation only, the program of FIG. 4 is executed in association of the minicomputer 52 with the CPU 110 on the movable main stage member 2 side. As the program starts, the minicomputer 52 executes a charging management routine of step 55A. The minicomputer 52 in this routine reads information relating to the charging status of a battery from the CPU 110 of the main stage member 2 via the RFC 106 in a wireless system is decide to determine if the emergency charging of the battery 100 is needed or not needed on the basis of the information as well as to determine the parameter (e.g. waveform, voltage, frequency, duty, charging time, etc.) for generating the charging voltage to be supplied to the power feed terminal part 9b.

When it is decided that the emergency charging is needed at step 55B, the minicomputer 52 declares the interrupt of the exposure action for the exposure apparatus as a whole at step 55C, thereby temporarily interrupting the action in association with each unit by a plurality of unit computers in the control unit 51 in response to the declaration of the interrupt. It is to be noted herein, however, that the minicomputer 52 sends to a wafer stage control unit a command for transferring the main stage member 2 to the standby position as shown in FIG. 3 at step 55D.

In response to the command, the computer on the unit side sends to the CPU 110 on the movable main stage member 2 side in a wireless system a variety of subcommands and parameter groups necessary for executing the command. This process allows the main stage member 2 to be transferred to the standby position as shown in FIG. 3 to connect the power feed terminal part 9b to the power receipt terminal part 9a and the charging/communication coupler circuit 102 recognized this connection to thereby resume communications with the control unit side in a wire system.

Then, at step 55E, the CPU 110 sends an instruction in a wireless or in a wire system to a battery charger (disposed in the seat 9 as shown in FIGS. 1 and 3) mounted on the base table 3 so as to be controlled by the control unit side, the instruction being to start the charging action in accordance with the various charging parameters decided at step 55A. This instruction allows the output electric current for charging to be applied to the battery 100 via the power feed terminal part 9b, the power receipt terminal part 9a and the charging/communication coupler circuit 102 as shown in FIG. 2, thereby effecting the charging in a mode in accordance with the parameters.

At this time, at least the high voltage control circuit 112 in FIG. 2 may be cut off in order to fail to receive the feed from the battery 100, when the force of adsorption of a wafer on the holder 10 being in the process of exposure can be continued by the residual band charge of the electrode 10a.

Thereafter, at step 55F, it is decided to determine if the action of emergency charging has been completed in a normal way. In instances where the emergency charging action is not executed in accordance with the set parameter, the error processing action is terminated on error. The action for termination on error may be decided, for example, by the CPU 110 or the computer on the control unit side, and this decision is sent to the minicomputer 52 by a wireless or a wire system thereby causing the minicomputer 52 to issue an alarm giving a notice to the operator that an abnormality has occurred during the charging operation.

Further, at step 55F, when the charging operation has been finished in a normal way, the process to resume the exposure action is executed at step 55G. This resume process is decided by the CPU 110 or the computer on the control unit side and a notice is sent to the minicomputer 52 by a wireless or a wire system that the exposure action can be resumed. Therefore, upon receipt of this notice, the minicomputer 52 sends a command to each of the control units in the exposure apparatus to resume the action following the status of interrupt of the exposure action.

On the other hand, when it is decided at step 55B that no emergency charging is needed, the minicomputer 52 then decides at step 57A to determine if it is the timing for executing the exchanges for wafers. When it is decided that it is not the timing for executing the wafers exchanges, on the one hand, the program of FIG. 4 is allowed to terminate in a normal way. If it is decided that it is the timing for executing the wafers exchanges, on the other hand, the minicomputer 52 executes the processes at steps 57B and 57C. The steps 57B and 57C are substantially the same as the processes at steps 55D and 55E, respectively.

Then, as the main stage member 2 stops in the standby position and the charging of the battery 100 is started, the CPU 110 gives an instruction to the high voltage control circuit 112, upon receipt of the command for the wafers exchanges from the minicomputer 52, that the electrostatic adsorption of the exposed wafer on the holder 10 should be released. The release of the adsorption of the wafer can be implemented by quickly discharging the residual band charges accumulated in the wafer and the electrode 10a of the holder 10. At this time, the high voltage control circuit 112 executes the switching action to release the connection to the electrode 10a and then to earth the electrode 10a or the action to apply reverse bias voltage to the electrode 10a in order to instantly neutralize the band charges.

Then, at step 57E, the minicomputer 52 gives a command to a wafer carrier control unit that the carrier arm 42 of the wafer carrier robot 40 removes the exposed wafer from the holder 10 and that it carries an non-exposed wafer to the holder 10 and places it thereonto. This allows the exposed wafer to be unloaded from the holder 10 and the non-exposed wafer to be loaded onto the holder 10.

The completion of the loading of the non-exposed wafer onto the holder 10 is recognized on the control unit side in the control rack 50 and this information is received by the CPU 110 through a wireless system (via the charging/communication coupler circuit 102) or through a wire system (via the RF circuit 106 and the digital converter 108), followed by advancing to step 57F at which an instruction to electrostatically adsorb the non-exposed wafer onto the holder 10 is given to the high voltage control circuit 112. After the CPU 110 has confirmed this adsorption, then the action goes to step 57G where the CPU 110 sends the information to the minicomputer 52 via a wireless system or a wire system that a series of the actions for the wafers exchanges has been completed.

Thereafter, it is decided to determine if the charging action has been carried out in a normal way likewise at steps 55F and 55G, giving a notice to the minicomputer 52 that the exposure action can be resumed for the non-exposed wafer (starting the exposure action for a new wafer in this example).

As described hereinabove, in the embodiment of the present invention, as the battery 100 is charged upon the action to exchange for substrate plates to be exposed or to be processed, such as wafers, etc., a decrease in throughput can be prevented other than in instances where the emergency charging is implemented. Further, the apparatus can be made lightweight as only the battery 100, the charging/communication coupler circuit 102 and the high voltage control circuit 112 are required to be loaded on the movable main stage member 2, in instances where the electrical drive systems (e.g. XM1–XM3, ZM1–ZM3, etc. in FIG. 2) to be loaded on the movable main stage member 2 are not driven by the battery 100 and are driven exclusively by an electrostatic chuck alone.

Moreover, in this case, as the battery 100 is required to feed the high voltage control circuit 112 alone, an electrolytic capacitor having a large capacity may be employed as the battery 100 in accordance with an average period of time during which one sheet of a substrate plate to be exposed or to be processed is kept being adsorbed on the holder 10 for an exposure operation or a processing operation.

Further, as in this embodiment, a battery or a condenser is mounted as a self-sustaining power source on the movable main stage member, thereby enabling an amplification and processing of a variety of detection signals from a temperature sensor for monitoring a variation in the temperature of each part of the movable main stage member, an optical sensor for optoelectrically detecting on the movable main stage member the intensity of light (e.g. illumination light for exposure or rays of light from the image of a pattern on a reticle) to be irradiated through the optical projection system PL, an acceleration sensor to be mounted on the movable main stage member for controlling a vibration-proofing actuator disposed to the mount part 32 as shown in FIG. 3 or a gas sensor for monitoring the concentration of oxygen or ozone around the exposing substrate plate, the state of inert gases, etc., mounted on the main stage member 2.

In addition, it is also possible to load a recording media for collecting and accumulating a variety of information to be obtained from those sensors and the CPU 110, etc. on the movable main stage member, thereby enabling a self-analysis of the various statuses caused to occur on the main stage member 2 side and further incorporating a self diagnosis system for demanding an operation for the minicomputer 52 or the like to improve the various statuses as a result of the self-analysis.

It is to be noted herein that the stage apparatus as shown in FIGS. 1 and 2 is so adapted as to achieve the object particularly without the use of a flexible tube for use otherwise in vacuum adsorption of a substrate plate to be exposed by effecting the adsorption of the substrate plate in an electrostatic system. Therefore, the stage apparatus as shown in FIGS. 1 and 2 can also achieve the effects by utilizing an exposure apparatus for effecting exposure in vacuum atmosphere with rays of charged particles (electron beams) or an apparatus for exposing the substrate plate in atmosphere of inert gases (nitrogen or helium gases) with ultraviolet rays having a wavelength of 200 nm or shorter or with soft X-rays (with a wavelength range from approximately 1 Å to 300 Å) (SOR exposure art) or the like, in addition to an apparatus for exposing the substrate plate in open air as shown in FIG. 3.

Figure 5:
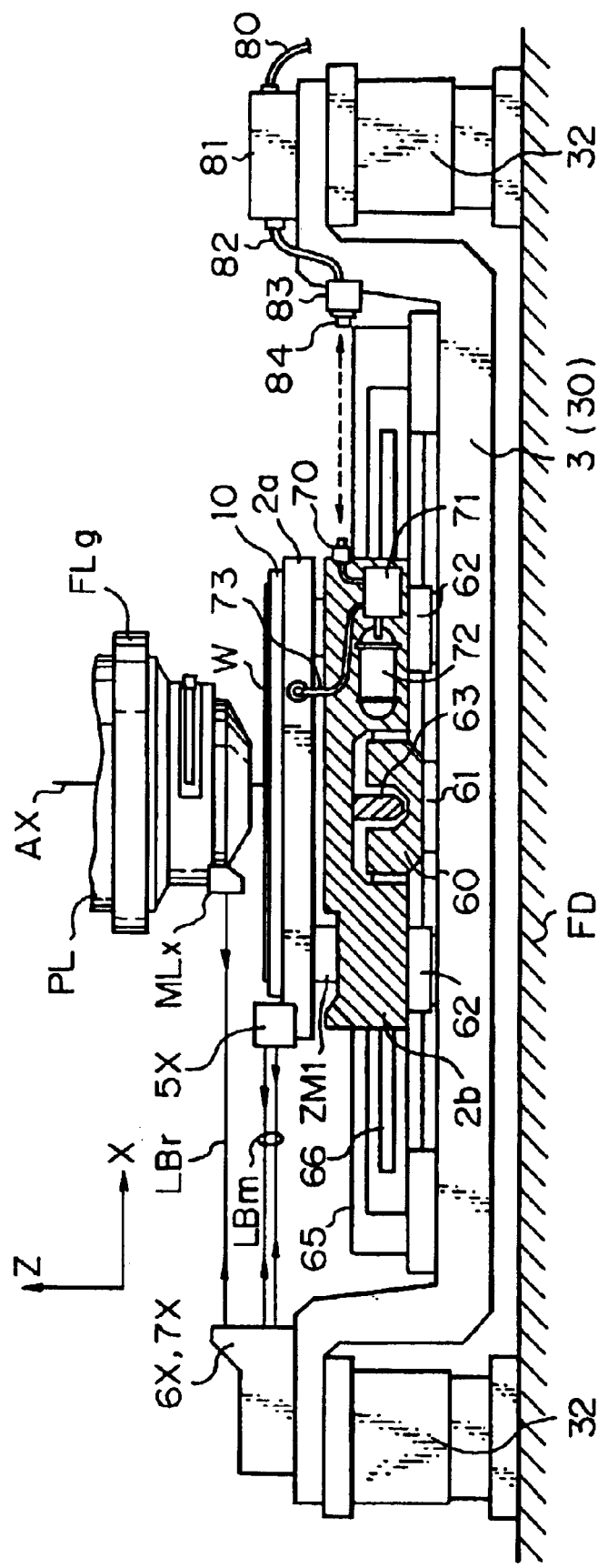
FIG. 5 is a side view showing an overall structure of the movable stage apparatus in accordance with a second embodiment of the present invention.

Now, a description will be made of the structure of the stage apparatus according to a second embodiment of the present invention, with reference to FIGS. 5 and 6. The stage apparatus of FIG. 5 is structured with the presumption that it is loaded on the projection exposure apparatus as shown in FIG. 3. The structuring parts functioning in the same manner as the structure of the apparatus as shown in FIGS. 1 and 3 are provided with the identical reference numbers and symbols.

The stage apparatus as shown in FIG. 5 is not of such a guideless structure as illustrated by the apparatus as shown in FIG. 1 and in an air bearing guide system, which comprises three linearly drivable motors (linear motors) disposed in a H-letter shape, a linearly fixed guide member fixed to a table of the apparatus, a movable guide member disposed as to be movable along the fixed guide member and extending in a direction intersecting at a right angle with the fixed guide member, and a movable main stage member disposed so as to move the table of the apparatus by guidance with the movable guide member, in which each of the guide surfaces is supported in a non-contact fashion by a static pressure gas bearing.

Some examples of the stage apparatuses having such a structure are disclosed, for example, in Japanese Patent Unexamined Publication Nos. 59-101,835 (U.S. Pat. No. 4,655,594), 61-209,831 and 1-188,241 (U.S. Pat. No. 5,040, 431), and the technology disclosed therein may be applied to the stage apparatus according to the second embodiment of the present invention as it is or, as needed, with some modifications.

The stage apparatus as shown in FIG. 5 is characterized particularly by the features that no tube is used at all or the number of tubes can be reduced, the tube or tubes being connected from a fixed part of the apparatus to a closed space part (a reduced pressure path or an elevated pressure path) in which the reduced pressure state or the elevated pressure state can be maintained at a predetermined level, such as a vacuum adsorption part or an air cylinder, loaded in the movable part of the stage apparatus.

Turning now to FIG. 5, the main body of the exposure apparatus (the main stage member 2) is held through four mount bases 32 on a floor FD of a plant for producing semiconductor circuit elements. On each of the mount bases 32 is mounted an apparatus column 30 acting as the base table 3. On the base table 3 is held a lower stage portion 2b through a plurality of static pressure gas pads 62 acting as an air bearing so as to be movable in a two-dimensional direction, the lower stage portion 2b constituting a portion of the movable main stage member 2 and having a movable guide member 60 disposed at its inner central portion so as to move in the X-direction, i.e. the leftward-and-rightward direction on the paper surface of FIG. 5.

The movable guide member 60 has a guide surface extending in the direction (Y-direction), i.e. in the direction perpendicular to the paper surface of FIG. 5 and is held on the base table 3 through an electrostatic pressure fluid pad 61. The guide surface of the movable guide member 60 is structured such that it is held in the Y-direction between the plural static pressure gas pads disposed inside the lower stage portion 2b. Further, the movable guide member 60 has a magnets track disposed in the X-direction, which is magnetically connected to a coil unit 63 fixed to the lower stage portion 2b. Thus, a linear motor is formed between the lower stage portion 2b and the movable guide member 60 so as to move the lower stage portion 2b in the Y-direction along the guide surface of the movable guide member 60.

On the other hand, the movable guide member 60 is restrained via air bearing on an X-directionally extending guide surface of a fixed guide member 65 fixed on the base table 3. Further, the movable guide member 60 is provided with driving force in the X-direction by a linear motor 66 mounted on the base table 3 in the position parallel to the fixed guide member 65, thereby moving the lower stage portion 2b in the X-direction integrally with the movable guide member 60 when the linear motor 66 is driven.

On the upper side of the lower stage portion 2b is mounted an upper stage portion 2a through the Z/L minute motion mechanism including three motors ZM1, ZM2 and ZM3 (only ZM1 being illustrated in FIG. 5 as a representative example), and the upper stage portion 2a has the holder 10 mounted thereon, which in turn is so arranged as to adsorb a wafer W in a vacuum way. The loading surface of the holder 10 on which the wafer W is loaded is formed with a plurality of fine projections (e.g. 1 mm in height) each in a ring shape, in a dot shape or a linear shape. As the rear surface of the wafer W comes into tight contact with the tip surfaces of the fine projections formed on the surface of the holder 10, it is adsorbed via vacuum pressure on the tips of the fine projections, thereby forming an extremely thin, reduced pressure layer (a closed space portion for vacuum adsorption) having the thickness corresponding to the height of each projection between the rear surface of the wafer W and the loading surface of the holder 10.

An example of the holder 10 for such vacuum adsorption is disclosed in detail, for example, in Japanese Patent Unexamined Publication No. 1-319,965. This prior technology disclosed in this patent publication may be applied to the holder 10 in this embodiment of the present invention as it is or with some modifications. Also, a detailed description of the Z/L minute motion mechanism for minutely moving the wafer W with freedom in three directions, i.e. Z-direction and directions of inclination (inclinations about the X-axis and about the Y-axis) and the action thereof is made, for example, in Japanese Patent Unexamined Publications Nos. 55-134,812 (U.S. Pat. No. 4,540,278), 58-103,136, 62-274, 201 (U.S. Pat. No. 4,770,531) and 7-201,699 (U.S. Pat. No. 5,473,424) and U.S. Pat. No. 4,084,903.

The Z/L minute motion mechanisms as disclosed in those prior art patent publications may be driven by plural small-size rotary motor, piezo expansion elements or the like and they may also be driven by a voice coil type motor or a direct-acting motor utilizing repelling force or sucking force of an electromagnetic power, such as an E core electromagnet, as driving force for a direct minute motion. In either case, the Z/L minute motion mechanisms as disclosed in the above-mentioned patent publications may be applied to the embodiment of the present invention as they are or with some partial modifications.

On a peripheral portion of the upper stage portion 2a is fixed the movable mirror 5X having substantially the same structure as that as shown in FIG. 1, which in turn is disposed to allow a measurement of the X-directional position of the coordinates of the upper stage portion 2a by the laser interferometer 6X and the receiver 7X. Although omitted from FIG. 5, the movable mirror 5Y is also disposed in substantially the same manner to measure the Y-directional position of the coordinates thereof. In this embodiment of the present invention, however, as the upper stage portion 2a is so disposed as to be inclined as a whole by the Z/L minute motion mechanism, the laser interferometer 6X is disposed so as to project laser beams LBm for length measurement onto two Z-directionally different locations of the reflecting plane of the movable mirror 5X, and the receiver 7X is disposed so as to measure an amount of a lateral deviation of the wafer W due to the driving of the Z/L minute motion mechanism by measuring an amount of a variation in inclination (pitching) of the reflecting plane of the movable mirror 5X with respect to the X-Z flat plane. With this arrangement, the laser interferometers system 6X and 7X (6Y and 7Y) according to the embodiment of the present invention can measure the X-directional and Y-directional positions of the coordinates of the upper stage portion 2a, yawing (a minute rotation in the direction θ), and the pitching (a minute inclination with respect to the X-Y flat plane).

Further, the laser interferometers system according to the embodiment of the present invention allows the length measurement on the basis of interference of the reflecting laser beams of reference laser beams LBr with the reflecting laser beams of the length-measuring laser beams LBm, the reference laser beams LBr being projected onto a fixed mirror MLx mounted on the bottom portion of a mirror cylinder of the optical projection system PL and the length-measuring laser beams LBm being reflected from the movable mirror 5X. The mirror cylinder of the optical projection system PL is fixed to an apparatus column by a flange part FLg so as to allow its optical axis AX to become perpendicular to the X-Y flat plane (a defined flat plane of the base table 3).

Moreover, in the embodiment of the present invention, a pressure-reducing fluid (vacuum pressure in the range of from approximately 300 mmHg to 380 mmHg) for causing the wafer W to be vacuum adsorbed on the holder 10 may be supplied from a receipt edge orifice 70 fixed to a peripheral edge of the upper stage portion 2a. The receipt edge orifice 70 is so disposed as to come into abutment with a feed edge orifice 84 fixed on the base table 3 side or the apparatus column 30 side, when the movable main stage member 2 (2a and 2b) is moved to the loading position for wafers exchanges. The pressure-reducing fluid fed through the receipt edge orifice 70 is supplied to the upper stage portion 2a via an electromagnetic valve unit 71 and a tube 73 and then to the loading surface of the holder 10 via the inside of the upper stage portion 2a. The electromagnetic valve unit 71 is to switch between the opening of the receipt edge orifice 70 to the atmosphere and the closing of a passage of the fluid, in response to the electrical signals.

At a portion of a path in which the pressure-reducing fluid flows through the electromagnetic valve unit 71 is disposed a reserve tank 72 communicating with the tube 73 during the action of adsorption of the wafer W. The reserve tank 72 is disposed in order to solve the disadvantages that a total pressure-reduced volume extending from the pressure-reducing layer formed on the loading plane of the holder 10 to the tube 73 is so extremely small that the action of adsorption of the wafer W cannot be sustained by the volume alone over a period of time long enough to complete the exposure action of the wafer W. The such disadvantages may be caused to occur mainly due to the fact that the pressure-reducing fluid may be leaked to an extremely slight extent on account of irregularity in the order of microns on the rear surface of the wafer which comes into tight contact with the loading surface of the holder 10.

A flow amount of a leakage of the pressure-reducing fluid may vary-greatly with the extent of unevenness on the rear surface of the wafer and, generally, heat processed wafers may have the tendency that a flow amount of the leaked fluid becomes greater. In a usual case, the exposure apparatus of this sort implements the exposure in such a state that the wafer W is aligned with a projection image of a reticle with accuracy of approximately one of fifth or smaller (e.g. ±0.04 micron) of the width of an image resolving line. This alignment accuracy should be maintained over the entire period of time during which one sheet of a wafer is being subjected to processing for exposure. Therefore, the wafer adsorbed on the holder 10 has its adsorption force defined so as to fail to minutely move to such an extent that the alignment accuracy causes deteriorating over a period of time ranging from the start of the alignment action of the wafer W (the action to detect the position of a wafer mark of the wafer W) to the completion of exposure of plural shot areas on the wafer W.

Although the adsorption force may vary with a planar disposition of the plural projections formed on the loading surface of the holder 10, a rate of the contact area of the projections with respect to the rear surface of the wafer therewith, etc., it depends dominantly upon a variation in vacuum pressure. In this embodiment of the present invention, therefore, it is preferred that the adsorption force for adsorbing the wafer W on the holder 10 can be sustained at a predetermined level over a long period of time (during the time when the wafer is loaded on the holder 10 at least for exposure processing), even if an extremely slight amount of the pressure-reducing fluid would be leaked, by disposing the reserve tank 72 through the path through which to flow the pressure-reducing fluid, as shown in FIG. 5.

The reserve tank 72 may be built in the lower stage portion 2b, although it may be attached outside a portion of the lower stage portion 2b as shown in FIG. 5. Further, the electromagnetic valve unit 71 may be provided with a pressure sensor (a vacuum sensor) for detecting the pressure within the reserve tank 72 or the tube 73, thereby sending the detected information to a board for stage control in the control unit 51 installed in the control rack 50.

Further, the electromagnetic valve unit 71 is provided therein with a variable restricting valve (a speed controller) for adjusting a flow amount of the pressure-reducing fluid to be fed to the loading surface of the holder 10 through the tube 73. The variable restricting valve is so arranged as to restrict the flow amount of the pressure-reducing fluid passing through a path for supplying vacuum pressure at the time of starting the adsorption of the wafer in order to ensure a stable and sure adsorption of the wafer W on the holder 10 without a deviation of the position of the wafer W.

The feed edge orifice 84 engageable with the receipt edge orifice 70 may be mounted on a portion of the apparatus column 30 or the base table 3 by the aid of a fixing member 83 and be connected to a fluid supply system 81 through a tube 82. To the fluid supply system 81 is connected a tube 80 extending from a source for vacuum original pressure or compressed dry air disposed in a plant. In the fluid supply system 81 is disposed an electromagnetic valve for sending the pressure-reducing fluid (vacuum pressure) to the feed edge orifice 84 through the tube 82 or blocking the passage of the pressure-reducing fluid thereto.

Now, a description will be made of each of the structuring parts of the holder 10, the upper stage portion 2a, an accessory pressure-reducing mechanism (70–73) for adsorption of the wafer, and the fluid supply unit 81, with reference to FIG. 6, among the structuring parts of the apparatus as shown in FIG. 5.

Figure 6:
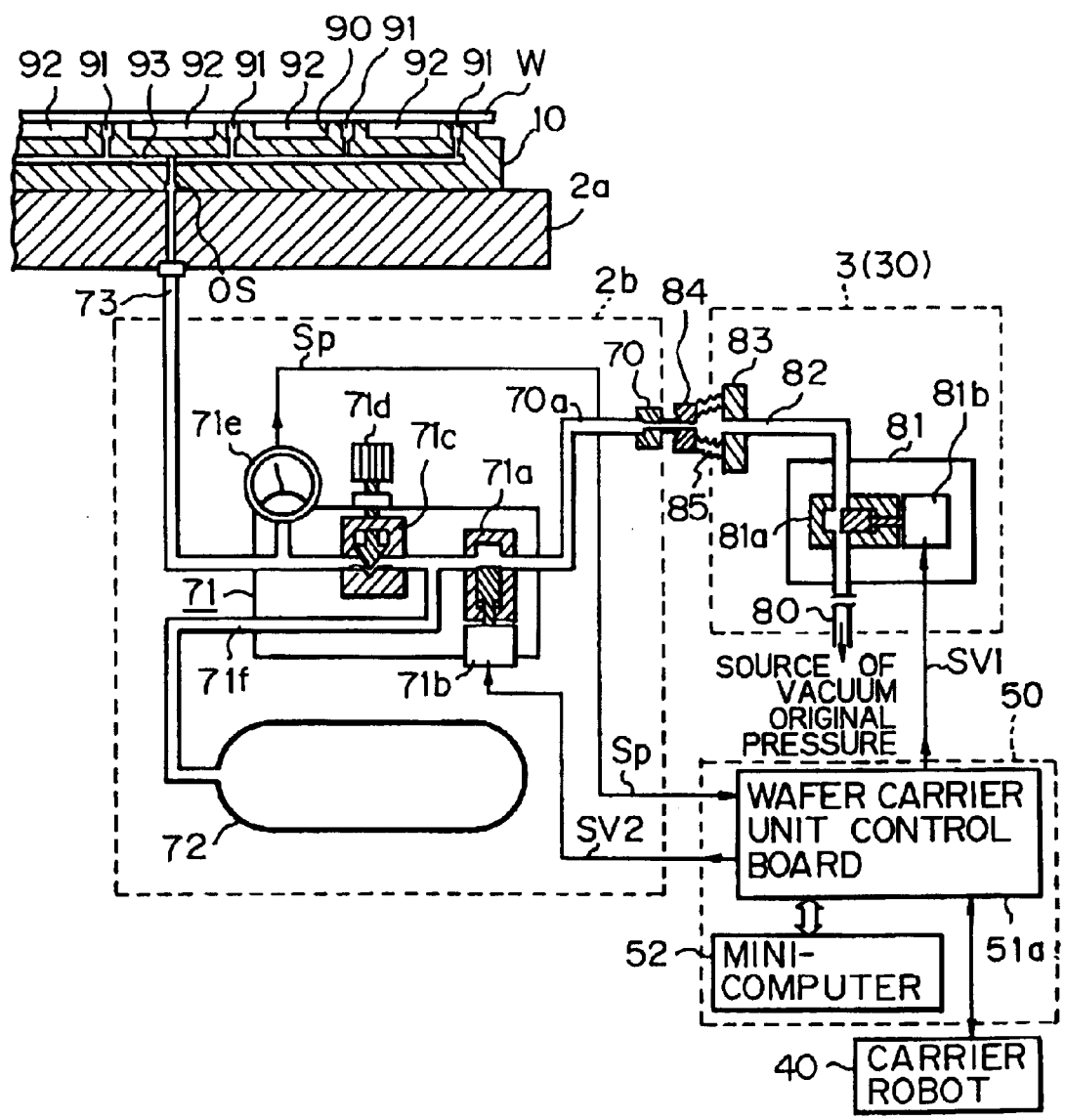
FIG. 6 is a block diagram showing the structure of a vacuum adsorption path on the main stage member side and a vacuum pressure supply system on a base table side to be applied to the apparatus of FIG. 5.

FIG. 6 is a schematic block diagram showing a piping line of the apparatus, in which the same structuring parts as those in FIG. 5 are provided with the identical reference numerals and symbols.

The holder 10 is provided on its surface with a plurality of fine projection parts 90 as shown in FIG. 6. The fine projection parts 90 are comprised of plural projections each of a ring shape, with narrower space portions (concave portions) 91 and wider space portions (concave portions) 92 arranged alternately in the radial direction, as illustrated in Japanese Patent Unexamined Publication No. 1-319,965. A small ring-shaped groove defined by the narrower space portion 91 is structured as a pressure-reducing part for vacuum adsorption and a ring-shaped concave portion defined by the wider space portion 92 is comprised as an area in which the pressure is allowed to be released into open air and the pressure therein becomes slightly negative during the time of adsorption.

With the arrangement in the manner as described hereinabove, the holder 10 is mounted on the upper stage portion 2a. Each of the ring-shaped grooves 91 for adsorption on the holder 10 is communicated with a pressure-reducing path 93 formed in the holder 10, which in turn is connected to a tube 73, as shown in FIG. 5, through a O-ring OS, made of rubber or plastics material. Upon loading the wafer W onto the holder 10, the pressure within each of the ring-shaped grooves 91 on the holder 10 is reduced by supplying the pressure-reducing fluid (vacuum pressure) thereto through the tube 73, thereby allowing the wafer W to be adsorbed and fixed in a tight contact state on each of the top surface portions of the ring-shaped projection parts 90 of the holder 10. At this time, the wafer W may be flattened in accordance with a plane accuracy (for example, less than plus or minus approximately 1 micron) defined by the surface of each of the fine projection parts 90.

The tube 73 is connected to the electromagnetic valve unit 71 fixed to the lower stage portion 2b. The electromagnetic valve unit 71 includes a pipe 70a leading the pressure-reducing fluid from the receipt edge orifice 70 thereto, an electromagnetic valve 71a for switching the opening of the pipe 70a to open air or the blocking therefrom, a valve drive part 71b of the electromagnetic valve 71a, a variable restricting valve 71c for adjusting a flow speed rate of the pressure-reducing fluid from the electromagnetic valve 71a, an adjustment thumbscrew 71d of the variable restricting valve 71c, and a pressure sensor 71e for monitoring the adsorption force of the wafer by detecting the negative pressure of the pressure-reducing path extending between the ring-shaped grooves 91 of the holder 10 and the tube 73. Further, the pressure-reducing path extending between the electromagnetic valve 71a and the variable restricting valve 71c is connected to a pipe 71f communicating with the reserve tank 72.

FIG. 6 shows the status in which the movable main stage member 2 (2a and 2b) is stayed at its standby position and the receipt edge orifice 70 is engaged with the feed edge orifice 84 held on the side of the base table 3 or the apparatus column 30 through the fixing member 83. With this arrangement, when the receipt edge orifice 70 is comprised of a metal pipe having a diameter of several millimeters, it is preferred that the feed edge orifice 84 is made of elastic material and in a ring shape having a circular opening portion that can tightly engage with the metal pipe and communicates with the receipt edge orifice 70.

As shown in section in FIG. 6, the circular opening portion of the feed edge orifice 84 may be formed in such a conical shape that the diameter of its outer side is greater and that of its inner side becomes gradually smaller. With this structure of the circular opening portion of the feed edge orifice 84, the metal pipe of the receipt edge orifice 70 can be inserted readily and surely into the circular opening portion of the feed edge orifice 84 simply by minutely moving the movable main stage member 2 in the Y-direction with a predetermined driving force. It is also possible to coat each of the metal pipe of the receipt edge orifice 70 and the opening portion of the feed edge orifice 84 with a highly viscous oil (grease) forming a thin coating, in order to prevent a leakage during connection.

Between the feed edge orifice 84 and the fixing member 83 is disposed a bellows 85 with a relatively high degree of elasticity, and the feed edge orifice 84 is so disposed as to be oscillatable in a slight range to absorb a deviation in the position of the receipt edge orifice 70 relative to the position of the feed edge orifice 84, which may be caused to occur upon connection of the metal pipe of the receipt edge orifice 70 with the feed edge orifice 84.

On the other hand, the fluid supply system 81 fixed on the side of the base table 3 or the apparatus column 30 is disposed therein with an electromagnetic valve 81a and a drive part 81b for driving the valve, the electromagnetic valve 81a being so arranged as to switch between passing of the pressure-reducing fluid (vacuum pressure) for sending to the feed edge orifice 84 through the tube 82 and blocking the passage of the pressure-reducing fluid and being connected through the tube 80 to a source of vacuum original pressure disposed in the plant.

With the arrangement as described hereinabove, signals SV1 and SV2 are sent each to the drive part 81b of the electromagnetic valve 81a and the drive part 71b of the electromagnetic valve 71a from a control board 51a for controlling a wafer carrier unit among control units 51 in the control rack 50 as shown in FIG. 3. The electromagnetic valves 71a and 81b are so arranged as to open the pressure-reducing path and close it in response to the signals SV1 and SV2, respectively. Further, the pressure sensor 71e sends a signal Sp to the control board 51a in accordance with the pressure (negative pressure) detected thereby, and a computer installed in the control board 51a generates information about a predetermined alarm in accordance with the program for monitoring the status of adsorption of the wafer on the basis of the signal Sp.

The alarm information is employed primarily for the object to rapidly cease the action of the exposure apparatus in case of emergency for ensuring safety in instances where the adsorption of a wafer cannot be implemented at all. Secondly, the alarm information is employed for the object to decide if the program should be executed to implement the action to adsorb the wafer again immediately before the event occurs that the adsorption of the wafer cannot be implemented in a proper way or to execute the action to cease the exposure of the wafer on error, by monitoring a periodical variation in the adsorption of the wafer. Such a program for monitoring the adsorption of the wafer to generate such an alarm information will be described in detail later.

On the other hand, the computer in the control board 51a is connected to an upper minicomputer 52 and a lower carrier robot 40 through a parallel bus or a serial bus such as GP-IB, optical fibers, RS232C or the like. The minicomputer 52 sends a global command to the control board 51a through the such bus in a status according to the communications regulations of SECS, the global commands including "CARRY WAFER", "EXCHANGE WAFERS", "WAITING", "INITIALIZE" and the like. The computer in the control board 51a executes plural sets of programs in response to the such global command, the plural sets of the programs consisting of plural subcommands and parameters for controlling the specific actions of each part of the carrier mechanism such as the wafer carrier robot 40 and the like.

Then, a description will be made of primary actions including the action to exchanges for wafers and the action to adsorb the wafer with the arrangement of the apparatus as shown in FIGS. 5 and 6, with reference to each flowchart of FIGS. 7–9 and 11. The flowchart of each of FIGS. 7–9 and 11 mainly indicates the primary actions to carry wafers and to exchange for wafers in accordance with the program stored in the computer of the control board 51a of the wafer carrier control unit. Further, in this embodiment, a description will be made with the presumption that one sheet of a wafer W is loaded (vacuum adsorbed) on the carrier arm 42 as shown in FIG. 3 in such a state that it is pre-aligned mechanically.

Figure 7:
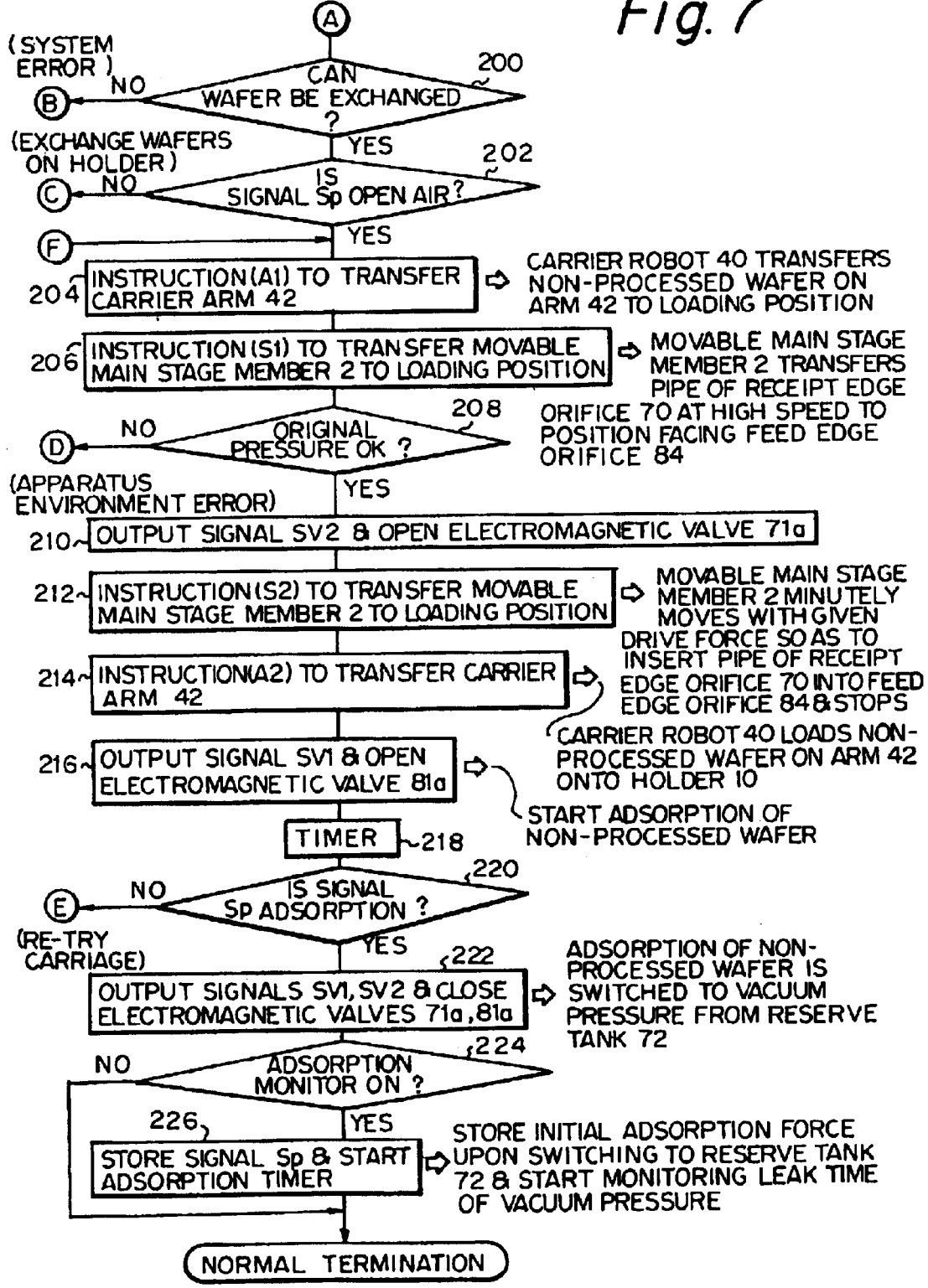
FIG. 7 is a flowchart for describing a major action (program A) for adsorbing a wafer by the apparatus of FIGS. 5 and 6.

The program A as shown in FIG. 7 indicates the primary actions ranging from the action to execute the global command of "EXCHANGE WAFERS" upon sending it thereto from the minicomputer 52 to the action to adsorb a new wafer (a non-processed wafer) on the holder 10 when no processed wafer is located on the holder 10.

(Step 200)

Figure 8:
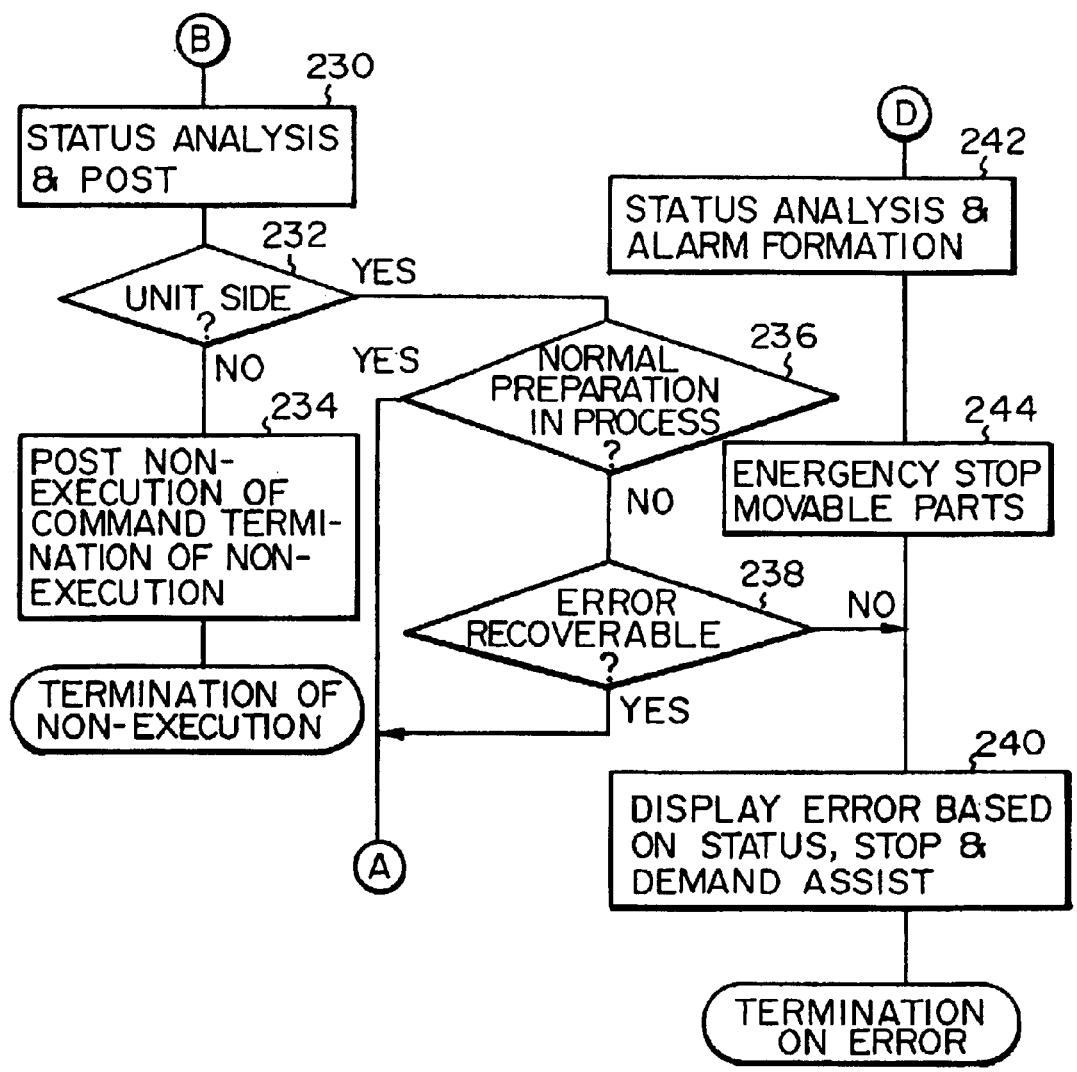
FIG. 8 is a flowchart for describing an error processing action (program D) branching off in the flowchart of FIG. 7.

At step 200, it is decided to determine whether the wafer carrier control unit is in a wafer-exchangeable state in which to exchange wafers from the physical and timing point of view. The "wafer-exchangeable state" referred to herein is intended to mean the state that should satisfy two points, one being such that a new wafer for exchange (for loading) is pre-aligned in a normal way and is already in a state ready for exchange and the second being such that the movable main stage member 2 is not shared with another wafer for the exposure action. Therefore, when it is decided at step 200 that the wafers exchanges cannot be conducted, the action for the wafers exchanges is not implemented, followed by proceeding to a process routine for a system error in accordance with a program B (FIG. 8). On the other hand, when the decision is made at step 200 to implement the wafers exchanges, then the program goes to step 202.

(Step 202)

Figure 9:
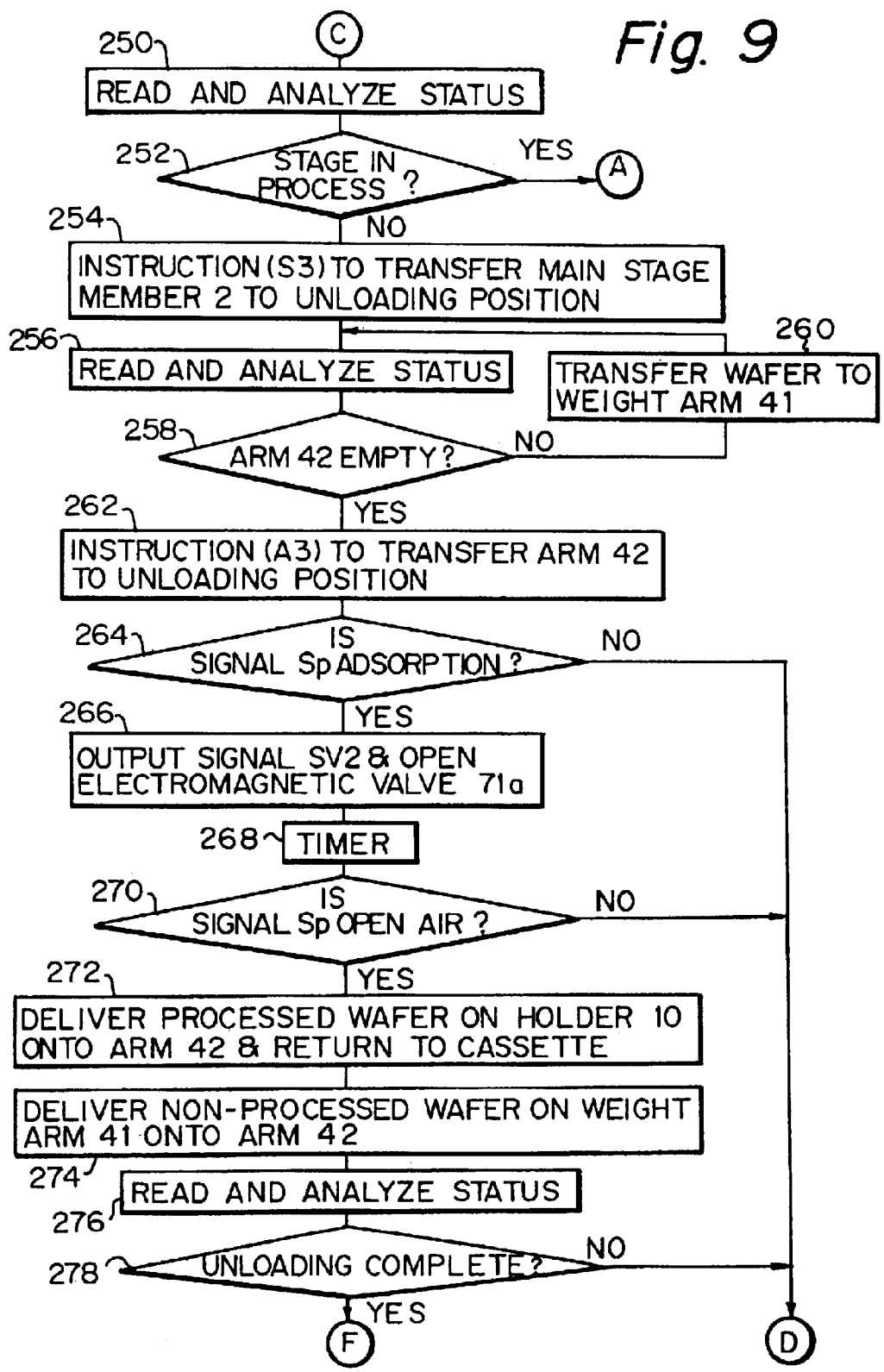
FIG. 9 is a flowchart for describing a wafer exchanging action (program C) branching off in the flowchart of FIG. 7.

At step 202, the signal Sp from the pressure sensor 71e disposed in the electromagnetic valve unit 71 as shown in FIG. 6 is read, followed by deciding to determine if the read value is a value in accordance with atmospheric pressure or not. This decision is executed to investigate whether a wafer is adsorbed on the holder 10 of the movable main stage member 2 or not. When it is decided at step 202 that the wafer is adsorbed on the holder 10, on the one hand, the actions following the program A are not implemented, followed by executing a wafers exchanges routine in accordance with a program C (FIG. 9). When it is decided thereat that no wafer is loaded on the holder 10, on the other hand, step 204 is executed.

(Step 204)

At step 204, an arm transfer instruction (A1) is sent to move the carrier arm 42 of the wafer carrier robot 40 to the loading position for loading a non-processed wafer located on the carrier arm 42 of the wafer carrier robot 40. This instruction allows the non-processed wafer to be transferred to the loading position on the X-Y flat plane while maintaining the Z-position higher than the surface of the holder 10.

(Step 206)

At step 206, a stage transfer instruction (S1) is sent in order to transfer the movable main stage member 2 toward the loading position, in substantially the same manner as at step 204. In response to the move instruction (S1), the movable main stage member 2 is allowed to transfer the metal pipe of the receipt edge orifice 70, as shown in FIGS. 5 and 6, to the position facing the right front face of the feed edge orifice 84 at an interval apart by several millimeters and to stop the movement of the mental pipe of the receipt edge orifice 70 in the stop position. The stop position referred to herein is the unloading position in which to remove the exposed wafer, in this embodiment, from the holder 10.

(Step 208)

At step 208, there is confirmed the original pressure of the vacuum source to be fed to a pipe 80 as shown in FIG. 6, while executing step 206 in parallel thereto. The original pressure is confirmed by reading the detected value of a pressure gauge not shown in FIG. 6. Although this confirmation is not absolutely required, it is preferred to effect this confirmation in order to avoid in advance inconveniences to be caused to occur due to the fact that a wafer is loaded on the holder 10 at an abnormal original pressure. That the original pressure of the vacuum source is outside a predetermined pressure range means an occurrence of serious inconveniences in the operating environment itself of the apparatus, in addition to the action of adsorption of a water, or a future occurrence of such abnormality. If the original pressure of the vacuum source is outside the predetermined pressure range, a program D (FIG. 8) is executed to give a notice of abnormality in the operating environment of the apparatus. In this case, the movable main stage member 2 is stopped in the position in which the receipt edge orifice 70 is slightly apart from the feed edge orifice 84 in the vicinity of the loading position (an unloading position in this embodiment), thereby bringing the movable main stage member 2 into the waiting state for assistance by the operator.

(Step 210)

When it is decided at step 208 that the original pressure of the vacuum source is normal, the control board 51a sends to the drive part 71b the signal SV2 to open the electromagnetic valve 71a. In response to this signal, the electromagnetic valve 71a is switched into an open state as shown in FIG. 6.

(Step 212)

At step 212, a minute motion instruction (S2) for a minute motion is sent to accurately align the movable main stage member 2 with the loading position at the same time as step 212 is sent. In response to this instruction (S2), the movable main stage member 2 is minutely moved so as to allow the metal pipe of the receipt edge orifice 70 to move in a straight way toward the opening part of the feed edge orifice 84 and to engage the metal pipe of the receipt edge orifice 70 with the opening part of the feed edge orifice 84 with each other. Upon engagement of the metal pipe of the receipt edge orifice 70 with the opening part of the feed edge orifice 84, as shown in FIG. 6, the linear motors 63 and 66 as shown in FIG. 5 are subjected to servo control on the basis of the position information about the positions of the laser interferometers 6X and 6Y, respectively, so as to stop the movable main stage member 2 at the position.

(Step 214)

At step 214, a delivery instruction (A2) to deliver a non-processed wafer to the holder 10 is given by lowering the carrier arm 42 of the wafer carrier robot 40 at the same time as at step 212. This instruction allows the non-processed wafer to be loaded on the loading surface of the holder 10 as shown in FIG. 6, and the carrier arm 42 to be evacuated from a space on the holder 10.

(Step 216)

At step 216, the signal SV1 to open the electromagnetic valve 81a is sent to the drive part 81b concurrently with step 214. Although the action at step 214 is finished in a usual case in one to two seconds, the electromagnetic valve 81a is opened during this period of time, thereby supplying the vacuum pressure to the pressure-reducing path extending between the source of the original vacuum pressure and the adsorption groove 91 of the holder 10 and to the reserve tank 72. At this time, as there is no variable restricting valve in the vacuum path to the reserve tank 72, the pressure inside the reserve tank 72 is reduced up to substantially the same level as the source of the vacuum original pressure.

On the other hand, as the variable restricting valve 71c is disposed in the vacuum path extending to the adsorption grooves 91 of the holder 10, some delay (approximately within 1 second) is caused to happen until the pressure within the adsorption grooves 91 is reduced to the level substantially identical to the source of the vacuum original pressure, even if the rear surface of the wafer is allowed to come into tight contact with the fine projection parts 90 of the holder 10 to form the flow path between the receipt edge orifice 70 and the adsorption grooves 91 into a closed space. Thus, at the next step 218, the action to wait for a timer is executed while a delay in time may be expected to occur. However, step 218 is not absolutely necessary.

(Step 220)

At step 220, the signal Sp is read from the pressure sensor 71e and it is then decided to determine if the read value is present in the range of pressure to be present at the time of vacuum adsorption. As an example, in instances where the pressure of the source of the original vacuum pressure is set at approximately 350 mmHg, it is decided that the adsorption force is ensured to a predetermined level when the detected pressure is present, for example, within ten several percentage, i.e. in the range of 350 mmHg to 390 mmHg, followed by proceeding to step 222.

However, in instances where the detected signal Sp is present outside the pressure range representative of adsorption, it can be understood that a great extent of leakage occurs in the vacuum pressure-reducing path that should be an airtight closed space. The major reason for causing such leakage is because a gap of several microns or greater may be caused to occur between a portion of the fine projection parts 90 of the holder 10 and the rear surface of the wafer due to interposition of fine particles (foreign material) between the wafer and the holder 10 or transformation of the wafer itself. In this case, it is decided that the adsorption of the wafer is poor, thereby canceling the actions following the program A and re-implementing the action to carry the wafer or executing a program E for retrial which requires assistance by the operator.

The program E for re-trying the carrying of the wafer is basically to carry out an operation for unloading a non-adsorbed wafer on the holder 10 in a pre-alignment mechanism and re-executing the actions following the pre-alignment action. However, as it has nothing to do directly with this embodiment, a detailed description thereof is omitted here.

(Step 222)

At step 222, the signals SV1 and SV2 for closing the two electromagnetic valves 71*a* and 81*a* are sent to the drive parts 71*b* and 81*b*, respectively, thereby switching the vacuum adsorption path on the movable main stage member 2 side to the state in which to cut off the path from open air and sustaining the wafer in an independently self-sustaining adsorption state by the vacuum pressure within the reserve tank 72. However, generally, there is the possibility that a gap of 1 micron or smaller may be caused to occur partially between the rear surface of the wafer and the contact surface of the fine projection parts 90 of the holder 10 due to microscopic roughness on their surfaces. Therefore, the pressure-reducing fluid is leaked gradually to reduce the vacuum pressure so that, in this embodiment, a program (FIG. 12) for monitoring the ability of sustaining the adsorption force of the wafer by the reserve tank 72 is set so as to be startable.

(Step 224)

At step 224, the decision is made to determine whether the program for monitoring the adsorption is turned on or not. When it is decided herein that the program is not turned on, on the one hand, a series of the actions for the wafers exchanges and the wafer adsorption in accordance with the program A has been finished, followed by proceeding to the next step 226, when the monitoring of adsorption is to be implemented. The decision at step 224 is made to check if the setting for monitoring the adsorption of the wafer is actually made. This program for monitoring the wafer adsorption is set to be automatically started in usual cases, unless the setting is otherwise released under special situations, such as due to a maintenance of the apparatus. Thus, when it is decided at step 224 that the program for monitoring the wafer adsorption is not ready for start, this situation is noticed to the minicomputer 52 through a bus line and an alarm or a display to that effect is given to the operator. It is to be noted herein that when the exposure apparatus is set to a usual large-scale production mode, the program for monitoring the wafer adsorption may be set to be started without conditions.

(Step 226)

At step 226, upon starting the program for monitoring the wafer adsorption, the signal Sp from the pressure sensor 71*e* immediately after the start of the self-sustaining adsorption is read and stored and a timer for monitoring the leak time of the vacuum pressure (the time for maintaining the adsorption force) and the like is started. The program for monitoring the wafer adsorption (FIG. 12) is started at the time of starting the self-sustaining adsorption of the wafer by the reserve tank 72 and continued until the wafer is detached from the holder 10. The monitoring program is set so as to read the value of the signal Sp and the count time of the timer at every constant time or whenever a certain command relating to the driving of the movable main stage member 2, thereby computing the prediction of a variation in the adsorption force of the holder 10 and preparing a variety of alarm information on the basis of the result of computation.

The actions for carrying the wafers and adsorbing the wafer in accordance with the program A are completed by step 226. The notice of this completion is given to the minicomputer 52 as one global command having been finished in a normal manner. Thereafter, the movable main stage member 2 moves in a two-dimensional direction under the optical projection system PL as shown in FIG. 3 in response to various global commands to be given by the minicomputer 52 in order to execute an alignment action for detecting the mark on the wafer, an exposure action for transcribing a circuit pattern onto each shot area on the wafer, and the like.

Now, a brief description will be made of programs B and D branching off from steps 200 and 208 of the program A, respectively, with reference to FIG. 8. The program B consists of steps 230 to 240 as shown in FIG. 8 and the program D likewise consists of steps 242, 244 and 240.

At step 230 of the program B, the action status of each part in the wafer carrier control unit is read and analyzed in order to learn the cause of disablement of exchanging wafers at the time of receipt of a global command from the minicomputer 52. The result of analysis is reported to the minicomputer 52. Then, at step 232, it is decided from the result of analysis to determine whether the disablement of the wafers exchanges is caused to occur by failure on the part of the wafer carrier control unit (robot 40) or on the part of the movable main stage member 2.

As a result, when the disablement of exchanging the wafers is caused due to problems on the part of the movable main stage member 2, it is decided that the main stage member 2 is currently in the process of operation in response to another global command (e.g. an exposure command), followed by proceeding to step 234 at which a notice of no response to the global command for exchanging wafers (disregarding the command) is given to the minicomputer 52 and thereafter completing this program without executing the program B (and the program A).

On the other hand, when it is decided at step 232 that the disablement of exchanging the wafers is caused due to the problems on the part of the wafer carrier unit, the decision is further made at step 236 on the basis of the analyzed status information to determine whether the disablement is caused by a simple delay in carrying the wafer through the wafer carrier control unit (in the process of a normal preparation) or by an error. When it is decided that the disablement is due to such a delay, the action is simply to wait for the wafer being carried to a predetermined position and, once the wafer has been carried to the given position, then the actions followed by the first step 200 of the program A are re-executed.

When the decision is made at step 236 that the disablement of the wafers exchanges is caused by an error in the wafer carrier-control unit, it is further decided at step 238 to determine if the error is recoverable. When the error is found recoverable, then the actions followed by the first step 200 of the program A are re-executed in order to wait for an automatic return action in the wafer carrier control unit. When the error is non-recoverable at step 238 to the contrary, then the action proceeds to step 240 at which a notice of the contents of the error in accordance with the result of analysis of the status is given to the minicomputer 52.

In response to this notice, an occurrence of the error is displayed on a display screen 54 as shown in FIG. 3, the action of the wafer carrier control unit is suspended, followed by issuing a demand to assist (an alarm) to the operator. Thereafter, a notice of the termination on error of the global command for exchanging the wafers is given to the minicomputer 52 and the program B (and the program A) are terminated on error.

At step 242 of the program D, on the other hand, the status of the actions in the wafer carrier control unit is analyzed and an alarm information in accordance with the status is prepared, by taking into account the instance where the disablement of the vacuum adsorption of the wafer is caused by abnormality in the source of the original vacuum pressure. Then, at step 244, each of the movable parts of the wafer carrier control unit is emergency stopped in order to ensure security of the wafer and the apparatus. Thereafter, step 240 is executed in the manner as described hereinabove, followed by giving a notice to the minicomputer 52 of the error contents in accordance with the analyzed status. In response to this notice, an occurrence of an error is displayed on the display screen 54 as shown in FIG. 3 and sending an assist demand (an alarm) to the operator. Then, a notice of the termination on error to the global command for exchanging the wafers is given to the minicomputer 52 and the program B (and the program A) is terminated on error.

Turning now to FIG. 9, a description will be made of the action for exchanging wafers by program C. The action for exchanging wafers by the program C includes the work to exchange the exposed wafer loaded on the holder 10 of the movable main stage member 2 for a non-processed wafer held on the carrier arm 42 of the wafer carrier robot 40. At this end, although not shown in FIG. 3, the wafer carrier robot 40 is provided with a weight arm 42 for temporarily holding a wafer at the time of exchanging the wafers, in addition to the carrier arm 42. The weight arm 41 and the carrier arm 42 are structured in a manner as described in FIG. 10. Therefore, a brief description will be made of the structure and the actions of the wafer carrier robot 40 with reference to FIG. 10 before a description is made of the action for exchanging the wafers as shown in FIG. 9.

Figure 10:
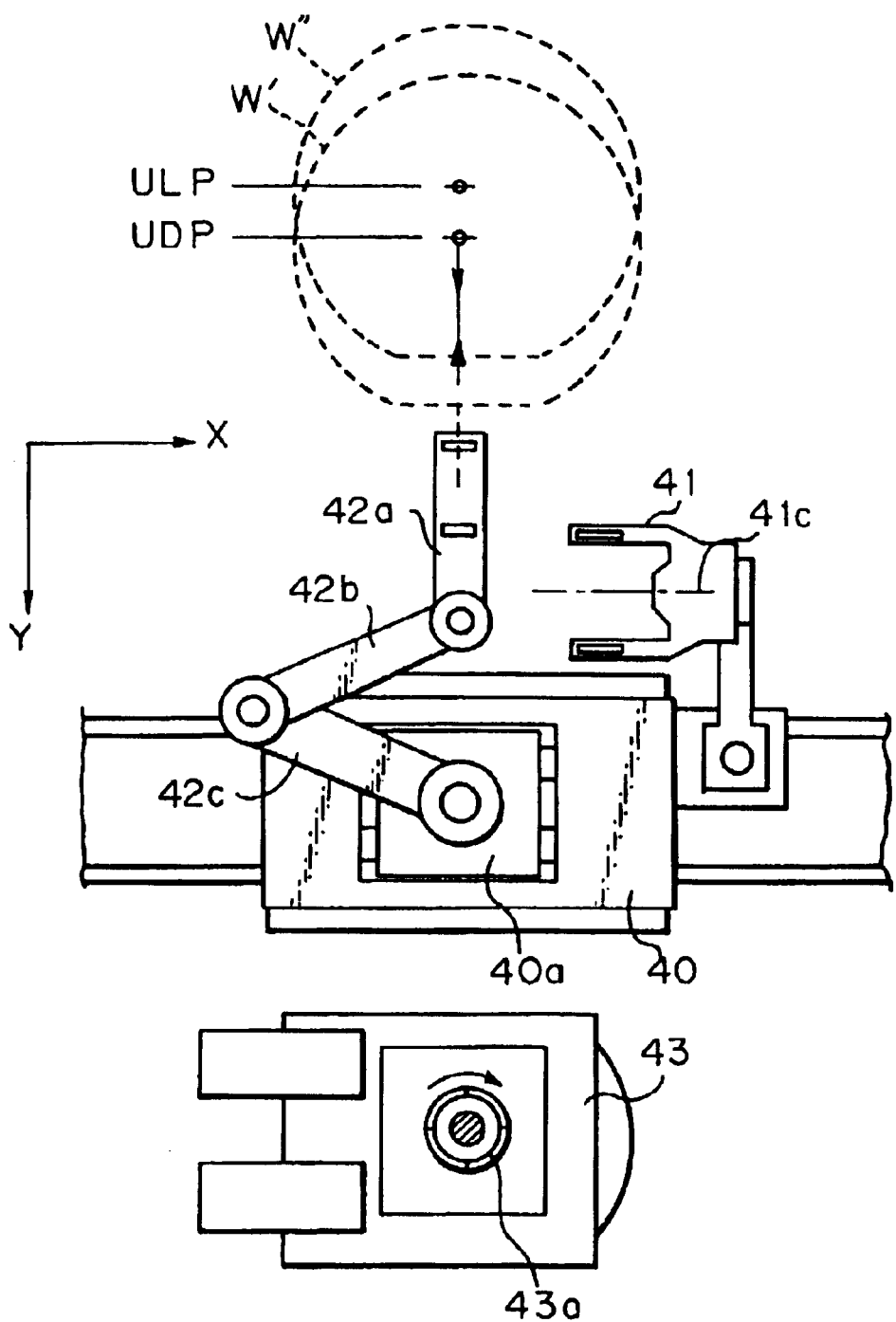
FIG. 10 is a view showing an example of a detailed structure of a wafer carrier robot disposed in the exposure apparatus of FIG. 3.

FIG. 10 shows the wafer carrier robot 40 when looked on the X-Y flat plane. The carrier arm 42 comprises an arm of an articulate type consisting of three arm joints 42a, 42b and 42c. The arm joint 42a disposed at the top of the arm so as to adsorb a wafer is structured such that it moves linearly in the Y-direction by rotating the arm joint 42c with a drive part 40a. Further, in this embodiment, the drive part 40a is in turn structured so as to move upward and downward in the Z-direction (in the direction perpendicular to the surface of this paper) with respect to the main body of the wafer carrier robot 40, thereby enabling a Z-directional movement of the wafer adsorbed on the arm joint 42a.

The main body of the wafer carrier robot 40 is provided with the weight arm 41 that is movable upward and downward in the Z-direction. The weight arm 41 is disposed at a portion of a Y-directionally extending path for carrying a wafer by the arm joint 42a, thereby allowing the wafer in the process of carrying to be temporarily held by vacuum adsorption. The weight arm 41 is so arranged as to move upward and downward in a distance extending between the Z-position higher than the position of the arm joint 42a for carrying the wafer and the Z-position lower than the position thereof.

With the arrangement as described hereinabove, in this embodiment of the present invention, when a non-exposed wafer W' pre-aligned and adsorbed on the arm joint 42a is loaded on the holder 10 of the movable main stage member 2, the arm joint 42a is transferred in the Y-direction until the center of the wafer W' coincides with the loading position LDP. On the other hand, when the exposed wafer W" is detached therefrom, the movable main stage member 2 is aligned so as to allow the center of the wafer W" to coincide with the unloading position ULP.

The reason why the loading position LDP is deviated from the unloading position ULP in the Y-direction is because, as is apparent from the structure as shown in FIG. 6, the pressure-reducing path extending between the adsorption grooves 91 of the holder 10 and the receipt edge orifice 70 is exposed to open air upon lifting the wafer W from the holder 10 at the time of unloading the wafer W therefrom.

On the other hand, the empty weight arm 41 is evacuated to the Z-position so as to fail to interfere with the locus of the transferal of the wafer W' or W" by the Y-directional movement of the arm joint 42a, in this embodiment, to the Z-position lower than the position of the arm joint 42a. Once the weight arm 41 stops in the Z-position that substantially coincides its Y-directional center 41c with the center of the wafer W' or W" in the process of being carried, it receives the wafer from the arm joint 42a by moving upward or downward. Then, the weight arm 41 is evacuated to the Z-position higher than the position of the arm joint 42a.

A pre-alignment mechanism 43 is disposed ahead of the wafer carrier robot 40 having the structure as shown in FIG. 10 for aligning a non-processed wafer W' so as to arrange an orientation flat or a notch thereof in one direction. The non-processed wafer W' is loaded first on a rotary table 43a of the pre-alignment mechanism 43.

Therefore, in instances where plural sheets of wafers are to be exposed one after another, the arm joint 42a delivers the exposed wafer W" on the holder 10 to the weight arm 41 and then the arm joint 42a holds a non-exposed wafer W" on the rotary table 43a and carries it to the loading position LDP. Thereafter, the arm joint 42a carries the exposed wafer W" on the weight arm 41 to a predetermined wafer store position (e.g. a wafer cassette, a carrier transfer position of in-line, etc.) and delivers it thereto. Then, the arm joint 42a receives a non-exposed wafer W' from the wafer store position, followed by carrying it to the rotary table 43a. By repeating the actions in the manner as described hereinabove, a number of wafers are subjected to exposure processing for producing semiconductor elements.

Then, a description will be made of the action for exchanging wafers in accordance with the program C with reference to FIG. 9.

(Step 250)

At step 250, the status information prepared by the control board 51a of the wafer carrier control unit is read and analyzed. The status information includes information on a variation in the position of a wafer being in the process of being carried, the status of the action of each of the drive parts, etc., information representative of the presence or absence of an error at real time and may comprise bit patterns of 32–255 bits or a data table of multiple bytes. Therefore, the CPU in the control board 51a reads the contents of the bit patterns or the data table and analyzes the status of carrying the wafers at this point of time to check whether or not there is a problem with the action of carrying the wafers.

(Step 252)

At step 252, as a result of the analysis of the status, it is decided to determine if the movable main stage member 2 shares its action with the action executed in response to the previous global command for executing the exposure process or the like. When the decision is made that the movable main stage member 2 is in the process of the action in response to the previous global command, on the one hand, then the wafer carrier control unit waits for the termination of the action of the main stage member 2, while returning to step 200 et seq. of the program A as shown in FIG. 7. Once the action of the main stage member 2 has been completed, then the following step 254 is executed.

(Step 254)

At step 254, there is given an instruction (S3) for transferring the main stage member 2 so as to cause the center of the exposed wafer on the holder 10 to be aligned with the unloading position ULP as shown in FIG. 10. The unloading position ULP is located in the position in which the pipe of the receipt edge orifice 70 as shown in FIG. 6 is apart by several millimeters from the front face of the opening portion of the feed edge orifice 84. The next step 256 is executed before the main stage member 2 stops in the unloading position ULP, thereby reading and analyzing the status information in the same manner as at step 250.

(Step 258)

At step 258, it is decided to determine if a wafer is adsorbed on the carrier arm 42 (42a in FIG. 10) on the basis of the analyzed status information. When the decision is made that the wafer is located on the carrier arm 42, the wafer is a non-exposed wafer so that step 260 is executed.

(Step 260)

At step 260, the action to deliver the non-exposed wafer on the carrier arm 42 (42a in FIG. 10) to the weight arm 41 is executed in the manner as described in FIG. 10, and the non-exposed wafer is evacuated temporarily in an upper space of the carrier arm 42. This action is executed while repeating step 256 (reading and analyzing the status information) and step 258 (deciding). When the carrier arm 42 is decided as empty, then step 262 is executed.

(Step 262)

Step 262 sends an instruction (A3) for transferring the arm 42 up to the XY-directional position corresponding to the unloading position in order to receive the exposed wafer stayed in the unloading position ULP.

(Step 264)

At this step, the signal Sp from the pressure sensor 71e in the electromagnetic valve unit 71 as shown in FIG. 6 is read and it is decided to determine if the read value represents the adsorption status. This action is to confirm security upon receipt of the exposed wafer from the holder 10. If the adsorption of the wafer by the holder 10 is found not good at that point of time, it is anticipated that the exposed wafer is deviated largely on the holder 10. In this case, if the exposed wafer would be unloaded as it is, there is the risk that the wafer may strike against the apparatus part in the vicinity of the wafer carrier path. Thus, when it is decided at step 264 that the signal Sp fails to represent the adsorption status, the action is emergency stopped by executing the program D (an error process). On the other hand, when the decision is made to the effect that the adsorption status is normal, then step 266 is executed.

(Step 266)

At step 266, the signal SV2 for opening the electromagnetic valve 71a is sent to the drive part 71b as shown in FIG. 6. When the main stage member 2 is located in the unloading position, the pipe of the receipt edge orifice 70 exists in the position in which it is exposed to open air. Thus, by opening the electromagnetic valve 71a, the vacuum pressure-reducing path (the closed space part) extending from the adsorption grooves 91 of the holder 10 to the receipt edge orifice 70 and the inner space of the reserve tank 72 are both exposed to open air. At this instance, the adsorption force of the holder 10 is released by some delay by the action of the variable restricting valve 71c, so that a timer is executed at step 268 with the expectation of such a delay (1 second or shorter), thereby giving a predetermined waiting time.

(Step 270)

After the waiting time by the timer has elapsed, the value of the signal Sp is read again and it is decided to determine if the read value is substantially equal to the atmospheric pressure (if the effective adsorption force has been lost). If the decision is made herein that it does not become the atmospheric pressure or it is substantially equal to the vacuum pressure, it is decided that an error occurs, followed by executing the program D (an error process). If the value is equal to the atmospheric pressure of open air, the following step 272 is executed.

(Step 272)

Step 272 sends to the wafer carrier robot 40 a transfer instruction for transferring the carrier arm 42 (42a) to receive the exposed wafer on the holder 10, followed by sending a transfer instruction for transferring the carrier arm 42 to the evacuation position in which it is evacuated, such as the position of the wafer cassette, etc. This allows the exposed wafer on the carrier arm 42 to be delivered in the evacuation position and the carrier arm 42 to be made empty, followed by executing the next step.

(Step 274)

At step 274, the action is executed for the carrier arm 42 to receive the non-exposed wafer located temporarily on the weight arm 41. At this time, the arm joint 42a is transferred to the position along the side of the weight arm 41, followed by delivering a non-exposed wafer to the arm joint 42a by transferring the weight arm 41 downward.

(Step 276)

Step 276 executes the reading and the analysis of the status information in order to decide whether the non-exposed wafer has been delivered to the carrier arm 42 in a correct way.

(Step 278)

When it is decided at step 276 that the non-exposed wafer has been loaded on the arm joint 42a in a correct way on the basis of the analyzed status information, program F (loading processes from step 204 et seq.) as shown in FIG. 7 is executed under the conditions that the exposed wafer has been unloaded normally. On the other hand, if it is decided that the unloading has not been implemented normally due to a failure on the part of the analyzed status information, then the error processing by the program D as shown in FIG. 8 is executed.

As described hereinabove, each action of carrying, exchanging and adsorbing plural wafers for the exposure processing can be practiced continually in accordance with the flowcharts as shown in FIGS. 7 to 9. Therefore, an unmanned automatic operation for producing semiconductors can be implemented over the entire period of time of full 24 hours, unless a serious error in the exposure apparatus would otherwise be caused to occur.

Now, a description will be made of an example of an adsorption monitor program G with reference to a flowchart of FIG. 11. The program G is executed by the interrupt process by the CPU in the control board 51a of the wafer carrier control unit. It is needless to say, however, that the program G can be likewise implemented by replacing its own functions with hardware.

As described previously in connection with step 22 of FIG. 7, the adsorption monitor program G is started by storing the signal Sp immediately after the adsorption of the wafer on the holder 10 and resetting the timer to zero (start of clocking from zero). Further, it is in advance set in which mode the monitor program G is executed, a timer mode or a trigger mode. In the timer mode, the program G is so set as to be executed by issuing an interrupt signal whenever the timer counts, for example, for every 0.2 second.

An interval of issuing the interrupt signal (an monitoring interval) may be set in an optional time length in accordance with the extent of flatness of the rear surface of a wafer to be adsorbed on the holder 10 or the possibility of adsorption of fine particles thereon. For instance, when a first layer of a circuit pattern is to be transcribed on a wafer, the extent of flatness on the rear surface of the wafer is so favorable that the monitoring interval may be set to be relatively long, for example, for several seconds. On the other hand, as a heat processed wafer may be poor in surface flatness and may cause some leakage at the time of vacuum adsorption, the monitoring interval may be usually set to be shorter. In other words, the monitoring interval may be varied in accordance with the processing by which the wafers are to be processed, thereby enabling an optimal adsorption monitoring.

On the other hand, in a trigger mode, the interrupt signal for executing the monitor program G may be issued whenever a drive command is given to a drive motor (e.g. linear motors 63, 66, etc. of FIG. 5) of the movable main stage member 2 or whenever the drive command is terminated upon cessation of the movement of the main stage member 2, that is, at every time immediately after acceleration or deceleration during the movement of the main stage member 2. This trigger mode is useful in instances where the leak status of adsorption varies to a great extent due to a minute movement of the wafer on the holder 10 by a great extent of acceleration to be caused on the part of the main stage member 2.

When either of the such two modes is set in the manner as described hereinabove, the interrupt signal for monitoring the wafer adsorption is issued at every predetermined time in either case. In response to the interrupt signal, the monitor program G executes each step of FIG. 11.

(Step 300)

At step 300, the signal Sp from the pressure sensor 71e as shown in FIG. 6 and a time Tp counted by a timer are read, followed by storing and accumulating the read values in a monitor history memory.

(Step 302)

Step 302 decides to determine whether the value of the read signal Sp is greater than a predetermined tolerance value E2. It is to be noted herein that the tolerance value E2 is set as a value at which a wafer may most probably cause deviating from its loaded position at the time when the adsorption force of adsorbing the wafer on the holder 10 is decreased considerably and the main stage member 2 is accelerated or decelerated. In this embodiment, a tolerance value E1 is set which is located in a range of imparting a nominal adsorption force on the apparatus specification, in addition to a tolerance value E1 as a decision reference for the adsorption monitoring.

Figure 12:
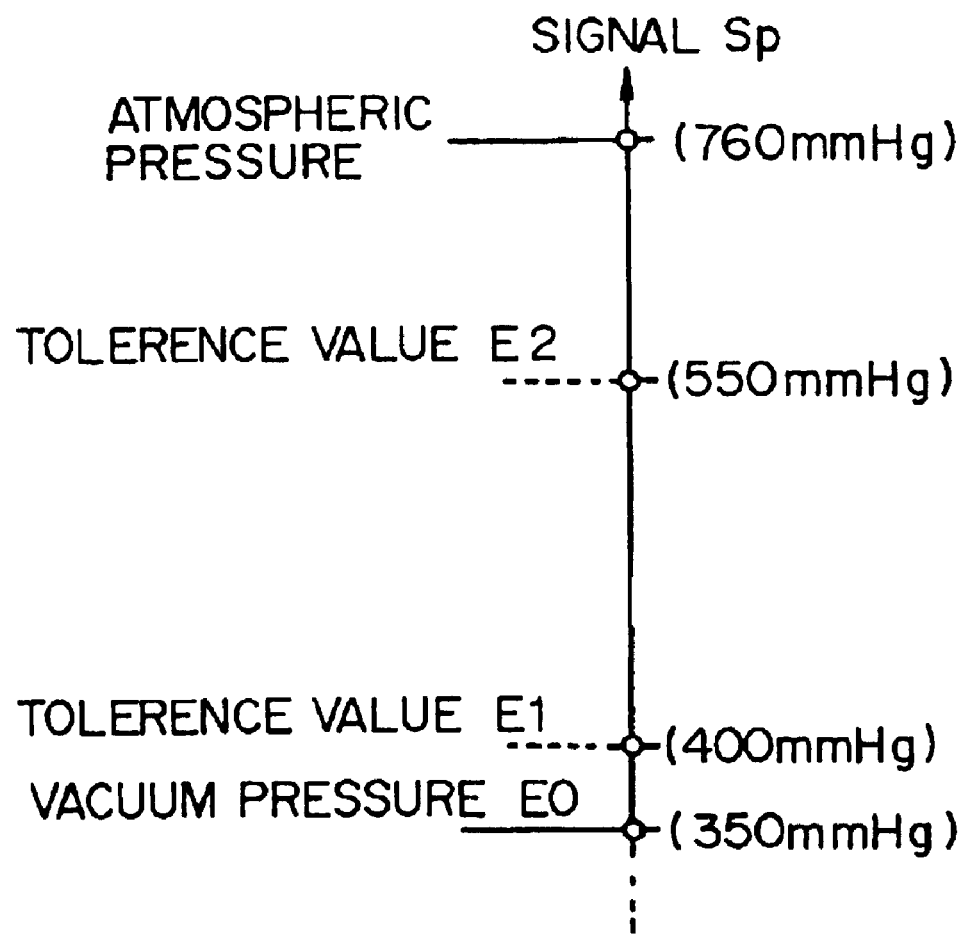
FIG. 12 is a graph showing the relationship among tolerance values of vacuum pressure to be decided by the adsorption monitor program.

The manner will be briefly described with reference to FIG. 12. When the original vacuum pressure is set to E0 (e.g. 350 mmHg), the range capable of ensuring the nominal adsorption force is a tolerance value E1 (e.g. 400 mmHg) and the range in which the adsorption force is substantially lost is a tolerance value E2 (e.g. 600 mmHg). Therefore, the time required for the adsorption force exceeding its security scope can be predicted readily by measuring a periodical variation in the signal Sp (a pressure-reducing value) using such a decision reference.

When it is decided herein that the signal Sp is greater than the tolerance value E2, step 304 is executed as a serious risk has been caused to occur in connection with the adsorption of the wafer. On the other hand, if the signal Sp is decided as being lower than the tolerance value E2, then step 306 is executed.

(Step 304)

At step 304, an alarm information of level 1 is issued in order to give a notice to the minicomputer 52 to the effect that a failure of adsorption is serious upon operation of the apparatus. This is displayed on the display screen 54 or a light. Thereafter, the apparatus is emergency suspended by executing the program D as shown in FIG. 8.

(Step 306)

Step 306 is to calculate a latest change ratio $\Delta Pn$ (in mmHg/second or mmHg/minute) of the adsorption pressure on the basis of each of the values of the signal Sp and the time Tp accumulated in the monitor history memory. The results of computation are stored.

(Step 308)

At step 308, a prediction time Te1 and a prediction time Te2 are computed on the computed change ratio $\Delta Pn$ (in mmHg/second or mmHg/minute) of the adsorption pressure. The prediction time Te1 is a time for which the adsorption pressure reaches the tolerance value E1 from the current point of time and the prediction time Te2 is a time for which the adsorption pressure reaches the tolerance value E2 from the current point of time. The values of the prediction times Te1 and Te2 are stored.

(Step 310)

At step 310, it is decided to determine if the value of the signal Sp read at step 300 is greater than the tolerance value E1, that is, if the adsorption force of the wafer on the holder 10 is sustained within the nominal scope. When the decision is made that the adsorption force is outside the nominal scope, on the one hand, step 312 is executed. When it is decided that the adsorption force is within the nominal scope, on the other hand, step 316 is executed.

(Step 312)

At step 312, a comparison is made between an average exposure process time TS for the adsorbed wafer and the prediction time Te2 computed at step 308. The average exposure process time TS is strictly an average residual time that is left from the current time up to the release of the wafer adsorption action. If the prediction Te2 is decided as being smaller than the average exposure process time TS, then step 314 is executed. On the other hand, if the prediction Te2 is decided as being greater than the average exposure process time TS, then step 328 is executed.

(Step 314)

This step is to form an alarm information of level 2 for giving a notice to the minicomputer 52 to the effect that the intact continuation of the exposure processing may cause a problem because the prediction time Te2 during which a wafer can be adsorbed is shorter than the average exposure process time TS up to the removal of the wafer from the holder 10 after the exposure action onto the entire shot areas on the wafer has been finished. This is displayed on the display screen 54 or the pat light. Thereafter, the program D as shown in FIG. 8 is executed to emergency stop the apparatus.

(Step 316)

At step 316, the decision is made to determine if the prediction time Te1 capable of sustaining the nominal adsorption force is longer than the average residual process time TS for the exposure process. When the prediction time Te1 is decided to be longer than or equal to the average exposure time (Te1≧TS), the interrupt process by the program G is finished normally as it is decided that the wafer can be continued to be adsorbed with safety during the exposure process. If the decision is made that Te1≧TS is false, then step 318 is executed.

(Step 318)

It is decided at step 318 to determine whether the wafer on the holder 10 is re-adsorbed by the original vacuum pressure by once returning the main stage member 2 to the loading position. That a sheet of a wafer is re-adsorbed during the exposure process for the wafer may cause some problems form the accuracy point of view in the lithography process. At the time of re-adsorption, the wafer on the holder 10 may cause deviating from its position to a minute extent and as a consequence an alignment accuracy (an accuracy in superimposition) may cause deteriorating to a great extent after resuming the exposure process. Therefore, in usual cases, step 314 is executed as it is decided that no re-adsorption is implemented at this step (issuance of the alarm information of level 2 and emergency stop of the apparatus).

However, in instances where the exposure process is resumed after the implementation of the accurate alignment action for detecting the mark on the wafer after re-adsorption, no problems may be caused even if the re-adsorption action would be resumed. Thus, when the execution of re-adsorption is specified, the next step 320 is executed.

(Step 320)

At step 320, it is decided to determine if the number of times for adsorption to be set for one sheet of a wafer during the exposure process is m times. As the times m is 1 in usual cases, it is also possible to set the greater number of the times by the instruction by the operator. Therefore, in instances where m is set to 1, step 314 (issuance of the alarm information of level 2, emergency stop of the apparatus) is executed as it is decided that m=1 is true if the action of re-adsorption has been executed once before. However, the next step 322 is executed when the re-adsorption action is implemented for the first time.

(Step 322)

Step 322 is to form an alarm information of level 3 representative of an occurrence of a deviation in the position of the wafer by implementing the re-adsorption action of the wafer. The alarm information of level 3 is given to the minicomputer 52 and gives an instruction of the interrupt of the exposure action. This alarm information is displayed on the display screen 54 and stored in database of an error log as the case may be. At this time, the interrupt of the exposure action is executed at the time when the exposure to the shot area in the process at this point of time has been finished and then the map position of the shot area to be exposed next has been stored.

(Step 324)

At step 324, as described above in connection with the program A of FIG. 7, the main stage member 2 is aligned with the loading position LDP (referring to FIG. 10) and the electromagnetic valves 81a and 71a are released in this order by sending the signals SV1 and SV2, respectively, after the pipe of the receipt edge orifice 70 has been connected to the opening part of the feed edge orifice 84. If the order of releasing the electromagnetic valves 81a and 71a is inverted, the vacuum pressure-reducing path in the holder 10 becomes instantly in a greatly leaking state, thereby facilitating the deviation in the position of the wafer. Thereafter, the signal Sp from the pressure sensor 71e is confirmed, thereby closing the electromagnetic valves 71a and 81a and giving a notice of completing the re-adsorption to the minicomputer 52. In response to this notice, the minicomputer 52 resumes the exposure process (alignment action) and starts the exposure action from the next shot area stored.

(Step 326)

Step 326 stores the value of the signal Sp as an initial value in the monitor history memory and resets the count time of the timer to zero, likewise at step 326 as shown in FIG. 7, thereby finishing the interrupt process of the program G.

If it is decided at step 312 that Te2≧TS is true, it means that although the wafer adsorption is sustained not with a nominal adsorption force, it is temporarily sustained up to the end of the residual time TS of the exposure process. Therefore, the next step 328 is executed because an anxiety about the occurrence of the deviation in the position of the wafer is left.

(Step 328)

At step 328, it is decided to determine if the re-adsorption is to be made likewise at step 318. However, the necessity of the re-adsorption action to be effected is not so high in this case under such a situation that comes to this. Thus, the re-adsorption action can be disregarded, followed by proceeding to the next step 330. Even if Te2≧TS would be true, the re-adsorption is obliged to be made by an error of the prediction time Te2 upon the exposure to the shot area around the end of the exposure process when the absolute value of the residual time TS of the exposure process is great.

At this step, data of the change ratio $\Delta Pn$ of the past adsorption pressure accumulated in the monitor history memory is called and a detailed prediction investigation is effected on the data by computing a transfer average, function approximation, etc. thereof. It is then decided from the result to determine if the re-adsorption is required or not. Therefore, on the one hand, when the re-adsorption is decided as necessary, the action following the previous step 322 is executed. On the other hand, when it is decided that the re-adsorption is unnecessary, then the next step 330 is executed.

(Step 330)

This step is to form an alarm information of level 4 representative of the fact that the temporary adsorption is sustained up to the completion of the exposure process, although there is some anxiety about a decrease in the adsorption force of the wafer. This information is reported to the minicomputer 52 and the interrupt process of the program G is terminated.

Although a series of the actions of the monitor program G has been completed in the manner as described hereinabove, the alarm of level 4 is formed in accordance with the monitor program in this embodiment. The alarm is regarded as a serious error as the level becomes smaller and as a light error as the level becomes greater. The functions of the monitor program G can be configured by simple hardware in the manner as previously described. Alarm information of various kinds can be issued in accordance with a variation in the adsorption force of the wafer, for example, by disposing two comparators for comparing the analog voltage of the signal Sp with the reference voltage corresponding each to the tolerance values E1 and E2 and digitally computing 2-value signals issued by an appropriate logic circuit from each of the two comparators.

Figure 13:
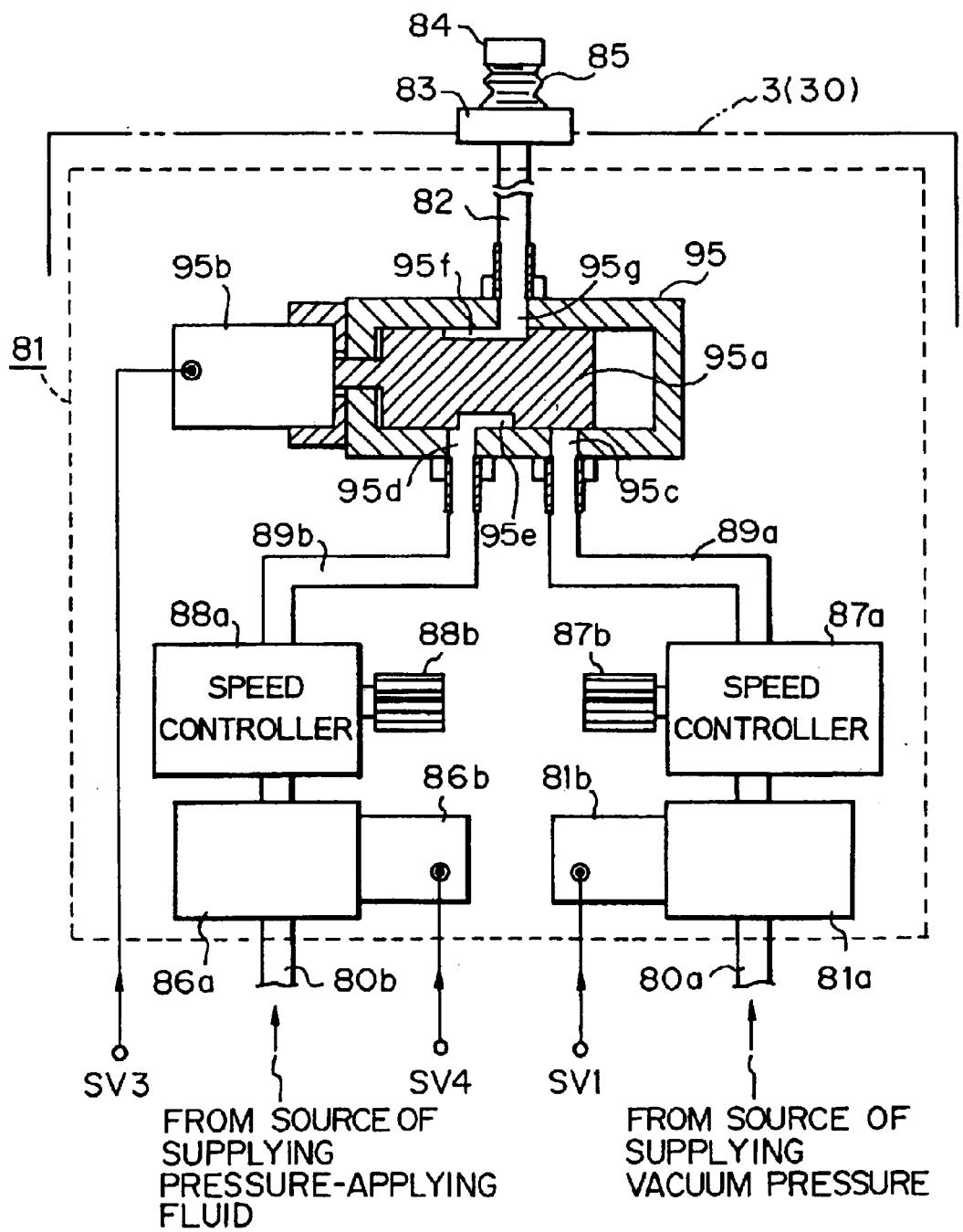
FIG. 13 is a block diagram showing the structure of a fluid supply system in accordance with a third embodiment of the present invention.

Then, a description will be made of the structure of a stage apparatus according to a third embodiment of the present invention, with reference to FIG. 13. FIG. 13 shows an embodiment of a variation in a fluid supply control system 81 on the apparatus column 30 side as shown in FIGS. 5 and 6. In this embodiment, the great features reside in the structures that, upon removal of the wafer W from the holder 10, the electromagnetic valve 71a on the main stage member 2 side is opened to communicate the receipt edge orifice 70 with open air and the wafer W is caused to float instantly by a minute length (several microns or smaller) positively from the surface of the holder 10.

In FIG. 13, the same structuring parts as shown in FIG. 6 are provided with the identical reference numerals and symbols, which include an electromagnetic valve 81a, a drive part 81b, a signal SV1, a tube 82, a fixing member 83, a feed edge orifice 84 and a bellows 85. The original vacuum pressure from the source for supplying the pressure-reducing fluid for vacuum adsorption is led to the feed edge orifice 84 through a tube 80a, the electromagnetic valve 81a, a variable restricting valve 87a (which is the same flow speed controller as the valve 71c shown in FIG. 6), a tube 89a, an electromagnetic valve 95 for switching paths and the tube 82. Likewise, a pressure-applying fluid from a source for supplying compressed fluid for causing the wafer W to float instantly is led to the feed edge orifice 84 via a tube 80b, an electromagnetic valve 86a, a variable restricting valve 88a (which is the same flow speed controller as the valve 71c shown in FIG. 6), a tube 89b, an electromagnetic valve 95 for switching flow paths and the tube 82.

The electromagnetic valve 86a switches the opening and the closing of the flow path in response to a signal SV4 to the drive part 86b, and the variable restricting valves 87a and 88a adjust the flow amount of each fluid by adjusting controls 87b and 88b, respectively. To the electromagnetic valve 95 are connected a drive part 95b for transferring a piston 95a in a reciprocating manner in response to a switching signal SV3, an input port 95c to be connected to a tube 89a for vacuum pressure, an input port 95d to be connected to a tube 89b for pressure-applying fluid, and an output port 95g to be connected to the tube 82 for leading the fluid to the feed edge orifice 84.

The piston 95a of the electromagnetic valve 95 may be molded in a columnar form as a whole and special cavity portions 95 and 95f are formed at its central part. The cavity portions 95e and 95f are cut each to a predetermined depth along the circumferential surface of the piston 95a and the width of the cavity portion 95e in the transferring direction of the piston is set so as to be smaller than a distance between the input ports 95c and 95d, while the width of the cavity portion 95f in the transferring direction of the piston is set so as to always face the output port 95g in the range of transferal of the piston 95a.

Therefore, the input port 95c is tightly closed at the tip portion of the piston 95a in the position of the piston 95a as shown in FIG. 13, thereby leading the pressure-applying fluid from the input port 95d through the cavity portions 95e and 95f to the output port 95g and supplying the pressure-applying fluid through the feed edge orifice 84 to the receipt edge orifice 70 on the main stage member 2 side. Also, when the piston 95a is switched from the position as shown in the drawing toward the rightward direction, the input port 95d is tightly closed at the rear end portion of the piston 95a, thereby leading the pressure-reducing fluid from the input port 95c through the cavity portions 95e and 95f to the output port 95g and supplying the vacuum pressure through the feed edge orifice 84 to the receipt edge orifice 70 on the main stage member 2 side.

In the structure as described hereinabove, although the variable restricting valves 87a and 88a are not particularly needed, it is preferred that they are disposed in order to minutely adjust the optimal adsorption action of the wafer W by the holder 10 and the optimal floating amount of the wafer W at the time of releasing the adsorption. In this embodiment, the removal of the wafer W from the holder 10 can be implemented in a smooth way by sending a signal SV1 for controlling the opening or closing of the electromagnetic valve 81a, the signal SV4 for controlling the opening or closing of the electromagnetic valve 86a, a signal SV3 for controlling the switching of the electromagnetic valve 95 and a signal SV2 for controlling the opening or closing of the electromagnetic valve 71a on the main stage member 2 side as shown in FIG. 6 each at a precise timing.

Figure 14:
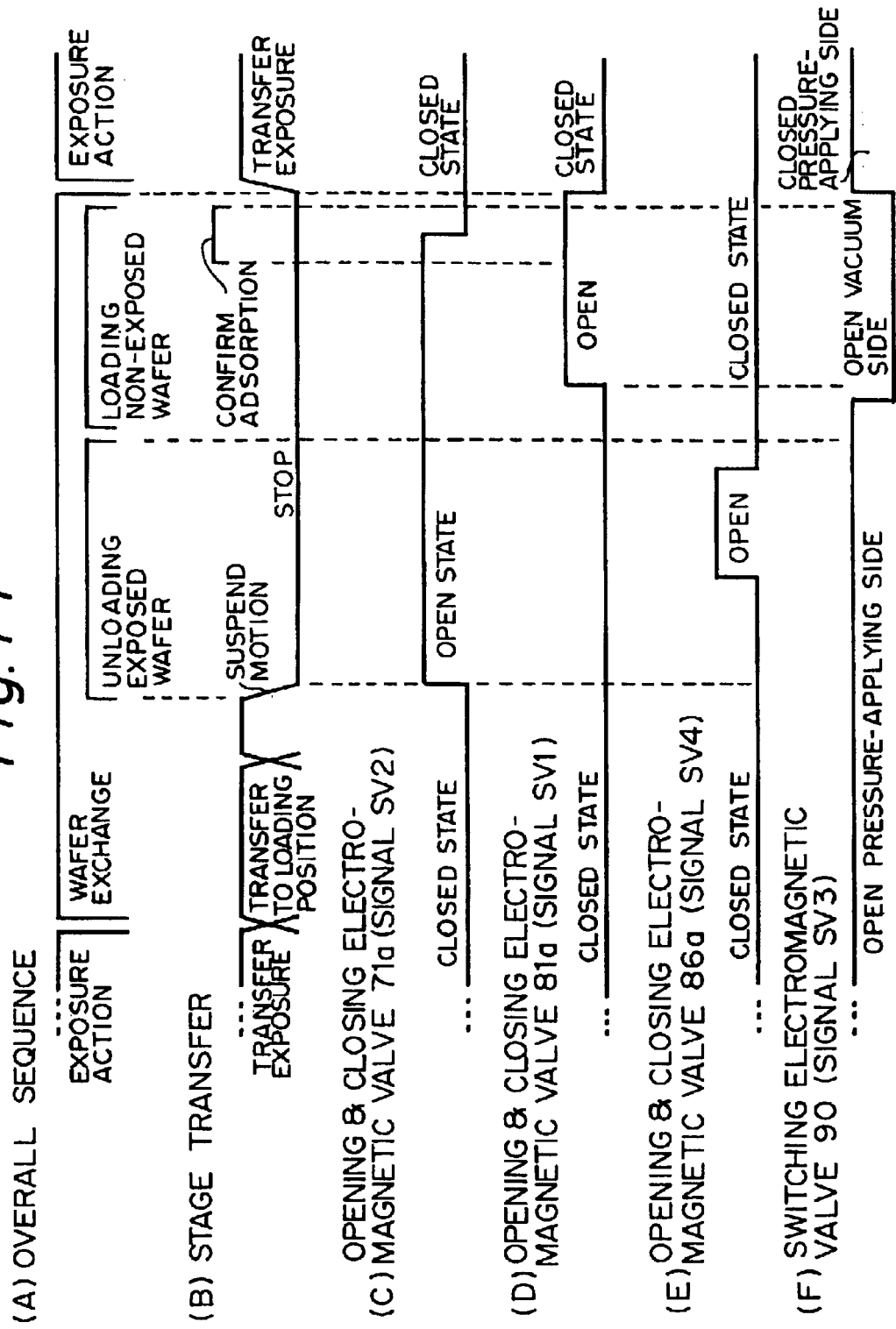
FIG. 14 is a time chart for describing an example of a sequence of the wafer exchanging action when the system of FIG. 13 is applied to the exposure apparatus of FIG. 5.

Then, a description will be made of the actions of the apparatus when the fluid supply system 81 with the structure as shown in FIG. 13 is combined with the projection exposure apparatus as shown in FIG. 5. In this embodiment, each action for carrying and exchanging wafers is carried out basically in substantially the same manner according to the flowcharts as shown in FIGS. 7–9. This embodiment, however, offers the advantage that it is not necessary to deviate the loading position LDP from the unloading position ULP as shown in FIG. 10 and the loading position LDP can coincide with the unloading position ULP. Therefore, the following is a description of a portion relating to the adsorption action for adsorbing the wafer to the holder 10 and the adsorption release action for releasing the adsorption of the wafer therefrom with reference to a time chart as shown in FIG. 14.

In an overall sequence of the actions of the exposure apparatus as shown in FIG. 14(A), after the exposure action to a wafer being carried ahead has been finished, the work for exchanging wafers is executed and the exposure action of a new wafer is to be started. In correspondence to the sequence timing of FIG. 14(A), FIG. 14(B) indicates a transfer sequence of the main stage member 2, FIGS. 14(C), 14(D) and 14(E) indicate opening and closing sequences of the electromagnetic valves 71a, 81a and 86a, respectively, and FIG. 14(F) indicates a switching sequence of the electromagnetic valve 95.

First, until the exposure action of the wafer being carried ahead has been finished, i.e. until the exposure process of the last shot area has been completed, each of the electromagnetic valves 71a, 81a and 86a is set in a closed state of closing the flow path and the electromagnetic valve 95 is set so as for the piston 95a to be located on the left-hand side (opening the pressure-applying side), as shown in FIG. 13, so as to communicate the tube 89a on the pressure-applying side with the feed edge orifice 84.

Turning now to the overall sequence, as the exposure action of the wafer being carried ahead has been completed, the minicomputer 52 sends a global command for exchanging the wafers. In response to this command, the main stage member 2 is transferred at a high speed toward nearby the loading position. When the receipt edge orifice 70 comes close to and faces the feed edge orifice 84 in the distance apart by several millimeters, then the main stage member 2 is minutely moved so as to allow the pipe of the receipt edge orifice 70 to insert into the opening portion of the feed edge orifice 84 and then to stop.

Immediately thereafter, the electromagnetic valve 71*a* responds to the signal SV2 and switches to an open state, thereby initiating the unloading of the exposed wafer by the wafer carrier robot 40. In the unloading action, the electromagnetic valve 86*a* is allowed to be opened for a predetermined time in response to the signal SV4 at the timing of detaching the exposed wafer from the holder 10, thereby leading the pressure-applying fluid to the path extending between the reserve tank 72 and the adsorption grooves 91 of FIG. 6 instantly. This causes the adsorption force between the loading surface of the holder 10 and the exposed wafer to suddenly disappear in the path and the wafer is caused to float slightly (e.g. as slightly much as several microns) from the loading surface thereof by the pressure-applying fluid blown from the adsorption grooves 91. Therefore, the carrier arm 42 of the wafer carrier robot 40 can receive the exposed wafer on the holder 10 in an extremely smooth manner.

If the flow of the pressure-applying fluid from the loading surface of the holder 10 is too strong, then the wafer may swing on the holder 10. Thus, in order to adjust the flow amount of the pressure-applying fluid to an optimal level, the variable restricting valve 88*a* of FIG. 13 is disposed to adjust the flow amount thereof.

As the exposed wafer has been unloaded from the loading surface of the holder 10, the electromagnetic valve 86*a* is returned to the closed state while the space extending from the adsorption grooves 91 to the reserve tank 72 is allowed to be opened to the atmosphere. Thereafter, when a non-exposed wafer enters an upper space over the holder 10 while being loaded, the electromagnetic valve 95 is switched so as to open the vacuum side (the piston 95*a* being located on the right-hand side) in response to the signal SV3 at an appropriate timing and the electromagnetic valve 81*a* is switched to the open state immediately before the rear surface of the non-exposed wafer is loaded on the loading surface of the holder 10.

These operations allow a supply of the pressure-reducing fluid from the source of the original vacuum pressure to the closed space portion (the pressure-reducing path) extending from the reserve tank 72 to the adsorption grooves 91, thereby vacuum adsorbing the non-exposed wafer on the fine projection parts 90 formed in the loading surface of the holder 10. And, the action for confirming the adsorption by reading the signal Sp from the pressure sensor 71*e* is started while both the electromagnetic valves 71*a* and 81*a* are opened, and it is then decided to determine if the read value becomes close to the original vacuum pressure. When the value of the signal Sp is decided as being close to the original vacuum pressure, then the electromagnetic valve 71*a* is switched to the closed state as it is decided that no serious leakage is caused. Immediately thereafter, the action for confirming the adsorption is re-executed, followed by deciding to determine if the vacuum pressure is being worsened rapidly.

When it is decided as a result that the vacuum pressure is not caused to be worsened rapidly, then the electromagnetic valve 81*a* is switched to the closed state and the electromagnetic valve 95 is switched so as to be opened to the pressure-applying side. By switching the electromagnetic valve 81*a* to the closed state, the overall sequence of the actions of exchanging the wafers is completed, thereby initiating the transfer of the main stage member 2 from the loading position for executing the exposure action.

As described hereinabove, this embodiment enables setting the loading position LDP and the unloading position ULP to the identical position as well as adsorbing and holding the wafer on the holder 10 in a tight contact state immediately before detaching therefrom by causing the wafer to float by means of the pressure-applying fluid upon removal of the wafer from the holder 10. These operations assist in reducing a deviation in the position of the wafer upon delivery of the wafer to the carrier arm, etc. and enable a stabler carrying of the wafer.

Figure 15:
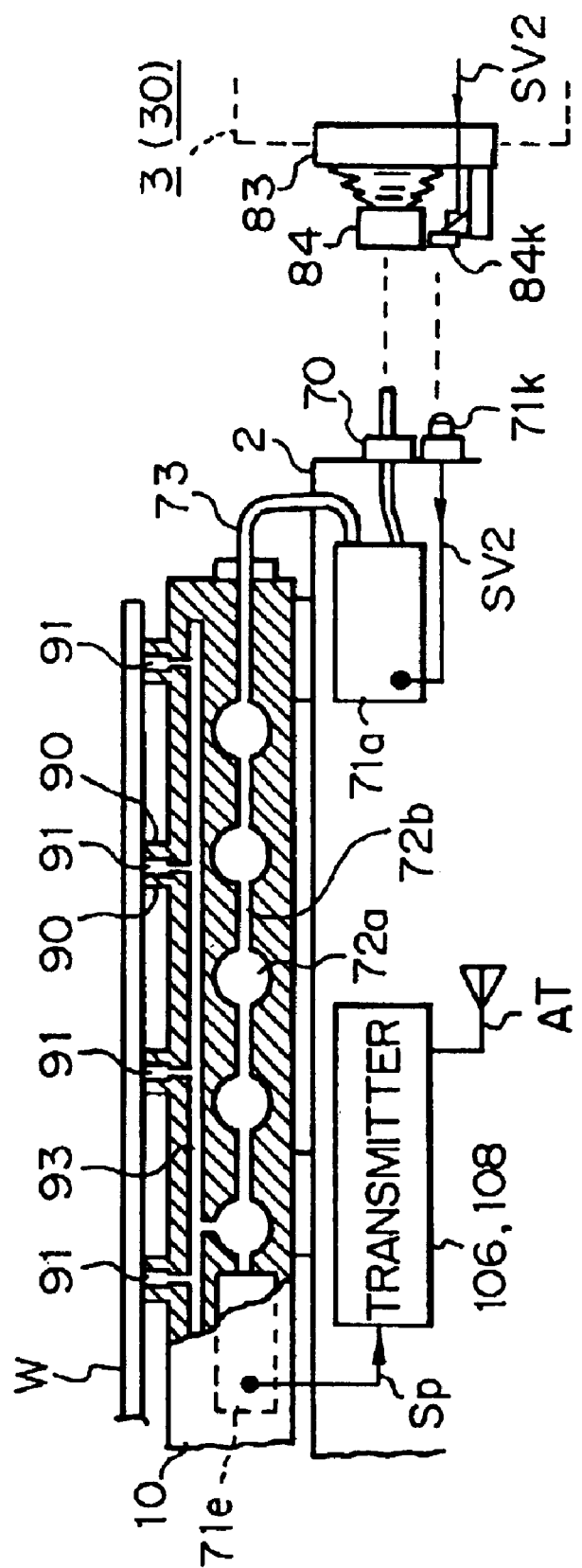
FIG. 15 is a partially sectional view showing the structure of a movable stage apparatus in accordance with a fourth embodiment of the present invention.

Now, a description will turn to the structure of the apparatus in accordance with a fourth embodiment of the present invention with reference to FIG. 15. In this embodiment, the feature resides in that the functions of the reserve tank 72 as shown in FIGS. 5 and 6 are disposed inside the wafer holder 10. FIG. 15 shows a partial section of the holder 10 mounted on the main stage member 2 and a portion in the vicinity of the feed edge orifice 84 on the side of the base table 3 (or the apparatus column 30). In FIG. 15, the structuring members having the identical functions as those as shown in FIGS. 5 and 6 or 13 are provided with the identical reference numerals and symbols.

As shown in FIG. 15, there are formed the adsorption grooves 91 enclosed by a plurality of the fine projection parts 90 formed separately from each other on the surface of the holder 10, as shown in FIG. 6. Each of the adsorption grooves 91 is communicating with the air path 93 formed inside the holder 10. Further, a plurality of sphere-shaped or column-shaped tank chambers 72*a* are disposed communicating with each other through an air path 72*b*. The tank chambers 72*a* can function in substantially the same manner as the reserve tank 72 as described hereinabove in connection with FIGS. 5 and 6. A portion of each of the tank chambers 72*a* is communicated with the air path 93 and supplements a slight amount of the pressure-reducing fluid lost by leaking from a portion of the fluid path between the rear surface of the wafer W and the surfaces of the fine projection parts 90, thereby elongating the time for sustaining the adsorption of the wafer.

The holder 10 is mounted on the upper part of the main stage member 2 and the air path 72*b* communicating with the tank chamber 72*a* is connected to the tube 73 on the side portion of the main stage member 2. The other end of the tube 73 is in turn connected to the electromagnetic valve 71*a* disposed on the holder 10. The electromagnetic valve 71*a* is disposed to open and close a path between the receipt edge orifice 70 disposed on the side end portion of the main stage member 2 and the tube 73, and the signal SV2 for the opening and closing action is transmitted to a feed terminal part 84*k* on the side of the base table 3 (or the apparatus column 30) through a receiving terminal part 71*k* formed in the vicinity of the receipt edge orifice 70.

Moreover, the holder 10 is provided therein with the pressure sensor (semiconductor pressure sensor) 71*e* connected to the air path 72*b*. The detection signal Sp from the pressure sensor 71*e* is sent as electric wave through an antenna AT by a wireless transmitter (a transmitter consisting of the RFC 106, the digital converter 108, etc. in FIG. 2) disposed in the main stage member 2.

On the other hand, the fixing member 83 on the side of the base table 3 (or the apparatus column 30) is provided with the feed edge orifice 84 through the bellows, and a bottom portion of the feed edge orifice 84 is provided with the feed terminal part 84*k* for sending the signal SV2 so as to be expandable in accordance with a predetermined biasing force. Further, in this embodiment, the feed edge orifice 84 is formed with an opening part that allows an insertion of the pipe of the receipt edge orifice 70 in a tight engagement state. To the feed edge orifice 84 is connected the fluid supply system 81 as shown in FIG. 13, thereby enabling the shift between a supply of the pressure-reducing fluid for effecting the vacuum adsorption and a supply of the pressure-applying fluid for releasing the adsorption.

With the arrangement, generally, the holder 10 is made of aluminum or ceramic material and its thickness is not so thick. Therefore, in order to form the tank chamber 72*a* in the holder 10, the solid shape may be preferably formed as a basic structure in a sphere shape or a column shape, which is unlikely to cause transformation in the holder 10. The such solid shape of the holder 10 can offer the advantages that transformation can be minimized when the pressure in the tank chamber 72*a* is reduced and that the flatness of the adsorbing surface of the holder 10 (the surface defined by the surfaces of the plural projection parts 90) may not be worsened.

Although the tank chambers 72*a* are preferably provided plurally so as to communicate them with each other by the air paths 72*b*, the tank chamber 72*a* is comprised of a single body. When the plural numbers of the tank chambers 72*a* are provided, they are disposed separately in substantially equal intervals in the inside of the holder 10. As an example, they may be disposed plurally at substantially equal intervals in the circumferential direction on the radii apart equally from the center of the holder 10.

With the arrangement as described hereinabove, the release of adsorption of the exposed wafer from the holder 10 and the adsorption of a non-exposed wafer are implemented by the fluid supply system 81 as shown in FIG. 13. Thus, as shown in FIG. 14, the main stage member 2 is stayed in the loading position during the work for exchanging wafers. During the wafer exchanging work, the receiving terminal part 71*k* and the feed terminal part 84*k*, which receives and sends the signal SV2 for opening and closing the electromagnetic valve 71*a*, respectively, are always in a connected state, thereby enabling the execution of the actions of FIG. 14 as they are.

Furthermore, in this embodiment, although not shown in FIG. 15, the battery 100 as shown in FIG. 2 can be loaded on the main stage member 2 as a power source for the wireless transmitters (106, 108). In this case, as the consumption of electrical power by the transmitters (106, 108) is very small so that a battery of a small capacity may be selected as the battery 100. This structure can omit the electric wiring leading otherwise the signal Sp from the pressure sensor 71*e* from the main stage member 2 to the control rack 50 (see FIG. 3). With this arrangement, the electric wave to be transmitted from the transmitters (106, 108) is received by a receiver in the control rack 50, thereby converting it into the original analog signal Sp and employing it for the program A for exchanging the wafers, the program G for monitoring the adsorption of the wafer, etc.

In the embodiment, as described hereinabove, the tank chambers 72*a* are disposed in the holder 10 with the purpose to lengthen the period of time for adsorption of the wafer on the holder 10. The tank chambers 72*a* can expand the effective volume of the closed space part for adsorption under reduced pressure, thereby enabling a self-sustaining adsorption of the wafer over a considerably long period of time. Moreover, in this embodiment, as a space is formed by the tank chamber 72*a* in the holder 10, the holder 10 itself may be made lightweight by approximately 10% to 30%.

Then, a description will be made of the structure of the apparatus in accordance with a fifth embodiment of the present invention with reference to FIG. 16. The fifth embodiment is directed to a vacuum adsorption apparatus for the wafer W by the wafer holder 10, with some modifications added to the structure of the apparatus as shown in FIG. 15. The apparatus structure of FIG. 16 differs from that of FIG. 15 in that the tank chamber or chambers disposed in the holder 10 in the fourth embodiment as shown in FIG. 15 is or are disposed in a block made of ceramics material and constituting the main stage member 2 in the fifth embodiment as shown in FIG. 16.

Figure 16:
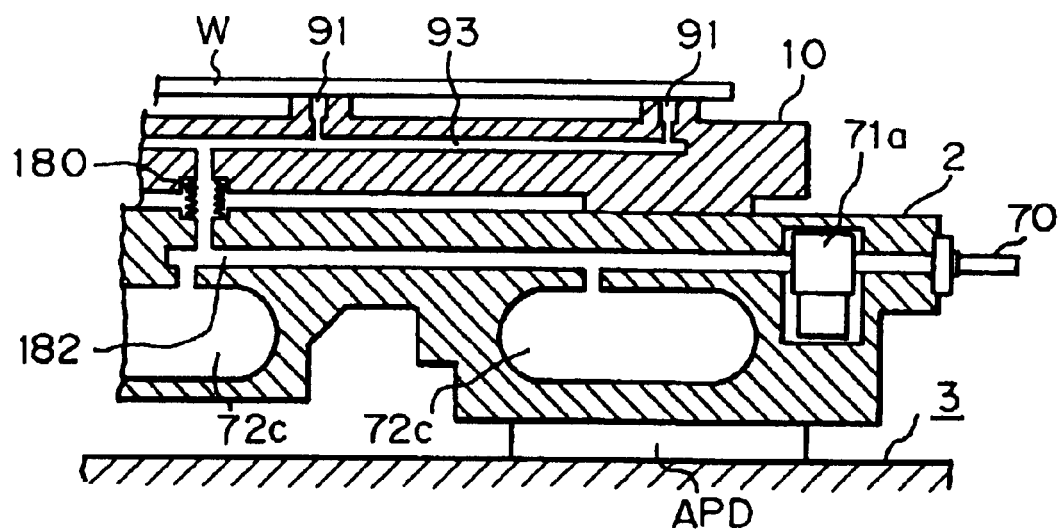
FIG. 16 is a partially sectional view showing the structure of a movable stage apparatus in accordance with a fifth embodiment of the present invention.

The basic structure of the holder 10 as shown in FIG. 16 is basically the same as that as shown in FIG. 6, in which the holder 10 has the plural adsorption grooves (pressure-reducing concave portions) 91 disposed therein communicating with the air path 93 disposed therein and the air path 93 is connected to an air path 182 disposed in the main stage member 2 through the bellows 180 for vacuum pressure packing. The air path 182 is in turn connected to the receipt edge orifice 70 through the electromagnetic valve 71*a* disposed in the vicinity of the side edge portion of the main stage member 2. The block made of ceramics materials constituting the main stage member 2 is provided therein with a plurality of tank chambers 72*c* formed each in a solid shape similar to a bomb for Aqualung, and each of the tank chambers 72*c* is communicated with the air path 182 disposed in the main stage member 2.

Further, in this embodiment, the main stage member 2 is held on the surface of the base table 3 via an air pad APD for a static pressure gas bearing and a pressure-applying fluid for the gas bearing may be led to the main stage member 2 separately from the apparatus column side through a tube, although not shown.

In the embodiment as shown in FIG. 16, a variable restricting valve (71*c* In FIG. 6) for imparting the adsorption force mildly by the vacuum pressure during the wafer adsorption is omitted. However, when such a variable restricting valve is to be disposed, it is preferred to dispose it on the main stage member 2 side between the air path 182 and the bellows 180 as shown in FIG. 16. Moreover, although the disposition of the pressure sensor 71*e* for monitoring the vacuum pressure during the adsorption action, a connection system of the signal SV2 for controlling the opening and closing action of the electromagnetic valve 71*a*, etc. are omitted from FIG. 16, their portions may be structured in substantially the same manner as shown in FIGS. 6 and 15.

Further, in this embodiment, as a space defined by the tank chamber or chambers is formed in the block made of ceramics material (or a metal) constituting the main stage member 2, the main stage member 2 can be made lightweight, thereby achieving the effects including improvements in the maximal speed of the main stage member 2, acceleration thereof and responsiveness in a fine servo range. Moreover, when the tank chamber or chambers 72*c* is or are formed in the structural body of the main stage member 2 as in this embodiment, corner portions of the structural body (e.g. four corner portions of the main stage member 2, etc.) are built-in each in a spherical shape, thereby preventing transformation of the main stage member 2 by reducing the pressure in the tank chamber or chambers to a minimum extent.

Then, a description will be made of the apparatus structure according to a sixth embodiment of the present invention with reference to FIG. 17, in which the feature resides in that a passive mechanical valve mechanism 77 is used, in place of an active element such as an electromagnetic valve, for switching the flow path for pressure-reducing or pressure-applying fluid by changing the connection system between the receipt edge orifice 70 on the main stage member 2 side and the feed edge orifice 84 on the base table 3 side (or the apparatus column 30 side) upon vacuum adsorption (or supply of the pressure-applying fluid).

FIGS. 17(A), (B) and (C) show each the structure of the mechanical valve mechanism 77 disposed on the main stage member 2 side and the structure of a portion in the vicinity of the feed edge orifice 84 in a pipe-shaped structure disposed in the fixing member 83 on the apparatus 3 (30) side. More specifically, FIG. 17(A) indicates the state in which the main stage member 2 stops prior to the loading position and the feed edge orifice 84 faces the receipt edge orifice 70 of the mechanical valve mechanism 77 at a constant distance, FIG. 17(B) indicates the state in which the main stage member 2 is moved minutely toward the feed edge orifice 84 and the tip of the receipt edge orifice 70 of the mechanical valve mechanism 77 is in abutment with the bottom edge portion of the pipe constituting the feed edge orifice 84, and FIG. 17(C) indicates the state in which the main stage member 2 stops in the predetermined loading position and the mechanical valve mechanism 77 is allowed to fully engage with the feed edge orifice 84.

As shown in FIG. 17(A), the mechanical valve mechanism 77 is structured in a cylindrical shape as a whole in such a form that the receipt edge orifice 70 in a cylindrical shape is mounted on the tip portion of the mechanical valve mechanism 77 so as to be slidable and an inner wall tip portion 70s is chamfered smoothly in order to ensure a good airtight performance. Further, a tip of the receipt edge orifice 70 is formed with a ring-shaped flange portion having a radius somewhat greater than the radius of the receipt edge orifice 70 and an O-ring OS made of rubbery or plastics material is mounted on the bottom portion of the flange portion in order to improve airtightness. Moreover, a coiled spring 77e for biasing the receipt edge orifice 70 to the position indicated in FIG. 17(A) is mounted between a projection ring 77b formed in a ring shape on an inner wall surface of the mechanical valve mechanism 77 and an bottom edge portion of the receipt edge orifice 70 (the left end in FIG. 17(A)). In addition, a stopper is disposed so as to cause the receipt edge orifice 70 to fail to move over the position of FIG. 17(A) toward the right.

Inside the mechanical valve mechanism 77 and on the left side of the projection ring 77b is disposed a piston 77a so as to be slidable, and the piston 77a is biased usually toward the side of the projection ring 77b by a coiled spring 77c. In a wall portion of the mechanical valve mechanism 77 with the piston 77a located in usually cases is formed an air path 77d to which in turn is connected the tube 73 (the air path to the holder 10) as shown in FIG. 6. In this embodiment, the biasing force of the coiled spring 77c is set so as to become greater than the biasing force of the coiled spring 77e, thereby allowing the receipt edge orifice 70 to be pushed into the mechanical valve mechanism 77 with weak force.

On the other hand, the feed edge orifice 84 made of ceramics material or a metal is connected to the tube 82 extending from the fluid supply system 81, as shown in FIGS. 5, 6 and 13, and fixed to the apparatus 3 through the fixing member 83. At the bottom of the feed edge orifice 84 is disposed an interference member 85a formed in a conical shape. The interference member 85a is made of plastics material, e.g. a soft material undergoing elastic transformation to an appropriate extent in order to enhance tightness with the tip portion 70s of the receipt edge orifice 70.

Furthermore, the pipe-shaped feed edge orifice 84 is formed therein with an air path 84a which in turn communicates with an aperture 84b formed in the side wall surface nearby the tip of the feed edge orifice 84. This structure allows a supply of the vacuum pressure or the pressure-applying fluid from the tube 82 to the outside space through the air path 84a from the aperture 84b. A group of the electromagnetic valves (81a in FIG. 6 and 81a, 86a in FIG. 13, etc.) is closed in such a state that the receipt edge orifice 70 of the mechanical valve mechanism 77 is spaced apart from the feed edge orifice 84 as shown in FIG. 17(A).

When the main stage member 2 moves minutely toward the right direction from the state as shown in FIG. 17(A), the tip portion 70s of the receipt edge orifice 70 of the mechanical valve mechanism 77 comes into abutment with a sloping surface portion of the interference member 85a, as shown in FIG. 17 (B). In this state, the pressure-reducing fluid is fed in an instant to the air path 84a within the feed edge orifice 84 through the tube 82 from the fluid supply system 81, thereby enabling the closed space inside the receipt edge orifice 70 to become somewhat negative pressure, as shown in FIG. 17(B). In this state, a tip portion 84c of the feed edge orifice 84 is so disposed as to fail to come into contact with the piston 77a.

Further, when the main stage member 2 moves minutely from the position of FIG. 17(B) toward the right-hand direction by a distance in which the receipt edge orifice 70 can slide, the receipt edge orifice 70 is caused to be pushed into the inside of the mechanical valve mechanism 77 in resistance to the biasing force of the coiled spring 77e, as shown in FIG. 17(C). The insertion of the receipt edge orifice 70 into the mechanical valve mechanism 77 causes the O-ring OS to be transformed to some extent, thereby sealing a gap between the tip portion 84c of the feed edge orifice 84 and the cylinder-shaped flange portion of the piston 77a. At this time, the tip portion 84c of the feed edge orifice 84 presses the piston 77a toward the left by a predetermined amount (in other words, only a cylindrical outer wall of the mechanical valve mechanism 77 being moved toward the right), thereby opening the air path 77d formed in the side wall of the mechanical valve mechanism 77.

Immediately before the opening of the air path 77d, the pressure-applying fluid is supplied via the tube 82 and the aperture 84b of the feed edge orifice 84 and it is sent to the tube 73 via the air path 77d, thereby releasing the adsorption of the exposed wafer on the holder 10 in an instant. Thereafter, a non-exposed wafer is loaded on the holder 10, followed by supplying the vacuum pressure via the tube 82, the feed edge orifice 84, the air path 77d and the tube 73, thereby implementing the adsorption action of the non-exposed wafer.

When the completion of the adsorption of the wafer onto the holder 10 has been confirmed by the pressure sensor 71e, the electromagnetic valves group located at the bottom of the tube 82 is closed and the main stage member 2 is allowed to move minutely toward the left from the state as it is as shown in FIG. 17(C) and the piston 77a is eventually returned to the state as shown in FIG. 17(B) by the biasing force of the coiled spring 77c. Then, in the state as shown in FIG. 17(B), the pressure-applying fluid is caused to blow in an instant from the feed edge orifice 84 through the tube 82 to thereby convert the closed space inside the receipt edge orifice 70 into a somewhat positive pressure state, followed by returning the main stage member 2 to the position as shown in FIG. 17(A). This terminates a series of the work for exchanging wafers.

Although not shown in FIG. 17, the reserve tank 72 and the tank chambers 72a and 72c as described hereinabove are connected to a passage of the tube 73 as shown in FIG. 17, thereby structuring a like self-sustaining adsorption (pressure-reducing) system.

As described hereinabove, this embodiment according to the present invention can automatically form a supply path for supplying the pressure-reducing fluid or the pressure-applying fluid to the main stage member 2 simply by transferring the movable main stage member 2 to the predetermined loading position and connecting the receipt edge orifice 70 of the mechanical valve mechanism 77 with the feed edge orifice 84 by the driving force for transferring the main stage member 2. Further, this embodiment can automatically block the communication of the pressure-reducing path for the wafer adsorption by the holder 10 with the atmosphere simply by cutting off the mechanical valve mechanism 77 of the main stage member 2 from the feed edge orifice 84.

Therefore, this embodiment of the present invention can offer the advantage that the main stage member 2 can be made lightweight because no such active control element is required to be disposed on the main stage member 2 side, which includes an electromagnetic valve or the like for blocking the communication of the closed space portion for the wafer adsorption (a space extending from the adsorption grooves 91 of the holder 10 to the air path 77d of the mechanical valve mechanism 77, a space within the tank chamber) with the atmosphere. Further, as the main stage member 2 side does not require any electromagnetic valve, an electric wiring for supplying the signal SV2 thereto is also not required, thereby further reducing the number of wires to be dragged by the main stage member 2 upon transferring.

Next, a description will be made of an eighth embodiment according to the present invention, with reference to FIGS. 18–22. This embodiment presents the feature in that a self-sustaining pressure-reducing (adsorbing) system or a self-sustaining pressure-applying system is structured for an aerodynamic system, other than the vacuum system for the wafer adsorption, to be used in the movable main stage member 2.

Figure 18:
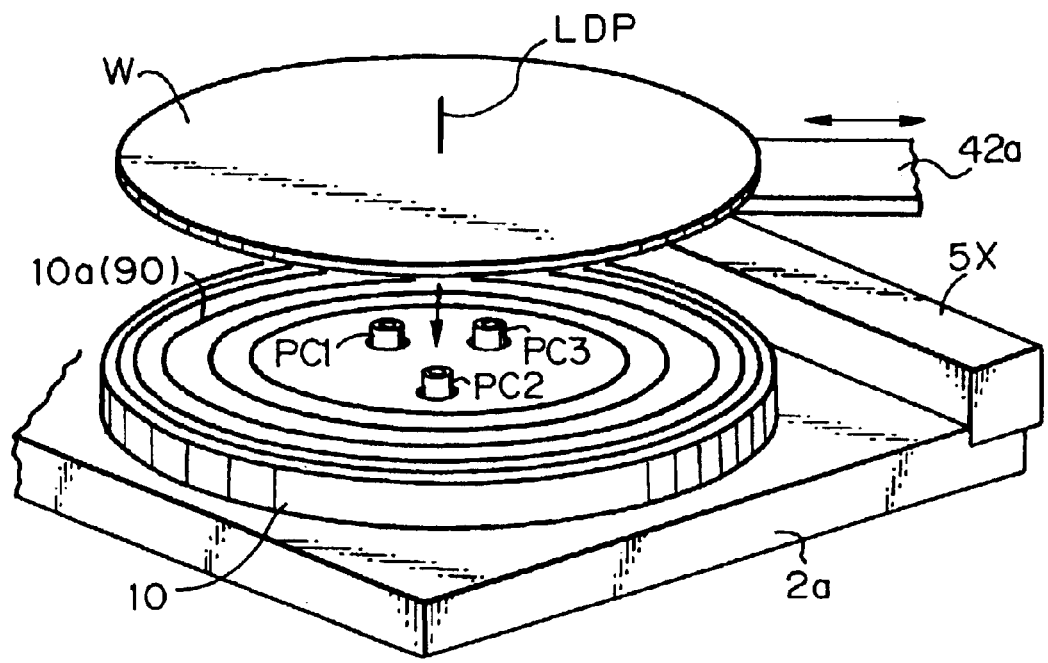
FIG. 18 is a perspective view showing an appearance of a lift mechanism for lifting a wafer in a movable stage apparatus in accordance with a seventh embodiment of the present invention.

FIG. 18 indicates the disposition of three lift pins PC1, PC2 and PC3 disposed so as to lift the wafer W upward by a predetermined distance from the loading surface 10a (the plural projection parts 90) of the holder 10, upon delivering the wafer W onto the holder 10 mounted on the upper stage portion 2a of the main stage member 2 by the aid of the arm joint 42a in the loading position LDP or upon receipt of the wafer W from the holder 10 via the arm joint 42a therein.

Each of the three lift pins PC1, PC2 and PC3 is formed on its top surface with a small aperture for vacuum adsorption, which assist in temporarily adsorbing the wafer W loaded on the three lift pins. The three lift pins are disposed so as to be movable upward and downward through the corresponding apertures formed at the central portion of the holder 10. An example of the relationship of the disposition of the three lift pins with their sizes is disclosed in detail in Japanese Patent Unexamined Publication No. 1-214,042 filed in the name of Nikon and this technology disclosed therein may be applied to the present invention as it is or with some modifications.

Figure 19:
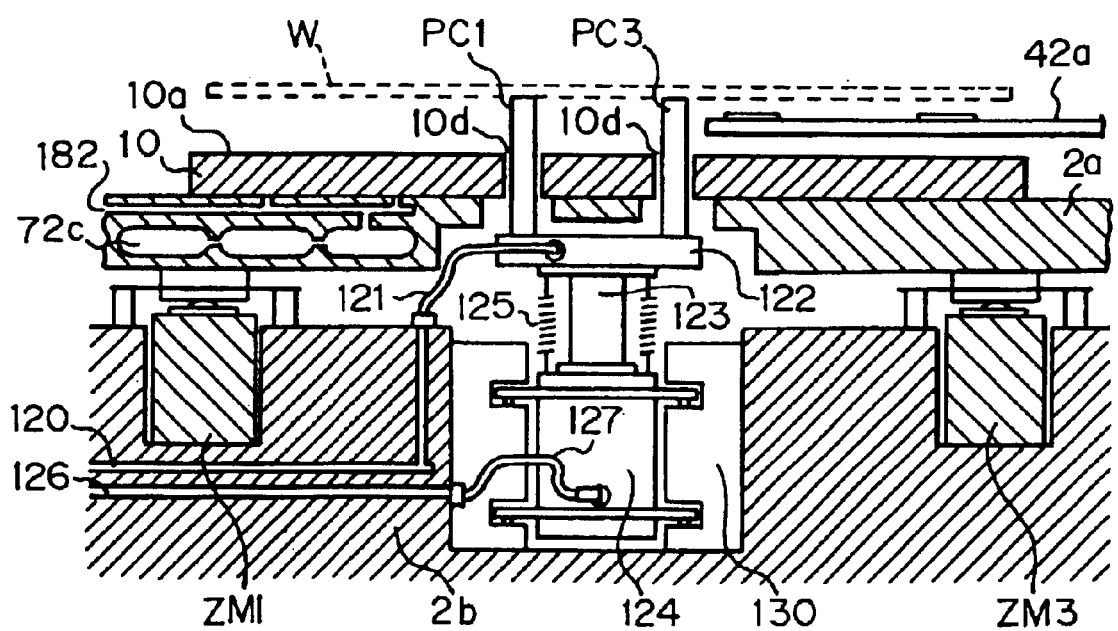
FIG. 19 is a view showing an example of a section in the structure of the movable stage apparatus with the lift mechanism of FIG. 18 loaded thereon.

The lift pins may be moved upward and downward by a lift mechanism disposed in the main stage member 2 and an example of the lift mechanism may be structured as shown in a partial section in FIG. 19. In FIG. 19, two lift pins PC1 and PC3 alone are indicated as representative ones.

In the structure as shown in FIG. 19, the holder 10 is formed at its central portion with an aperture 10d through which each of the lift pins PC1 and PC3 can pass without any contact therewith. FIG. 19 shows the case where each of the lift pins passed through the aperture 10d and is raised to the highest position. Between the wafer W and the loading surface 10a of the holder 10 is formed a space that can allow the arm joint 42a to penetrate thereinto. Further, each of the lift pins can lower its tip surface to the position lower than the loading surface 10a of the holder 10.

Further, in this embodiment, the holder 10 is disposed so as to be minutely ratable at an angle θ on the upper stage portion 2a by a drive motor (not shown). A self-sustaining adsorption system leading to each of the adsorption grooves 91 on the loading surface 10a of the holder 10 comprises an air path 182 disposed in the upper stage portion 2a, a tank chamber 72c and an electromagnetic valve (not shown), etc. and it functions in substantially the same manner as that according to each of the embodiments as described hereinabove. Moreover, the upper stage portion 2a is so arranged as to move minutely in the Z-axial direction parallel to a lower stage part 2b and to incline minutely each about the X-axis and the Y-axis.

As a result, the posture of the wafer W is controlled with four freedoms of the θ-rotational movement, the Z-directional movement, the X-directional inclination movement and the Y-directional inclination movement on the main stage member 2. However, the θ-rotational movement of the holder 10 can be omitted in instances where the reticle is disposed so as to be corrected by rotation at the angle θ in the exposure apparatus as shown in FIG. 3. In this case, the wafer W has its posture controlled with respect to the lower stage portion 2b with the three freedoms (the Z-directional movement, the X-directional inclination movement and the Y-directional inclination movement). The movement with the three freedoms is controlled by three Z-directional drive motors ZM1–ZM3 interposed between the lower stage portion 2b and the upper stage portion 2a.

As shown in FIG. 19, the three lift pins PC1–PC3 are fixed on a common base plate seat 122 which in turn is joined to a piston 123 of an air jack 124 mounted on the lower stage portion 2b for upward and downward movement. The air jack 124 raises the piston 123 by the pressure-applying fluid to be fed through an air path 126 formed in the lower stage portion 2b and a flexible tube 127. The piston 123 can be lowered by releasing the pressure-applying fluid in the air jack 124 (a closed space part) from the air path 126 through a variable restricting valve to the atmosphere, utilizing tensile resiliency of a spring 125 disposed between the base plate 122 and the air jack 124.

To the base plate 122 is supplied the vacuum pressure (or the pressure-applying fluid) through the tube 121 and the air path 120 disposed in the lower stage portion 2b. The vacuum pressure (or the pressure-applying fluid) is led through the inside of the base plate 122 to a small aperture in each of the tip surfaces of the lift pins PC1–PC3. The air path 120 is connected to the receipt edge orifice disposed on the side edge of the lower stage portion 2b through an electromagnetic valve as well as to a tank chamber for structuring a self-sustaining adsorption system.

If no mechanism for the θ-rotational movement is provided on the holder 10 in FIG. 19, it is apparent as a matter of course that the wafer is provided with no rotational movement. Thus, in this embodiment, there is provided a θ-actuating mechanism 130 for minutely rotating the total members of the base plate 122 supporting the three lift pins PC1–PC3, the piston 123 and the air jack 124 with respect to the lower stage portion 2b on the XY-plane, in order to allow a rotation of the wafer W with respect to the holder 10.

Figure 20:
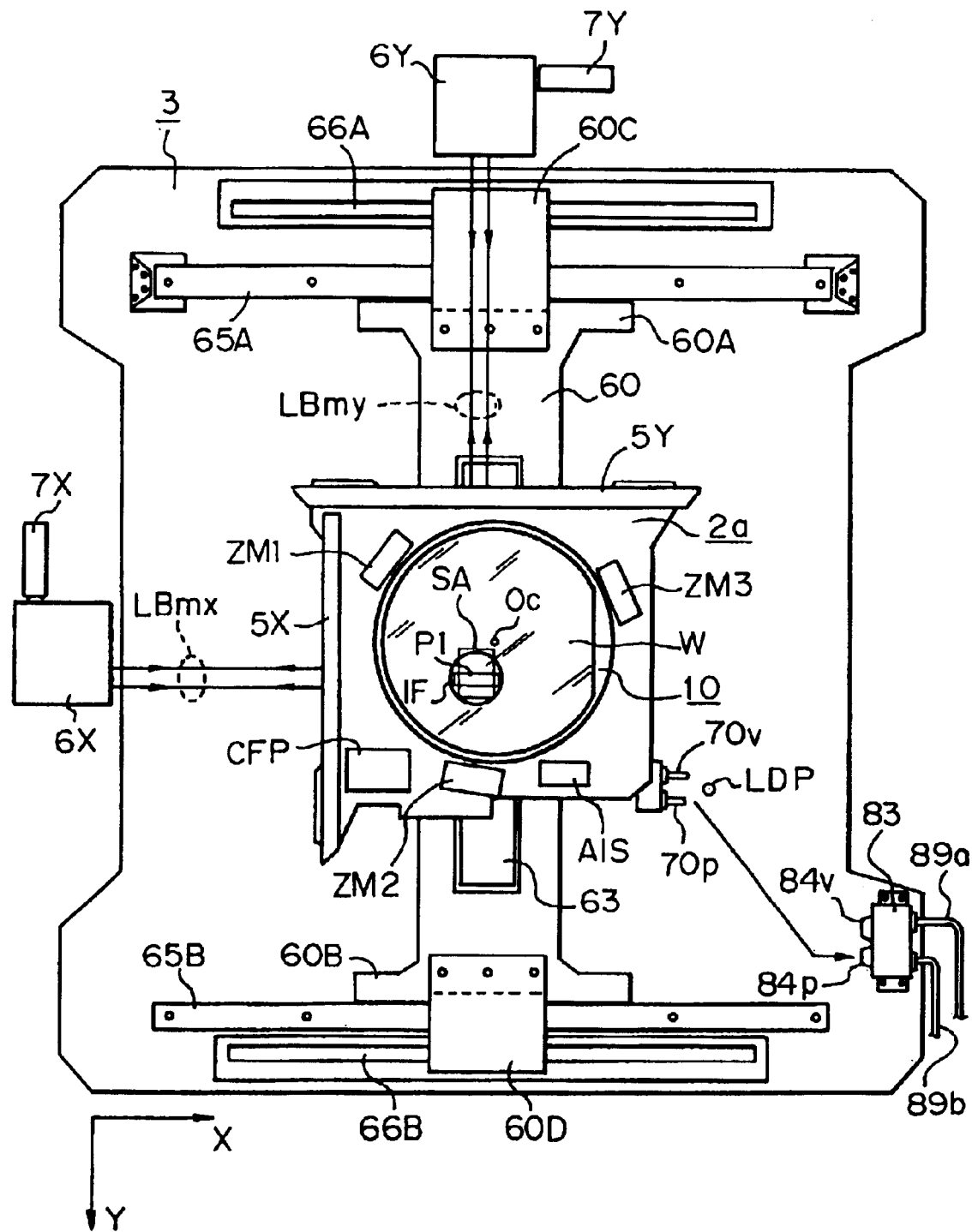
FIG. 20 is a view showing an overall structure of the movable stage apparatus with the lift mechanism of FIGS. 18 and 19 loaded thereon.

An example of the entire structure of a two-dimensional transfer stage apparatus with the lift mechanism as shown in FIGS. 18 and 19 loaded thereon will be described briefly with reference to FIG. 20. The stage apparatus as shown in FIG. 20 is similar to a stage apparatus as disclosed, for example, in Japanese Patent Unexamined Publication No. 61-209,831 and the prior art technology may be applied to the present invention with some small parts modified or varied. Among the structuring parts as shown in FIG. 20, the structuring parts having the same functions as those of FIGS. 1 and 5 are provided with the identical reference numerals and symbols.

As shown in FIG. 20, two fixed guide members 65A and 65B are mounted in a spaced relationship apart in the Y-direction on the base table 3 having an even surface and extending linearly in the X-direction, and a movable guide member 60 extending linearly in the Y-direction is mounted between the fixed guide members 65A and 65B. At the both end portions of the movable guide member 60 are disposed air pad blocks 60A and 60B for forming a fluid bearing between the fixed-guide members 65A and 65B, respectively. Further, the movable guide member 60 is provided at its bottom surface with a pad for a fluid bearing for supporting its own weight on the surface of the base table 3.

The lower stage portion 2b of the movable main stage member 2 is restrained in the X-direction through the fluid bearing for the both side surfaces (or one of the both side surfaces) extending in the Y-direction of the movable guide member 60, although not shown in FIG. 20 because it is covered by the upper stage portion 2a. As a result, the movable main stage member 2 (2a) is allowed to move in the Y-direction with respect to the movable guide member 60. Further, on the bottom surface of the lower stage portion 2b of the movable main stage member 2 is provided a pad for the fluid bearing for supporting the own weight on the surface of the base table 3.

The Y-directional movement of the main stage member 2 is effected by a linear motor 63 disposed on the movable guide member 60 and the X-directional movement thereof is effected by transmitting the X-directional driving force of two linear motors 66A and 66B disposed in the base table 3 to the movable guide member 60 via movable fixing parts 60C and 60D.

To the upper stage portion 2a of the main stage member 2 are fixed the movable mirrors 5X and 5Y reflecting beams LBmx and LBmy projected from the laser interferometers 6X and 6Y, respectively. The coordinates position and the transfer amount of the main stage member 2 are measured on the basis of the signal for length measurement from the receivers 7X and 7Y, respectively, disposed on each of the laser interferometers. On the holder 10 disposed on the upper stage portion 2a is adsorbed the wafer W, and the posture of the entire members of the lower stage portion 2b including the holder 10 is controlled with three freedoms by three Z-directional drive motors ZM1–ZM3.

Further, on the upper stage portion 2a are mounted a reference mark plate CFP and a projection image detection plate AIS, the reference mark plate CFP being formed with a reference mark or an illuminous pattern detectable on the reticle side through a projection field IF of the optical projection system PL (FIGS. 3 and 5) and the projection image detection plate AIS being formed with a fine opening portion for photoelectrically detecting a mark projection image of the reticle projected into the projection field IF.

At a corner portion of the lower stage portion 2b of the movable main stage member 2 are disposed a receipt edge orifice 70v in a pipe-shaped form for leading the pressure-reducing fluid (vacuum pressure) to various aerodynamic systems, as shown in FIG. 19, and a receipt edge orifice 70p in a pipe-shaped form for leading the pressure-applying fluid thereto, each projecting in the X-direction. The receipt edge orifices 70v and 70p are engaged with feed edge orifices 84v and 84p mounted on the base table 3 through the fixing member 83, respectively, when the main stage member 2 is stopped so as to align the center point Oc on the loading surface of the holder 10 with the predetermined loading position LDP.

The feed edge orifice 84v is arranged to send the pressure-reducing fluid being sent through the tube 89a from the fluid supply system and the feed edge orifice 84p sends the pressure-applying fluid being sent through the tube 89b from the fluid supply system. In this embodiment, each of the structures of the receipt edge orifices 70v and 70p as well as the feed edge orifices 84v and 84p is substantially the same as shown in FIG. 6.

The stage apparatus according to this embodiment of the present invention as shown in FIG. 20 is intended to be applied to a projection exposure apparatus of a step-and-scan system. At this end, one shot area SA on the wafer W is subjected to scanning exposure by an effective projection image area PI defined in a slit shape or in a rectangle shape, extending linearly in the diametral direction within a circle-shaped projection field IF.

In this case, the direction of transferring the wafer W for scanning exposure is set to be the X-direction crossing perpendicularly to the longitudinal-axis direction of the projection image area PI. However, the stage apparatus in this embodiment is so arranged as to be subjected to scanning exposure with the main stage member 2 only so that the scanning exposure can be realized at a high speed and with a high precision. It is to be noted herein, however, that the movable guide member 60 is also moved minutely in the X-direction, even if the scanning direction is Y-direction because the wafer W is required to be moved minutely in the X-direction, too, during the scan exposure, even if the scanning direction is Y-direction.

If the direction of the scan exposure is set to be the X-direction in the structure as shown in FIG. 20, both of the movable guide member 60 and the main stage member 2 should be transferred in the X-direction at a high speed yet at an equal speed, whenever each shot area SA of the wafer W is exposed. This is laborious and suffers from the difficulty for enhancing the precision in controlling the stage apparatus during the scanning. In addition, a movable body having a great mass defined by the movable guide member 60 and the main stage member 2 should be moved at a high acceleration and a high deceleration in a repetitive manner whenever exposure is made to each of the shot areas, thereby creating a very great degree of reaction force in the exposure apparatus.

Accordingly, there is a concern about an occurrence of unnecessary vibration on the part of the exposure apparatus or an occurrence of unnecessary transformation in the structural body such as a column, etc. in the exposure apparatus. However, if the main stage member 2 is so arranged as to move in the Y-direction at the time of the scan exposure, the mass of the movable body accelerated and decelerated in a repetitive manner becomes so small that an occurrence of vibration or transformation of the structural body, etc. can be reduced.

FIG. 20 shows an example of a wafer stage apparatus according to an embodiment of the present invention. Some other examples of the wafer stage apparatuses are disclosed, for example, in Japanese Patent Unexamined Publication Nos. 8-166,475 (U.S. Pat. No, 5,528,118) and 8-233,964 (U.S. patent application Ser. No. 325740 filed on Oct. 19, 1994), which disclose each a stage apparatus comprising a plurality of linear motors and follower structures. The such stage apparatuses may be used as the stage apparatus according to the present invention as they are or with some modifications.

Then, with reference to FIG. 21, a description will be made of the structure of the aerodynamic system (e.g. a vacuum adsorption system, a pressure applying system, etc.) suitable for the disposition in the main stage member 2 of the structure of the apparatus as shown in FIGS. 18–20. In this embodiment, the aerodynamic system may be provided with, for example, a self-sustaining adsorption system of a wafer consisting of an electromagnetic valve 71a for supplying vacuum pressure (or a pressure-applying fluid) to the adsorption grooves 91 of the holder 10 for adsorbing the wafer W thereon by the aid of vacuum pressure, an air path 182, a tank chamber 72c and a tube 73, etc.; a self-sustaining adsorption system of a holder consisting of electromagnetic valves 140, 141 and a tank chamber 72d for supplying vacuum pressure (or a pressure-applying fluid) to a pad portion (a concave portion) 144 for adsorbing the wafer by means of vacuum pressure after rotation of the θ-angle rotable holder 10 at an angle θ on the upper stage portion 2a, etc.; a self-sustaining adsorption system of a lift pin consisting of an electromagnetic valve 150 for supplying vacuum pressure (or a pressure-applying fluid) to adsorption apertures of lift pins PC1–PC3 for vacuum adsorbing the wafer, a tank chamber 72e, an air path 120 and a tube 121, etc; and a self-sustaining pressure-applying system consisting of an electromagnetic valve 152 for supplying a pressure-applying fluid to an air jack 124 disposed so as to move lift pins PC1–PC3 upward and downward, an air path 126, a tube 127, etc.

To each of the electromagnetic valves 71a, 140 and 150 for the respective self-sustaining adsorption systems is supplied the vacuum pressure from the receipt edge orifice 70v through a tube 160v. Further, to each of the electromagnetic valve 71a of the wafer self-sustaining adsorption system, the electromagnetic valve 150 of the lift pin self-sustaining adsorption system and the electromagnetic valve 152 of the self-sustaining pressure-applying system for the air jack 124 is supplied the pressure-applying fluid from the receipt edge orifice 70p through a tube 160p.

Figure 21:
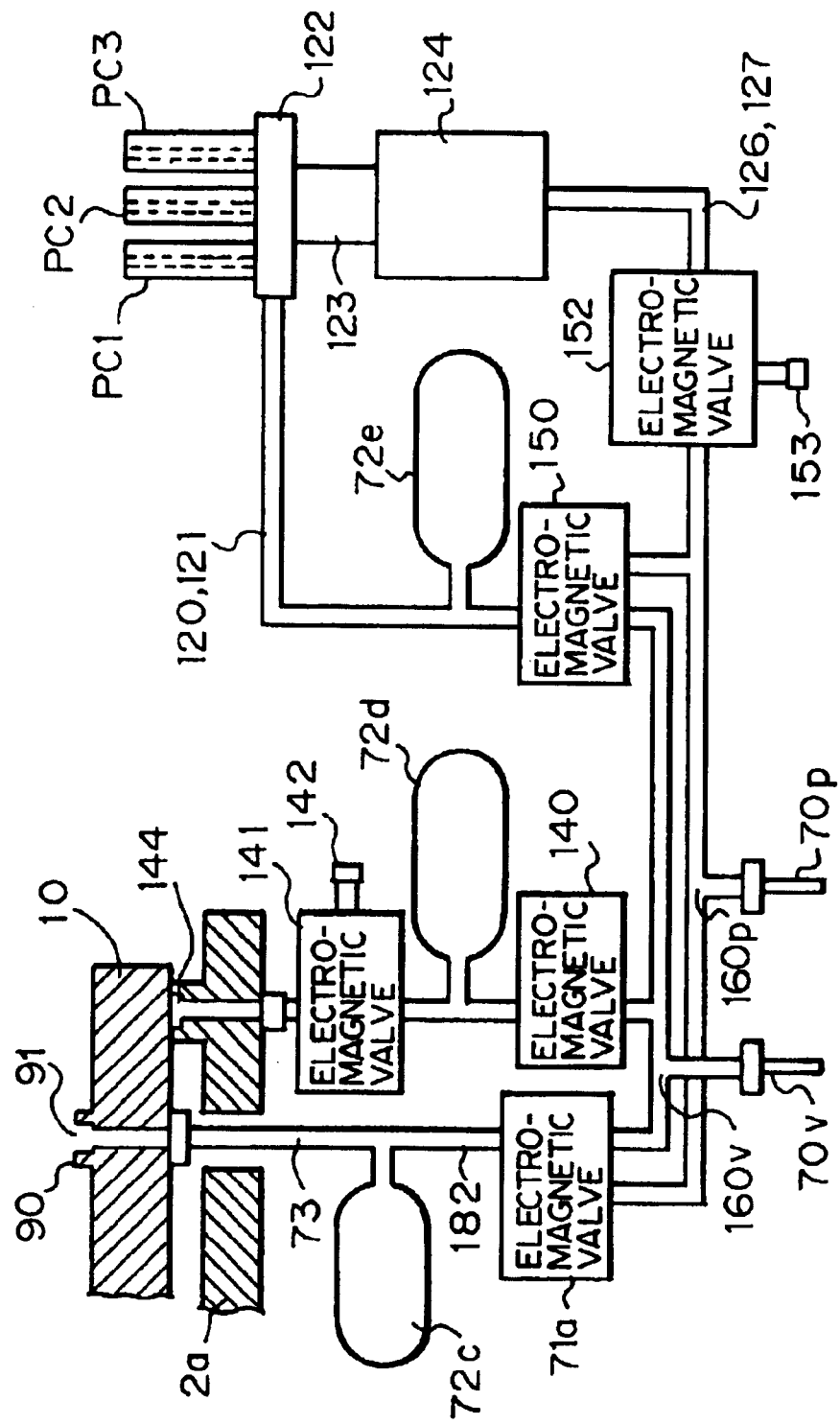
FIG. 21 is a block diagram showing a piping of an aerodynamic system disposed on the main stage member side of the movable stage apparatus as shown in FIGS. 19 and 20.

In the structure as shown in FIG. 21, the electromagnetic valve 71a may have a function somewhat different from that of the electromagnetic valve 71a as shown in FIG. 6 and it may be provided with a switching function for alternatively sending the vacuum pressure from the tube 160v and the pressure-applying fluid from the tube 160p to the air path 182. Further, the electromagnetic valve 71a may also be provided with a switching function for switching to a non-connecting state (a neutral state) in which to fail to connect the air path 182 to both of the tubes 160v and 160p. Likewise, the electromagnetic valve 150 may be provided with such a switching function for switching alternatively the vacuum pressure and the pressure-applying fluid as well as with a switching function for switching to such a neutral state in which to fail to connect the air path 120 to both of the tubes 160v and 160p.

Further, the electromagnetic valve 141 is provided with a switching function for switching between a supply of vacuum pressure to the pad portion 144 and an exposure of the pad portion 144 to the atmosphere through the port 142.

The electromagnetic valve 152 has a switching function for switching between a supply of a pressure-applying fluid to the air jack 124 and an exposure of the air jack 124 to the atmosphere (or variable restricting valve) through a port 153. Moreover, the electromagnetic valve 140 is provided with a function for simply opening and blocking a passage for vacuum pressure.

Figure 22:
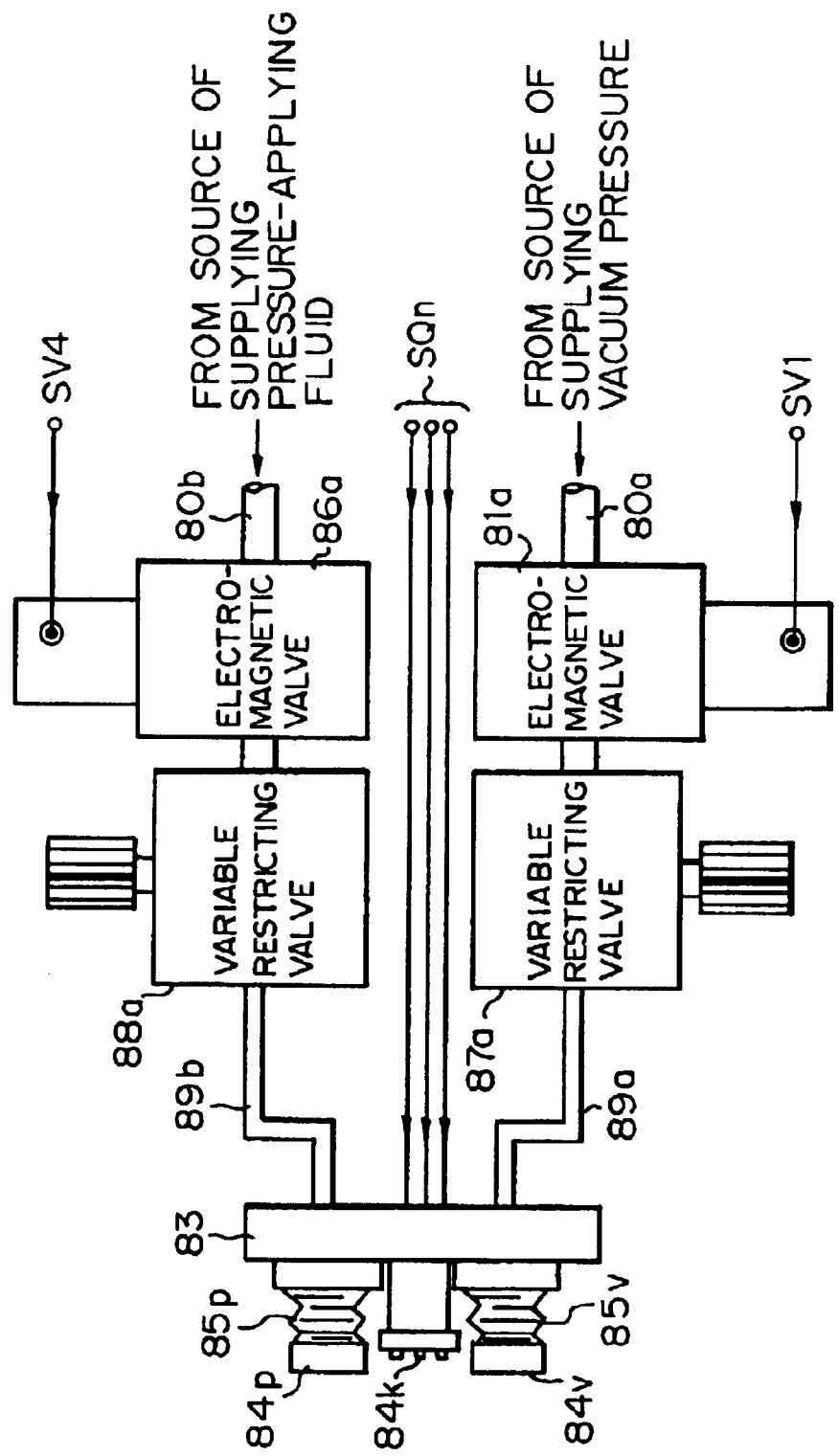
FIG. 22 is a block diagram showing a piping of a fluid supply system disposed on the base table side of the movable stage apparatus as shown in FIGS. 19 and 20.

On the other hand, the feed edge orifices 84v and 84p of FIG. 21 on the base table 3 side to be connected to the receipt edge orifices 70v and 70p may be structured as an example in such a manner as will be illustrated in FIG. 22. The fluid supply system as shown in FIG. 22 may be structured basically in substantially the same manner as that as shown in FIG. 13, with the exception that the feed edge orifice 84v for the vacuum pressure is separated from the feed edge orifice 84p for the pressure-applying fluid. More specifically, the vacuum pressure is supplied to the feed edge orifice 84v from a vacuum pressure supply source through the tube 80a, the electromagnetic valve 81a, the variable restricting valve 87a and the tube 89a, while the pressure-applying fluid is supplied to the feed edge orifice 84p from a pressure-applying fluid supply source through the tube 80b, the electromagnetic valve 86a, the variable restricting valve 88a and the tube 89b.

Moreover, this embodiment may be configured in such a manner (a like structure as shown in FIG. 15) that a signals group SQn for controlling each of the electromagnetic valves 71a, 140, 141 and 152 on the main stage member 2 side and for controlling a rotation drive part 130 of FIG. 19, a motor for rotation at a θ-angle, etc. can be received by the receiving terminal part 71k on the main stage member 2 side through the feed terminal part 84k disposed in the fixing member 83 of the base table 3.

Figure 23:
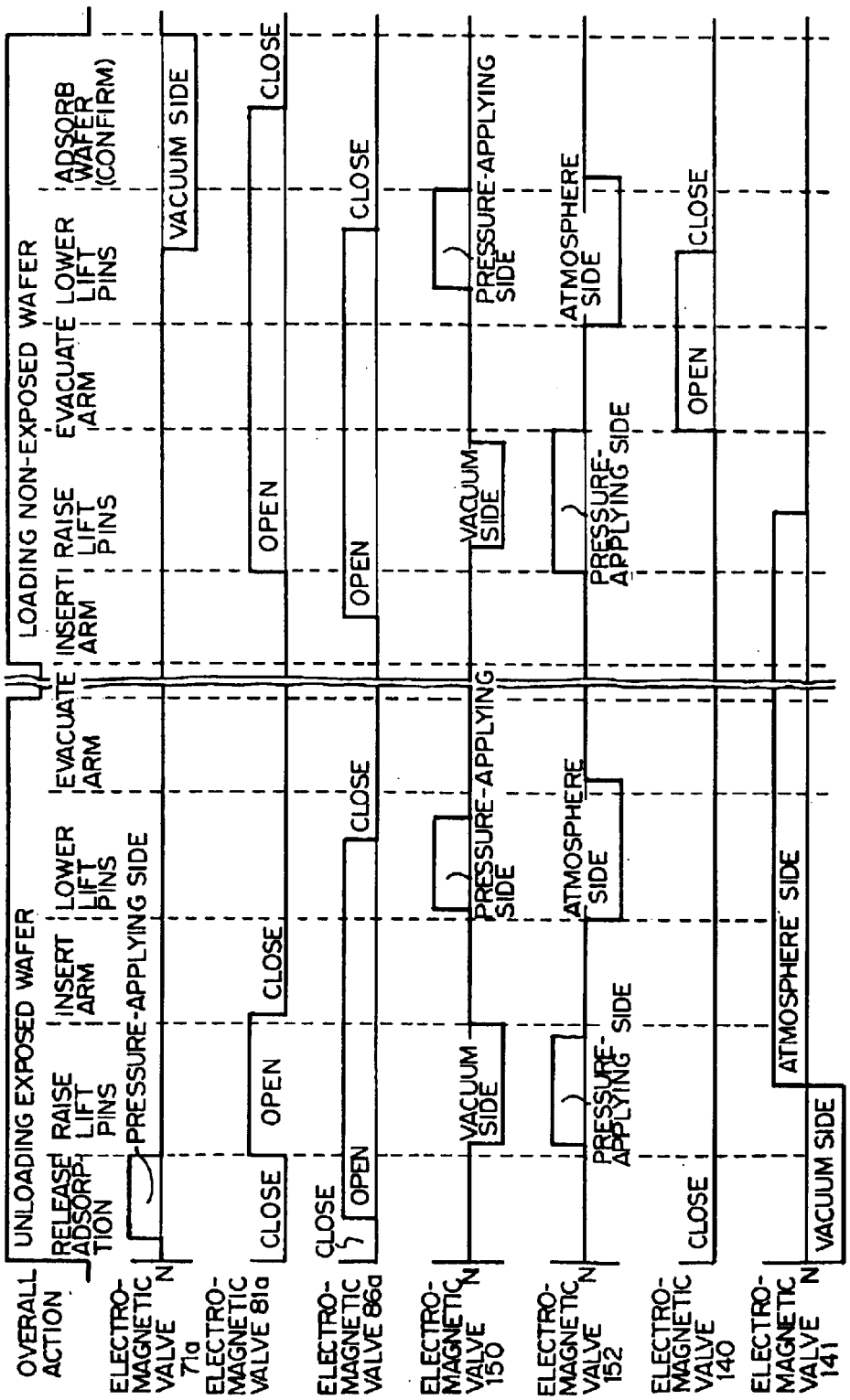
FIG. 23 is a time chart for describing each action in the work for exchanging wafers by the apparatus as shown in FIGS. 21 and 22.

The work for exchanging wafers in the exposure apparatus as shown in FIGS. 19 and 20 with the aerodynamic systems as shown in FIG. 21 and 22 incorporated therein may be carried out in accordance with a time chart as shown in FIG. 23. The time chart of FIG. 23 indicates the actions of the exposure apparatus to be taken immediately after the main stage member 2 stops in the loading position LDP and the receipt edge orifices 70v and 70p are connected to the feed edge orifices 84v and 84p, respectively, up to the point of time when a series of the work for exchanging the wafers has been completed (i.e. when the main stage member 2 is ready to be transferred from the loading position).

In FIG. 23, the horizontal axis represents the time axis in each case. The uppermost stage of the time chart indicates an itemized partial action of the overall action for exchanging wafers, including the unloading action of an exposed wafer and the loading action of a non-exposed wafer. The charts in the second to eighth stage indicate the status of operation of each of the electromagnetic valves 71a, 81a, 86a, 150, 152, 140 and 142, respectively. The electromagnetic valves 71a, 150, 152 and 142 are provided each with a neutral state in which neither input nor output is connected to anywhere, except for an alternative shift of the input and output, and the neutral state is indicated by symbol "N" on the charts.

The unloading action of the exposed wafer may be executed in accordance with the uppermost stage of the chart of FIG. 23, i.e. by releasing the adsorption of the exposed wafer on the holder 10, raising the lift pins PC1–PC3 (lifting the wafer) as shown in FIGS. 18, 19 and 21, inserting the arm joint 42a into a space between the holder 10 and the wafer (see FIG. 19), lowering the lift pins PC1–PC3 (delivering the wafer to the arm joint 42a) and evacuating the arm joint 42a with the exposed wafer held thereon.

Likewise, the loading action of the non-exposed wafer may be executed by inserting the arm joint 42a with the non-exposed wafer held thereon into a space over the holder 10, raising the lift pins PC1–PC3 (receiving the non-exposed wafer), evacuating the empty arm joint 42a, lowering the lift pins PC1–PC3 (delivering the non-exposed wafer to the holder 10) and vacuum adsorbing the non-exposed wafer on the holder 10.

First, immediately before the start of the unloading action of the exposed wafer, the electromagnetic valve 71a is in the neutral state N and the exposed wafer is subjected to self-sustaining adsorption on the holder 10 by the aid of the action of the tank chamber 72c, as is apparent from the connection as shown in FIG. 21. At this time, the electromagnetic valves 81a and 86a in FIG. 22 and the electromagnetic valve 140 in FIG. 21 are each in a blocking state (a closing state), while the electromagnetic valves 150 and 152 in FIG. 21 are in the neutral state N. Further, the electromagnetic valve 142 in FIG. 21 is in the connected state to the vacuum side and the holder 10 is subjected to self-sustaining adsorption on the pad portion 144 by the action of the tank chamber 72d.

In the action for releasing the adsorption of the wafer, first, the electromagnetic valve 71a is switched to the pressure-applying side, thereby allowing the receipt edge orifice 70p in FIG. 21 to be communicated with the tube 182 via the tube 160p and the electromagnetic valve 71a. Immediately after the communication of the receipt edge orifice 70p therewith, the electromagnetic valve 86a in FIG. 22 is switched to the open state, thereby supplying the pressure-applying fluid to the receipt edge orifice 70p via the feed edge orifice 84p and converting the pressure in the tank chamber 72c and in the path up to the adsorption grooves 91 into a positive pressure state to release the adsorption of the exposed wafer from the holder 10 in an instant. At this time, the wafer is caused to float by several microns from the loading surface of the holder 10.

Then, the electromagnetic valve 71a is switched to the neutral state N, followed by proceeding to the action for raising the lift pins PC1–PC3. At this time, the electromagnetic valve 81a in FIG. 22 is switched to the open state to expose the path extending from the receipt edge orifice 70v to the tube 160v in FIG. 21 to vacuum pressure. Simultaneously, as the electromagnetic valve 86a is kept open, the path extending from the receipt edge orifice 70p to the tube 160p is filled with the pressure-applying fluid. Immediately thereafter, the electromagnetic valve 150 in FIG. 21 is switched to the vacuum side (to the state in which the tube 160v is connected to the air path 120) and the electromagnetic valve 152 is immediately switched to the pressure-applying side (in the state in which the tube 160p is connected to the air path 126).

With this arrangement as described hereinabove, the pressure-applying fluid is supplied to the inside of the air jack 124, thereby raising the lift pins PC1–PC3. At the same time, the vacuum pressure is led to the inside of the tank chamber 72e, the air path 120 and the tube 121 to start the action for adsorbing the wafer on the tip surfaces of the lift pins PC1–PC3 (the action here being the action to suck the air from the small apertures thereof). Then, the electromagnetic valve 152 is switched to the neutral state N at a predetermined timing when the lift pins PC1–PC3 have been raised up to the predetermined position. Then, it is confirmed that the exposed wafer has been raised from the holder 10 and vacuum adsorbed on the tips of the lift pins PC1–PC3. Upon the completion of confirmation of the vacuum adsorption of the exposed wafer, the electromagnetic valve 150 is then switched to the neutral state N from the vacuum side, thereby terminating the action for raising the lift pins.

At this time, the electromagnetic valves 152 and 150 are both in the neutral state N so that the air jack 124 is in a self-sustaining pressure-applying state and the lift pins PC1–PC3 are adsorbing the exposed wafer in a self-sustaining way thereon by the action of the tank chamber 72. Thereafter, the electromagnetic valve 81a (supplying the vacuum pressure) is cut off for security's sake, then proceeding to the action for the insertion of the arm.

It is to be noted herein that the pad portion 144 in FIG. 21 needs be released from adsorption at an appropriate timing. Although the timing may be any time before the action for exchanging wafers or in the process of the action, it is set in this embodiment to be any time during the action for raising the lift pins for lifting the exposed wafer from the holder 10. Therefore, in this embodiment, the electromagnetic valve 142 is so arranged as to be switched at an appropriate timing during raising the lift pins to the atmosphere side (the state in which the pad portion 144 is communicated with the port 142) from the vacuum side (the state in which the pad portion 144 is communicated with the tank chamber 72d in FIG. 21).

When the arm joint 42a of the wafer carrier robot 40 has been inserted into the space between the lifted exposed wafer and the holder 10 in the manner as shown in FIG. 19 in such a state that the lift pins are being raised, then the lift pin lowering action is executed to lower the lift pins. In this case, first, the electromagnetic valve 152 is switched to the atmosphere side (the state in which the air path 126 connected to the air jack 124 is communicated with the port 153), then starting lowering the lift pins PC1–PC3. Immediately thereafter, the electromagnetic valve 150 is switched to the pressure-applying side (the connecting side between the air path 120 and the tube 160p) and the adsorption of the exposed wafer by the lift pins PC1–PC3 is released in an instant.

However, in instances where the adsorption of the wafer by the lift pins PC1–PC3 is released instantly by the aid of the pressure-applying fluid, there is the risk that the wafer swings on the lift pins PC1–PC3 and the carrying of the wafer may be adversely affected, if the pressure-applying fluid would be kept being supplied. Thus, in this embodiment, the electromagnetic valve 86a in FIG. 22 is switched to the blocked state at the timing when the pressure within the tank chamber 72e and the path up to the lift pins PC1–PC3 becomes slightly positive after the switching of the electromagnetic valve 150 to the pressure-applying side.

The lift pins PC1–PC3 continues lowering during this period of time, followed by delivering the exposed wafer to the carrier arm joint 42a and the carrier arm joint 42a is then evacuated from the space over the holder 10 with the exposed wafer vacuum adsorbed thereon. Upon this action, in this embodiment, the lift pins PC1–PC3 are so arranged as to stop temporarily for the sake of security when they are lowered to the position slightly lower than the loading surface 10a of the holder 10. As the unloading action of the exposed wafer has been finished by a series of the above sequence of the actions in the manner as described hereinabove, then the action for loading a non-exposed wafer is executed in the manner as described in FIG. 23.

In the loading action, first, the arm joint 42a with the non-exposed wafer adsorbed thereon is allowed to enter into a space over the holder 10. Concurrently therewith, the electromagnetic valve 86a is switched to the open state to supply the pressure-applying fluid to the tube 160p on the main stage member 2 side via the feed edge orifice 84p and the receipt edge orifice 70p. When the arm joint 42a has entered up to a predetermined position, then the electromagnetic valve 81a is switched to the open state and the electromagnetic valve 152 is switched to the pressure-applying side, thereby starting the action for raising the lift pins PC1–PC3. This action is substantially the same as the action for raising the lift pins upon unloading the exposed wafer as described hereinabove, although the timing for switching the electromagnetic valves 150 and 152 may differ to some extent.

The action for raising the lift pins delivers the non-exposed wafer from the arm joint 42a to the lift pins PC1–PC3 and the non-exposed wafer is then vacuum adsorbed on the lift pins PC1–PC3. During the delivery action of the non-exposed wafer to the lift pins PC1–PC3, the electromagnetic valve 142 in FIG. 21 is switched to the neutral state N. It is to be noted herein that the pad portion 144 and the tank chamber 72d are kept in an atmospheric state even after switching.

Once the non-exposed wafer has been adsorbed on the lift pins PC1–PC3, both the electromagnetic valve 150 and the electromagnetic valve 152 are switched to the neutral state N, thereby starting the self-sustaining adsorption by the lift pins PC1–PC3 and the self-sustaining pressure application by the air jack 124. Immediately thereafter, the arm joint 42a is evacuated from the upper space over the holder 10. During the evacuation, the electromagnetic valve 140 is switched to the open state, thereby leading the vacuum pressure supplied to the tube 160v to the inside of the tank chamber 72d. When this action is implemented in accordance with an alignment method in which the main stage member 2 is moved apart from the loading position and then the wafer is adsorbed and fixed by the pad portion 144 by rotating the holder 10 at the angle θ, it is required that the tank chamber 72d is maintained in advance at the level of vacuum pressure.

Thereafter, the action for lowering the lift pins is executed. As this action is substantially the same as the action for lowering the lift pins upon unloading the exposed wafer as described hereinabove, although the timing for switching the electromagnetic valves 152, 150 and 86a may differ to some extent, a detailed description of this action will be omitted. What is different in this embodiment from the action of lowering the lift pins upon unloading of the exposed wafer resides in that the electromagnetic valve 71a in FIG. 21 is switched to the vacuum side (the connected state in which the tube 182 is connected to the tube 160v) after the lowering of the lift pins PC1–PC3 has been started. In other words, the adsorption action by the holder 10 is started while releasing the adsorption of the wafer by the lift pins PC1–PC3 (switching the electromagnetic valve 150 to the pressure-applying side), during the period of time when the non-exposed wafer is being lowered and transferred on the holder 10 by the lift pins PC1–PC3.

In this embodiment, however, the electromagnetic valve 140 is so arranged as to be switched to the blocked state, for the sake of security, immediately before switching of the electromagnetic valve 71a to the vacuum side. This is in order to avoid a great variation in vacuum pressure. If the tank chamber 72d is reduced to the vacuum original pressure to the full extent at that timing, the electromagnetic valve 140 is not particularly required to be blocked.

Although the non-exposed wafer can be vacuum adsorbed on the holder 10 by the actions as described hereinabove, it is then decided to determine if an abnormal leakage of the fluid is caused to occur by reading the signal Sp from the pressure sensor 71e by the CPU in the wafer carrier control unit during the period of time when the electromagnetic valve 71a is located on the vacuum side and the electromagnetic valve 81a is located in the open state. If it is decided that there is no problem with leakage, then the CPU first switches the electromagnetic valve 81a to the blocked state, thereby allowing the holder 10 to become in a self-sustaining adsorption state by the vacuum pressure within the tank chamber 72c.

Figure 11:
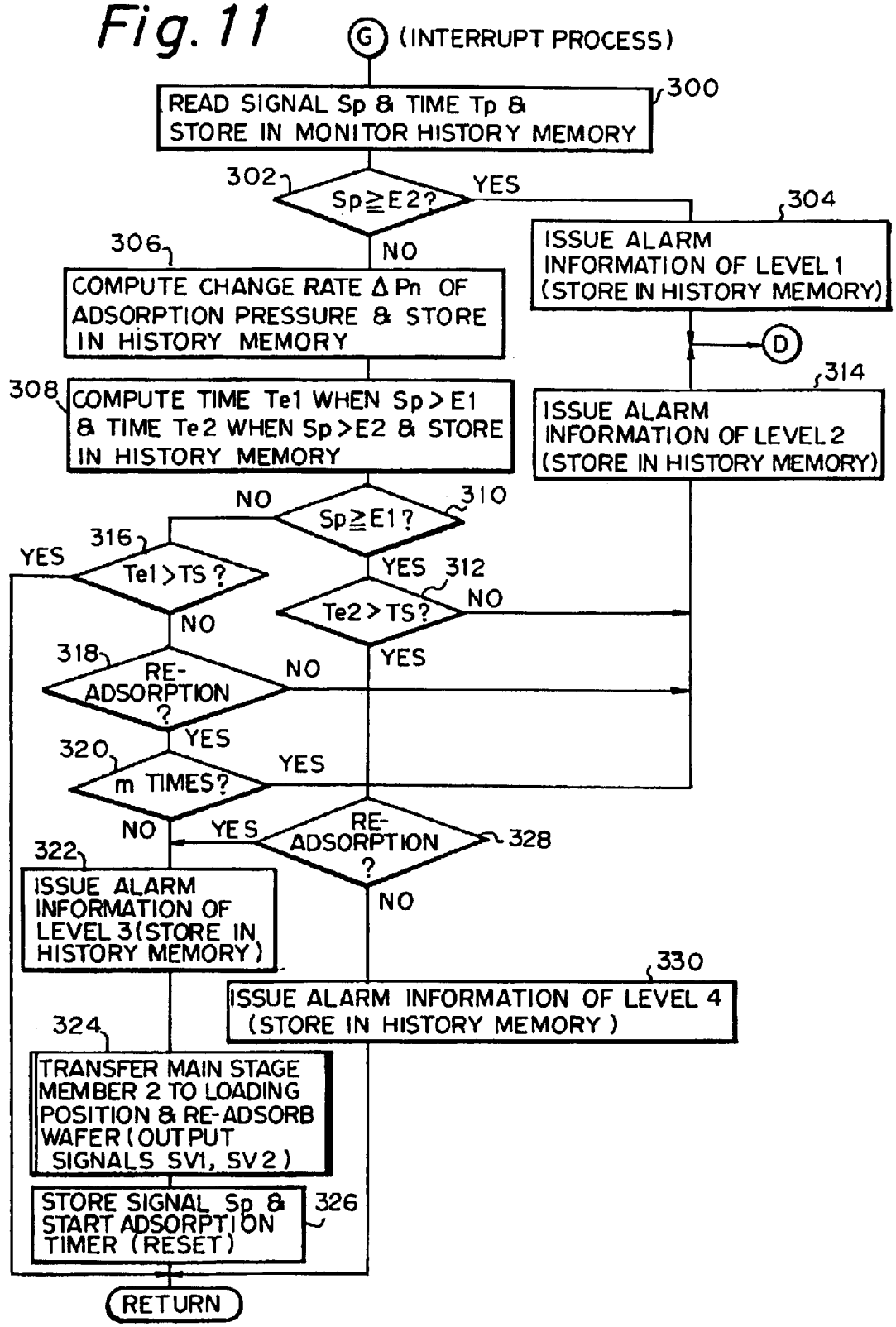
FIG. 11 is a flowchart for describing an adsorption monitor program for monitoring adsorption force to be started in a wafer adsorption system by the apparatus of FIG. 6.

At this point of time, step 226 in FIG. 7 and the monitor program G of FIG. 11 are executed and the CPU (the processor in the control board 51a in FIG. 6) monitors the change ratio ΔPn of the adsorption pressure accumulated in the monitor history memory at every sampling interval in a timer mode (as quick as every 2 mS). If it is found that no variation in the change ratio ΔPn during a predetermined time period (e.g. 50–100 mS), the CPU switches the electromagnetic valve 71a to the neutral state N as it decides that the non-exposed wafer is adsorbed on the holder 10 in a normal way. This process allow the non-exposed wafer to be adsorbed on the holder 10 in a self-sustaining manner by the action of the tank chamber 72c and thereafter the main stage member 2 to be movable in an optional direction from the loading position.

Further, the program G may be executed in such a manner that the intervals of reading the signal Sp can be automatically modified so as to become considerably shorter (e.g. 1 second or shorter) immediately after the self-sustaining adsorption of the wafer on the holder 10, followed by making the intervals thereof longer to several seconds or more if no great decrease in the adsorption force is recognized in several seconds or approximately one minute thereafter.

It is to be noted herein that, when a non-exposed wafer is subjected to superimposition exposure, the main stage member 2 is transferred below the optical projection system PL after the work for exchanging the wafers and the wafer is then subjected to execution of the alignment work for detecting each of the alignment marks at several locations by various optical alignment systems in the exposure apparatus. As one of the alignment work, the holder 10 is rotated at the angle θ so as to correct a rotational error by measuring an error in rotation of the coordinates of the shot sequence on the non-exposed wafer relative to the coordinates system of the movement of the main stage member 2 (the coordinates defined by the laser interferometers 6X and 6Y).

In this case, the holder 10 is required to be fixed to the main stage member 2 after rotation at the angle θ so that the vacuum adsorption is implemented by the pad portion 144 as shown in FIG. 21. In this embodiment, after the holder 10 is rotated at the angle θ, the electromagnetic valve 141 in FIG. 21 is switched from the neutral state N to the vacuum side (the state in which the tank chamber 72d is communicated with the pad portion 144). This allows the pad portion 144 to adsorb the holder 10 utilizing the tank chamber 72d in a self-sustaining way. Therefore, it is desired that the monitor program for monitoring a variation in the adsorption force by the pad portion 144 is started, as needed, separately from the monitor program G (FIG. 11) for the wafer adsorption or as the same program (although information for writing in the monitor history memory is individual from each other).

In each of the embodiments as described hereinabove, it should be understood that, although the above description has been made of an object that is directed to a stage apparatus for loading a photosensitive substrate plate such as a wafer or the like, the present invention can also be likewise applied to a stage apparatus for loading a substrate plate for an original pattern, such as a reticle or a mask, etc. in the exposure apparatus. In particular, the present invention is effective when it is applied to a scan-type reticle stage of a projection exposure apparatus as shown in FIG. 3 so adapted as to transcribe a circuit pattern formed on a reticle onto a photosensitive substrate plate in a step-and-scan system.

Now, a description will be made of the structure of a reticle stage apparatus according to an eighth embodiment of the present invention with reference to FIG. 24.

Figure 24:
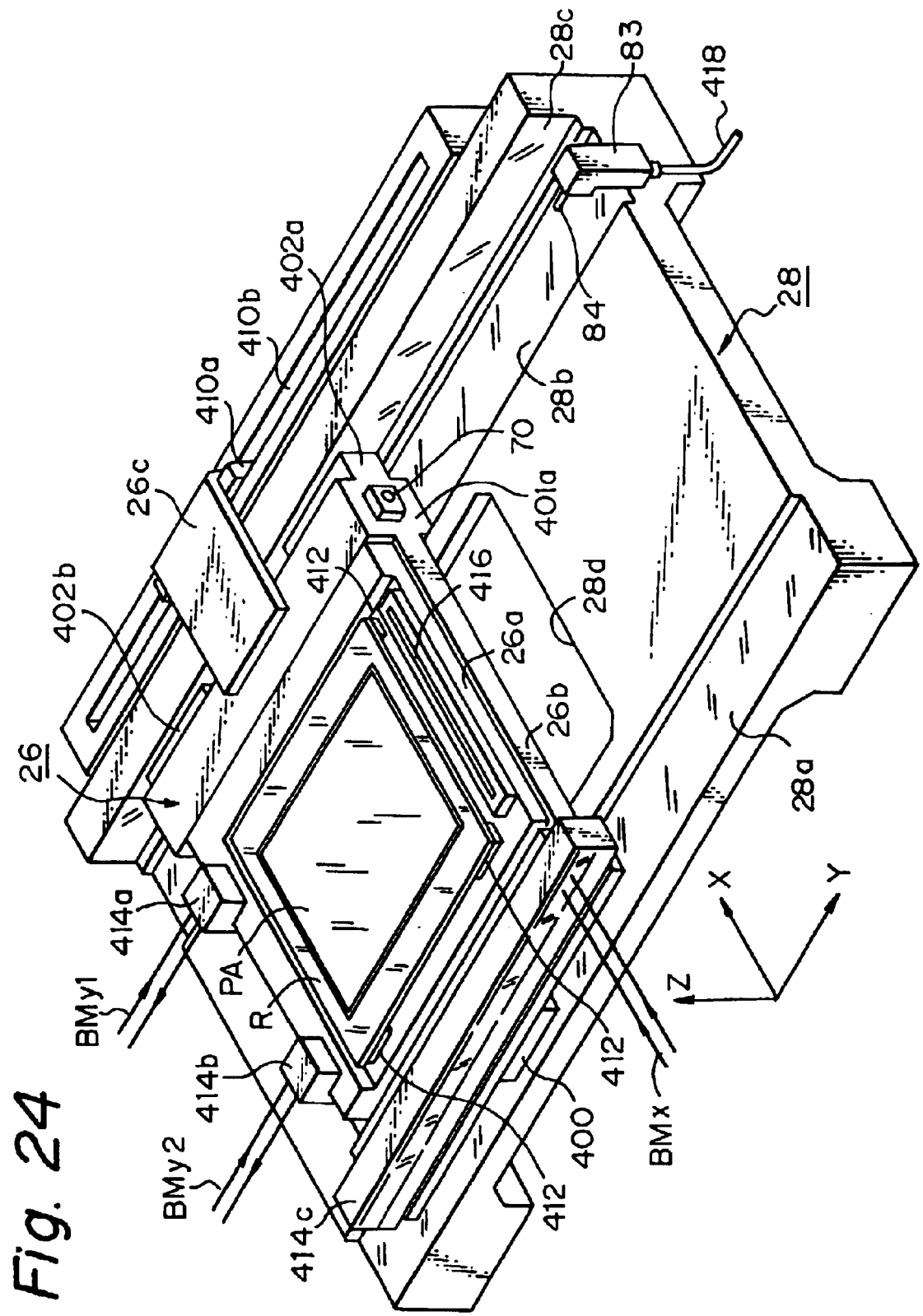
FIG. 24 is a perspective view showing the structure of a reticle stage apparatus in accordance with an eighth embodiment of the present invention.

FIG. 24 is a perspective view showing an example of the detailed structure of a reticle stage member 26 in the exposure apparatus in FIG. 3 and a base member 28 thereof. The base member 28 is integrally made of ceramics material. An upper surface of the base member 28 parallel to the XY-plane is provided with two guide planes 28a and 28b extending in the Y-direction. A one X-directional edge portion of the base member 28 is formed with a guide plane 28c extending in the Y-direction parallel to the YZ-plane. Further, at the central portion of the base member 28 is formed an aperture 28d so as to fail to block a projection light path of a circuit pattern area PA of the reticle R.

On the other hand, a main reticle stage member 26 comprises a scan stage part 26b and a reticle holder 26a, the scan stage part 26b being disposed so as to move in the Y-direction in a one-dimensional manner with the three guide planes 28a, 28b and 28c restrained by electrostatic fluid bearing pads 400, 401a, 402a and 402b and the reticle holder 26a being disposed so as to minutely move in the X- and Y-directions and in the direction θ (in the rotational direction) on the scan stage part 26b and to vacuum adsorb the reticle. Further, the reticle holder 26a is so arranged as to minutely move in the X- and Y-directions and in the direction θ by a fine linear motion actuator (e.g. a piezo expansion element, a voice coil motor) disposed at three or four locations, although not shown in the drawing, on the scan stage part 26b.

With the arrangement as described hereinabove, the main reticle stage member 26 is disposed so as to move in a one-dimensional manner in the Y-direction by a linear motor 410 comprised of a movable member 410a and a fixed member 410b, the movable member 410b being disposed at a tip portion of a connecting member 26c and the fixed member 410b being disposed at a side portion of the base member 28.

On the reticle holder 26a, there are disposed a plurality of adsorption pad parts 412 for vacuum adsorbing the rear surface of the reticle R at its plural locations, corner mirrors 414a and 414b for reflecting respective beams BMy1 and BMy2 from the laser interferometers for measuring the Y-directional position of the reticle R and the θ-rotation thereof, a prism-shaped movable mirror 414c for reflecting beams BMx from the laser interferometer for measuring the X-directional position of the reticle R, and an illuminance distribution measuring instrument 416 disposed so as to receive illumination light for exposure (e.g., forming a projection image area PI in FIG. 20) restricted in a slit or rectangular form in the position (the state of FIG. 24) of the main reticle stage member 26 immediately before the scanning exposure. Further, in FIG. 24, the main reticle stage member 26 is set in an approach start position so as for the illuminance distribution measuring instrument 416 to be located immediately under the illumination light for exposure extending in a slit form in the X-direction.

At the Y-directional edge portion of the scan stage part 26b is disposed the receipt edge orifice 70 so as to be communicated with a vacuum path leading to the adsorption pad parts 412 for the reticle R. Further, the base member 28 is provided with the feed edge orifice 84 that is connected to the receipt edge orifice 70 when the main reticle stage member 26 stops in the predetermined standby position, in this embodiment, in the position close to the right-hand edge in FIG. 24. The feed edge orifice 84 is mounted on the base member 28 through the fixing member 83 and connected to the fluid supply system via a tube 418. When the fluid supply system is structured in substantially the same manner as the system 81 as shown in FIG. 13, the tube 412 may be structured as corresponding to the tube 82 as shown in FIG. 13.

As shown in FIG. 24, the receipt edge orifice 70 and the feed edge orifice 84 are comprised preferably of a mechanical valve mechanism as described in connection with FIG. 17. However, it is not restricted to this manner and it may also be employed in combination with the electromagnetic valves as shown in FIGS. 6, 15, 21 and 22. In either case, in this embodiment, too, a sufficiently long adsorption continuation time may not be obtained by only the volume of the fluid in the air path (the closed space part) extending from the pad portion 142 for vacuum adsorbing the reticle R to the receipt edge orifice 70 so that there may be disposed a volume expansion member (i.e. an accumulation member for accumulating adsorption energy), such as a reserve tank, a tank chamber, etc. in the scan stage part 26b or in the reticle holder 26a.

The reticle stage apparatus as shown in FIG. 24 can be controlled so as to move the reticle R and the wafer W at an equal speed in the Y-direction at a predetermined speed ratio with respect to the projection vision field IF of the optical projection system PL, in synchronization with the wafer stage apparatus, e.g. as shown in FIGS. 1 and 20. With this arrangement, as one shot area SA on the wafer W is exposed while scanning, the main wafer stage member 2 is stepped in the X-direction so as to expose the adjacent shot area. Then, the main reticle stage member 26 and the main wafer stage member 2 are each scanned and transferred again in a reverse way in the Y-direction.

Therefore, when looking only at the reticle stage apparatus as shown in FIG. 24, the main reticle stage member 26 moves simply in a reciprocating way in each shot area along the guide planes 28a, 28b and 28c of the base member 28, during the time when one sheet of a wafer W is being exposed in a step-and-scan system.

Thus, in this embodiment, the receipt edge orifice 70 and the feed edge orifice 84 are set such that the receipt edge orifice 70 is released from the feed edge orifice 84 within the stroke of the reciprocating motion during the scanning exposure by the main reticle stage member 26 and the receipt edge orifice 70 is tightly joined with the feed edge orifice 84 when the main reticle stage member 26 exceeds the stroke and reaches the loading/unloading position (the most right end of the standby position as shown in FIG. 24) for exchanging reticles.

Further, in this embodiment, the vacuum pressure (or the pressure-applying fluid) is supplied to the absorption pads 412 through the feed edge orifice 84 and the receipt edge orifice 70 during the work for exchanging the reticles, and the self-sustaining adsorption of the reticle R is implemented by the volume expansion member (the tank chamber, etc.) disposed in the main reticle stage member 26 when the receipt edge orifice 70 is detached from the feed edge orifice 84. Moreover, in this embodiment, an adsorption monitoring program is executed in substantially the same manner as in the flowchart as shown in FIG. 11 in order to always monitor whether the self-sustaining adsorption system is functioning in a normal way and whether the adsorption force is sufficient enough to compete with the acceleration or deceleration of the main reticle stage member 26.

Furthermore, in this embodiment, electrical signal lines connecting various electrical drive systems or electrical detection systems loaded on the main reticle stage member 26 to the base member 28 can be omitted or the number of the lines can be reduced by incorporating a battery 100 or wireless transmitters (106, 108), etc. into the reticle stage apparatus like in FIG. 2. As an example, there may be used such a structure in which an optoelectrical signal in accordance with the light intensity of the exposing illumination light to be detected by an illuminance distribution measuring instrument (a photoelectric detector) 416 in FIG. 24 is converted into a digital value by an A/D converter and the digital value is sent to the control rack 50 (see FIG. 3) via the wireless transmitter.

Moreover, the adsorption of the reticle R may be implemented by electrostatic pressure like by the wafer holder 10 as shown in FIG. 1, not by vacuum pressure. In this case, a reticle-loading surface of a holder 26a of the main reticle stage member 26 may be provided with an electrode for electrostatic adsorption and a high voltage control circuit 112 to be supplied from the battery 100 built in the main reticle stage member 26, as shown in FIG. 2.

From the foregoing, there is no essential difference whether the main movable stage member utilizes the vacuum suction or electrostatic suction for the adsorption action, rather a substantial category in both cases. In other words, it can be equal in terms of function as an energy source for sustaining the adsorption force between the volume expansion member, such as the reserve tank, tank chamber, etc. in the case of vacuum adsorption and a rechargeable battery (condenser) in the case of electrostatic adsorption.

In addition, there is no substantial difference in structuring an actuator disposed in the main movable stage member with an aerodynamic system or with an electrical system. The function of the volume expansion member such as the reserve tank, tank chamber, etc. in combination with the valve mechanism in the case of the aerodynamic system may be said to be equivalent with the function of the built-in battery (condenser) as an electric drive source in the case of the electrical system in terms of the self-sustaining control such as self-sustaining energy supplement.

It can be noted herein that the above description of each of the embodiments of the present invention is made on the assumption that the transfer stage apparatus is applied to the exposure apparatus for producing semiconductor circuit devices such as memory device, microprocessors, etc. by exposing a circuit pattern onto a semiconductor wafer. It should be noted herein, however, that the present invention can likewise be applied to a scan exposure apparatus for use in forming a circuit pattern (e.g. pixel, transparent electrode, thin film transistor, etc.) on a large-size glass substrate plate for use with a flat display device, etc. in a liquid crystal system or plasma system, for example, as disclosed in Japanese Patent Unexamined Publication No. 7-326,567 (U.S. Pat. No. 5,523,574).

The scanning exposure apparatus as disclosed in this prior patent publication has a large-size glass substrate plate disposed vertically as an exposing substrate and a mask substrate plate (a reticle) with a pattern to be transcribed on the glass substrate plates drawn thereon disposed vertically. The glass substrate plate (the exposing substrate plate) and the mask substrate plate with an optical projection system interposed therebetween are held integrally in a one-dimensionally movable carriage. Thus, for the scanning exposure apparatus, the carriage with the exposing substrate plate and the mask substrate plate held integrally therein is disposed corresponding to the main movable stage member 2 (2a, 2b) as described in each of the above embodiments.

As described hereinabove, the movable stage apparatus according to the present invention can do entirely without a variety of electrical wires, etc. for supplying electricity or for communications to be connected to the main movable stage as well as any flexible tubes, etc. for vacuum pressure or for a pressure-applying fluid or can reduce the number of the wires, flexible tubes, etc. Further, it can prevent deterioration in transfer characteristics of the main movable stage and in stopping accuracy thereof by tension, vibration or the like of electrical wiring and tubes.

Further, the present invention can positively reduce the number of various tubes because a single valve mechanism or plural valve mechanisms is or are disposed on the side of the main movable stage member in order to switch the opening and closing of the vacuum pressure or the pressure-applying fluid to be supplied to the movable stage member.

Moreover, the present invention can achieve the effects of producing semiconductor devices on a large scale without a decrease in throughput in the lithography process because the charging of the battery is implemented or the pressure in a preliminary pressure-reducing chamber (a tank chamber, etc.) can be reduced by taking advantage of the period of time when the plural sheets of processing substrate plates or exposing substrate plates are exchanged one after another and loaded on the movable stage member.

Although the present invention has been described on the basis of the working examples, it is to be understood that the present invention is not in any respect restricted to those examples and that modifications and variations can be encompassed within the scope and spirit of the present invention without departing from the technology background as indicated in the claims appended hereto.

What is claimed is:

1. A stage apparatus having a movable stage structure body which holds a substrate plate and which is movable on a base structure body, comprising:
   a receipt edge orifice disposed at least at a portion of a fluid path which is disposed at said movable stage structure body; and
   a feed edge orifice being detachably engageable with said receipt edge orifice and detaching from or engaging with said receipt edge orifice at a predetermined position on the base structure body and providing or discharging a predetermined fluid to the receipt edge orifice during said engagement of said feed edge orifice with said receipt edge orifice.

2. The stage apparatus as claimed in claim 1, wherein said predetermined position where said feed edge orifice is detachably engageable with said receipt edge orifice is a position where an exchange of the substrate plate already processed for another substrate to be processed is conducted.

3. The stage apparatus as claimed in claim 1, wherein said movable stage structure body includes a volume expansion chamber communicating with said fluid path and having a predetermined volume therein in a sealed manner.

4. The stage apparatus as claimed in claim 1, wherein said movable stage structure body includes a valve mechanism for blocking communication between said fluid path and atmosphere during non-engagement of said receipt edge orifice with said feed edge orifice.

5. The stage apparatus as claimed in claim 4, further comprising a control unit for controlling said valve mechanism; and wherein said valve mechanism comprises an electromagnetic valve which is switched between an open and a close state based on a command from said control unit.

6. An exposure apparatus comprising a stage apparatus, said stage apparatus having a movable stage structure body being movably supported on a base structure body and holding a photosensitive substrate plate onto which patterns formed on a mask is transcribed, said stage apparatus including:

a receipt edge orifice disposed at least at a portion of a fluid path which is provided in said movable stage structure body; and a feed edge orifice being detachably engageable with said receipt edge orifice and detaching from or engaging with said receipt edge orifice at a predetermined position on the base structure body at each time of exposing the photosensitive substrate plate and providing or discharging a predetermined fluid to the receipt edge orifice during said engagement of said feed edge orifice with said receipt edge orifice.

7. The exposure apparatus as claimed in claim 6, said exposure apparatus being a scanning type exposure apparatus for exposing said photosensitive substrate plate in a scanning manner to transcribe said patterns on said photosensitive substrate plate while said mask and said photosensitive substrate plate move relative to each other.

8. A method for exposing a substrate plate to transcribe patterns formed on a mask onto said substrate plate by using an exposure light passing through said mask, comprising a step of:

engaging a receipt edge orifice with a feed edge orifice or detaching a receipt edge orifice from a feed edge orifice on a base structure body prior to an exposure operation, said receipt edge orifice being disposed at least at a portion of a fluid path which is provided in a movable stage structure body which is movable on said base structure body, and feed edge orifice being engageable with said receipt edge orifice so as to provide or discharge a predetermined fluid to the receipt edge orifice.

9. The method for exposing the substrate plate as claimed in claim 8, further comprising a step of causing a valve mechanism in a blocking manner, said valve mechanism blocking communication between said fluid path disposed at said movable stage structure body and atmosphere during nonengagement of said receipt edge orifice with said feed edge orifice.

* * * * *